(12) United States Patent
Yamazaki et al.

(10) Patent No.: US 7,485,896 B2
(45) Date of Patent: *Feb. 3, 2009

(54) LIGHT EMITTING DEVICE

(75) Inventors: Shunpei Yamazaki, Setagaya (JP); Jun Koyama, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/717,677

(22) Filed: Mar. 14, 2007

(65) Prior Publication Data

US 2007/0181890 A1    Aug. 9, 2007

Related U.S. Application Data

(62) Division of application No. 11/168,354, filed on Jun. 29, 2005, now Pat. No. 7,265,390, which is a division of application No. 10/195,146, filed on Jul. 15, 2002, now Pat. No. 6,952,023.

(30) Foreign Application Priority Data

Jul. 17, 2001   (JP)   ............................... 2001-216092

(51) Int. Cl.
   *H01L 27/15* (2006.01)
(52) U.S. Cl. .............................. 257/79; 257/88; 257/99
(58) Field of Classification Search .................. 257/79, 257/88, 98–100, 103
   See application file for complete search history.

(56) References Cited

U.S. PATENT DOCUMENTS

| 5,643,826 | A | 7/1997 | Ohtani et al. |
| 5,644,147 | A | 7/1997 | Yamazaki et al. |
| 5,807,772 | A | 9/1998 | Takemura |
| 5,818,070 | A | 10/1998 | Yamazaki et al. |

(Continued)

FOREIGN PATENT DOCUMENTS

EP   0 878 789   11/1998

(Continued)

*Primary Examiner*—Thien F Tran
(74) *Attorney, Agent, or Firm*—Eric J. Robinson; Robinson Intellectual Property Law Office, P.C.

(57) ABSTRACT

An object of the invention is to provide a technique for improving the characteristics of a TFT and realizing an optimum structure of the TFT for the driving conditions of a pixel section and a driving circuit by a small number of photo masks. Therefore, a light emitting device has a semiconductor film, a first electrode and a first insulating film nipped between the semiconductor film and the first electrode. Further, the light emitting device has a second electrode and a second insulating film nipped between the semiconductor film and the second electrode. The first and second electrodes are overlapped with each other through a channel forming area arranged in the semiconductor film. In the case of a TFT in which a reduction in off-electric current is considered important in comparison with an increase in on-electric current, a constant voltage (common voltage) is applied to the first electrode at any time. In the case of a TFT in which the increase in on-electric current is considered important in comparison with the reduction in off-electric current, the same voltage is applied to the first and second electrodes.

26 Claims, 32 Drawing Sheets

U.S. PATENT DOCUMENTS

| | | | |
|---|---|---|---|
| 5,834,797 | A | 11/1998 | Yamanaka |
| 5,917,221 | A | 6/1999 | Takemura |
| 5,923,962 | A | 7/1999 | Ohtani et al. |
| 5,923,963 | A | 7/1999 | Yamanaka |
| 6,100,860 | A | 8/2000 | Takayama et al. |
| 6,146,927 | A | 11/2000 | Yamanaka |
| 6,252,248 | B1 | 6/2001 | Sano et al. |
| 6,326,642 | B1 | 12/2001 | Yamazaki et al. |
| 6,327,006 | B1 | 12/2001 | Sato et al. |
| 6,340,830 | B1 | 1/2002 | Takemura |
| 6,365,933 | B1 | 4/2002 | Yamazaki et al. |
| 6,462,723 | B1 | 10/2002 | Yamazaki et al. |
| 6,465,268 | B2 | 10/2002 | Hirakata et al. |
| 6,528,824 | B2 | 3/2003 | Yamagata et al. |
| 6,603,453 | B2 | 8/2003 | Yamazaki et al. |
| 6,740,938 | B2 | 5/2004 | Tsunoda et al. |
| 6,743,650 | B2 | 6/2004 | Hirakata et al. |
| 6,777,716 | B1 | 8/2004 | Yamazaki et al. |
| 6,791,114 | B2 | 9/2004 | Shen |
| 6,791,129 | B2 | 9/2004 | Inukai |
| 6,833,560 | B2 | 12/2004 | Konuma et al. |
| 6,952,023 | B2 * | 10/2005 | Yamazaki et al. ............. 257/79 |
| 7,023,052 | B2 | 4/2006 | Yamazaki et al. |
| 7,138,658 | B2 | 11/2006 | Yamazaki et al. |
| 7,265,390 | B2 * | 9/2007 | Yamazaki et al. ............. 257/79 |
| 2007/0020888 | A1 | 1/2007 | Yamazaki et al. |

FOREIGN PATENT DOCUMENTS

| | | |
|---|---|---|
| JP | 63-208896 | 8/1988 |
| JP | 04-181779 | 6/1992 |
| JP | 04-219980 | 8/1992 |
| JP | 06-082834 | 3/1994 |
| JP | 07-130652 | 5/1995 |
| JP | 08-078329 | 3/1996 |
| JP | 09-148582 | 6/1997 |
| JP | 2666293 | 10/1997 |
| JP | 2737780 | 4/1998 |
| JP | 10-135468 | 5/1998 |
| JP | 10-135469 | 5/1998 |
| JP | 10-319907 | 12/1998 |
| JP | 10-339889 | 12/1998 |
| JP | 11-231805 | 8/1999 |
| JP | 11-354802 | 12/1999 |
| JP | 2000-221907 | 8/2000 |
| JP | 3141860 | 3/2001 |

* cited by examiner

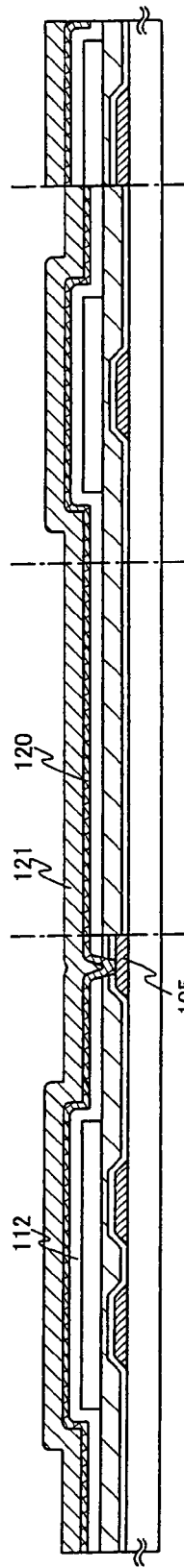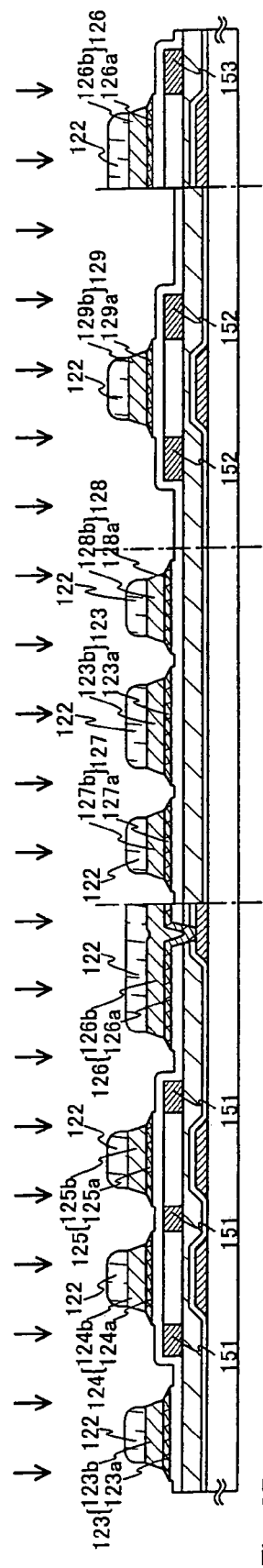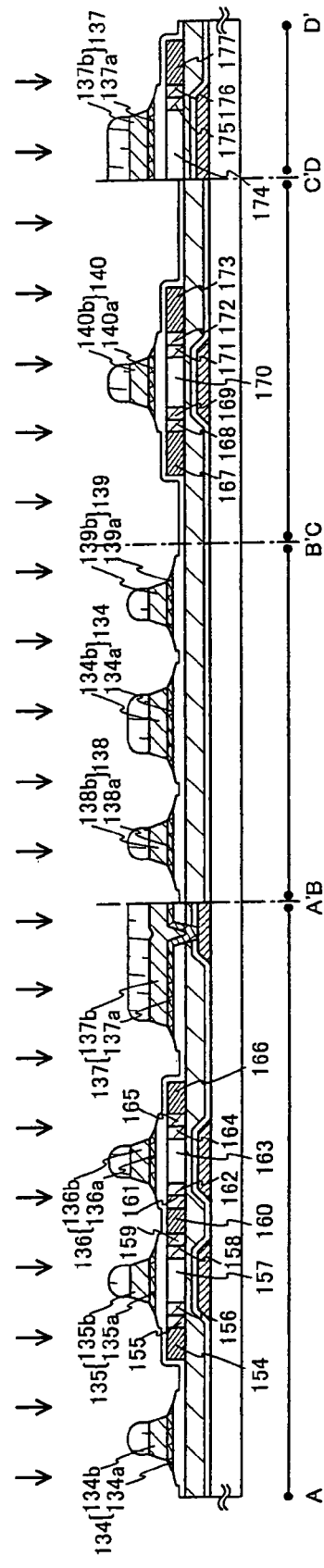
Fig. 3A
Fig. 3B
Fig. 3C

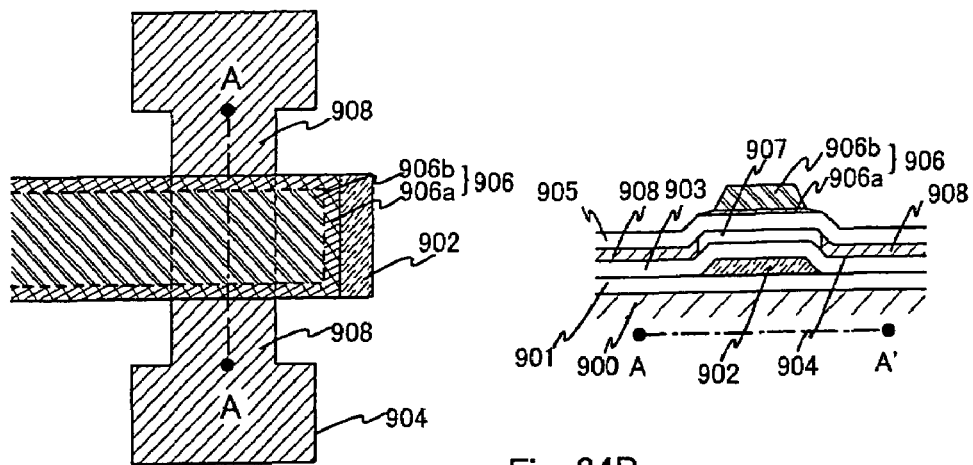
Fig. 34A
Fig. 34B
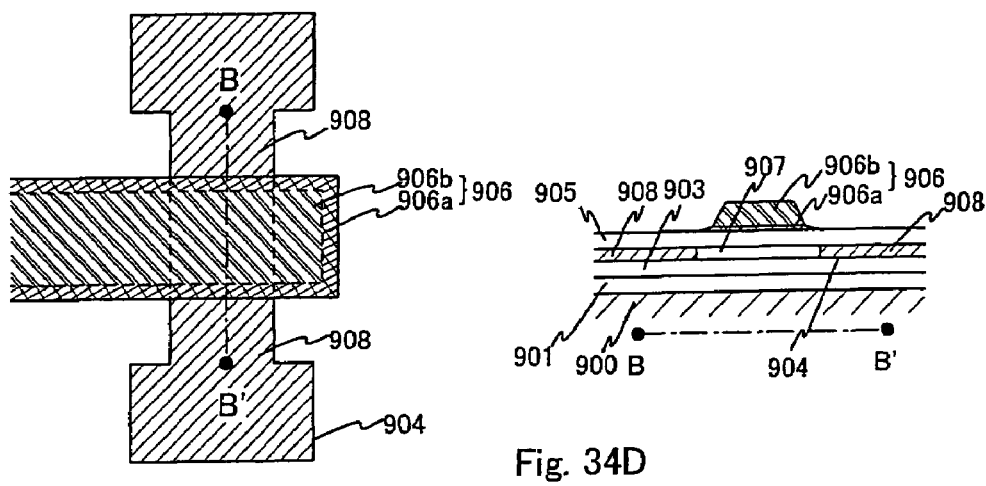
Fig. 34C
Fig. 34D

LIGHT EMITTING DEVICE

BACKGROUND OF THE INVENTION

1. Field of the Invention

Present invention relates to the manufacturing method of semiconductor device, in particular, present invention relates to a light emitting device comprising a light emitting element (OLED: Organic Light Emitting Device) formed on a plastic substrate. The invention also relates to an OLED module in which an IC's including a controller, or the like, is mounted on the OLED panel. Note that, in this specification, light emitting device is the generic term for the OLED panel and for the OLED module. Electronic equipment using the light emitting device is also included in the present invention.

2. Description of the Related Art

Recently, technology for forming TFTs (Thin Film Transistor) on a substrate has greatly progressed, and its application to an active matrix display device is actively developed. In particular, TFTs using a polysilicon film have higher field effect mobility (also referred to as mobility) than that of conventional TFTs using an amorphous silicon film, and thus, they are capable of high-speed operation, which makes it possible to control pixels with a driver circuit formed on the substrate having the pixels formed thereon, while, conventionally, such control of pixels is performed by a driver circuit provided outside the substrate.

Since various kinds of circuits and elements are formed on one substrate in such an active matrix type display device, there are various advantages such as reduction in the manufacturing cost, miniaturization of the display device, improvement in yield, and improvement in throughput.

In addition, an active matrix type light emitting device (hereinafter, simply referred to as light emitting device) having OLED as self-luminous elements are actively researched. The light emitting device is also referred to as organic EL displays (OELDs) or organic light emitting diodes (OLEDs).

OLEDs have high visibility because light is self emitted, and are optimal for making a display thin because a backlight like used for an liquid crystal display (LCD) is not required. Along with this, their angle of view has no limits. Therefore, light emitting devices using OLED have thus come under the spotlight as substitute display devices for CRTs and LCDs.

OLEDs have a layer containing an organic light emitting material in which electroluminescence is generated by adding an electric field (hereafter, referred to as an organic light emitting layer), an anode, and a cathode. The organic light emitting layer is formed between the anode and the cathode, and constituted by a single layer or a plurality of layers. There may be a case where these layers include an inorganic compound. There is emission of light in the electroluminescence of the organic light emitting layer in returning to a base state from a singlet excitation state (fluorescence), and in returning to a base state from a triplet excitation state (phosphorescence).

Note that all layers formed between the anode and the cathode are defined as organic light emitting layers in this specification. Specifically, layers such as a light emitting layer, a hole injecting layer, an electron injecting layer, a hole transporting layer, and an electron transporting layer are included as organic light emitting layers. An OLED basically has a structure in which an anode, a light emitting layer, and a cathode are laminated in the stated order. In addition to this structure, the OLED may also have a structure in which an anode, a hole injecting layer, a light emitting layer, and a cathode are laminated in the stated order, or a structure in which layers such as an anode, a hole injecting layer, a light emitting layer, an electron transporting layer, and a cathode are laminated in the stated order.

An active matrix driving system for displaying an image by arranging a TFT every pixel and sequentially writing a video signal is known as one mode of a light emitting device. The TFT is an indispensable element in realization of the active matrix driving system.

The TFT was almost manufactured by using amorphous silicon. However, the TFT using amorphous silicon is low in electric field effect mobility, and cannot be operated at a frequency required to process the video signal. Accordingly, the TFT was used only as a switching element arranged every pixel. A data line driving circuit for outputting the video signal to a data line, and a scanning line driving circuit for outputting a scanning signal to a scanning line were constructed by an IC (driver IC) externally attached and mounted by TAB (Tape Automated Bonding) and COG (Chip on Glass).

However, when pixel density is increased, pixel pitch is narrowed. Accordingly, it is considered that there is a limit in a system for mounting the driver IC. For example, when UXGA (a pixel number of 1200×1600) is supposed, 6000 connecting terminals are required even when the number of connecting terminals is simply estimated in an RGB color system. An increase in the connecting terminal number causes an increase in generating probability of a contact defect. Further, it becomes a factor in which the area (trim area) of a peripheral portion of a pixel section is increased and the compactness of a semiconductor device with this pixel section as a display and the design of an external appearance are damaged. The necessity of the display unit of a driving circuit integral type is clarified from such a background. The number of connecting terminals is greatly reduced and the trim area can be also reduced by integrally forming the pixel section and the scanning line driving circuit and data line driving circuit in the same substrate.

A method for forming the TFT by a polycrystal silicon film is proposed as a means for realizing this. However, even when the TFT was formed by using the polycrystal silicon, its electrical characteristics were finally not equivalent to the characteristics of a MOS transistor formed in a monocrystal silicon substrate. For example, the electric field effect mobility is equal to or smaller than $\frac{1}{10}$ in comparison with the monocrystal silicon. Further, a problem exists in that an off-electric current is raised by a defect formed in a crystal grain boundary.

In the light emitting device, at least a TFT functioning as a switching element and a TFT for supplying an electric current to an OLED are generally arranged in each pixel. A low off-electric current ($I_{off}$) is required in the TFT functioning as the switching element. In contrast to this, high driving ability (an on-electric current $I_{on}$), the prevention of deterioration due to a hot carrier effect and the improvement of reliability are required in the TFT for supplying the electric current to the OLED. Further, high driving ability (the on-electric current $I_{on}$), the prevention of deterioration due to the hot carrier effect and the improvement of reliability are also required in the TFT of the data line driving circuit.

A low concentration drain (LDD: Lightly Doped Drain) structure is known as a TFT structure for reducing the off-electric current value. In this structure, an LDD area adding impurity elements thereto at low concentration is arranged between a channel forming area and a source area or a drain area formed by adding impurity elements at high concentration. Further, an LDD structure (hereinafter, called GOLD by abbreviating Gate-drain Overlapped LDD) is known as an effective structure for preventing deterioration of the on-electric current value due to the hot carrier. In this LDD structure, one portion of the LDD area is overlapped with a gate electrode.

The TFT is manufactured by laminating a semiconductor film and an insulating film or an electrically conductive film while these films are etched in a predetermined shape by using a photo mask. However, when the structure of the TFT is optimized to obtain characteristics required in the pixel section and each driving circuit, the number of photo masks is increased so that a manufacturing process becomes complicated and a process number is necessarily increased.

SUMMARY OF THE INVENTION

An object of the invention is to provide a technique for improving the characteristics of the TFT and realizing the TFT of an optimum structure for driving conditions of the pixel section and the driving circuit by a small number of photo masks.

To solve the above mentioned problems, a thin film transistor of a light emitting device according to the present invention includes a semiconductor film, a first electrode, and a first insulating film put between the semiconductor film and the first electrode, and also includes a second electrode, and a second insulating film put between the semiconductor film and the second electrode. The first electrode and the second electrode are overlapped with each other, with a channel formation region of the semiconductor film put between them.

In addition, according to the present invention, in case of a TFT in which the decrease of OFF current is regarded more important than the increase of ON current, e.g., a TFT which is formed as a switching element, a constant voltage (common voltage) is applied to the first electrode. This constant voltage is set lower than threshold voltage in case of an n-channel TFT and set higher than threshold voltage in case of a p-channel TFT.

By applying the common voltage to the first electrode, it is possible to suppress threshold irregularity and to suppress OFF current compared with the TFT which includes only one electrode.

Further, according to the present invention, in case of a TFT in which the increase of ON current is regarded more important than the decrease of ON current, e.g., a TFT which is included in the buffer or the like of the driver circuit of the semiconductor device, the same voltage is applied to the first and second electrodes.

In the specification, the driver circuit means a circuit which generates signals for displaying images on a pixel section. A data line driver circuit and a scanning line driver circuit are, therefore, driver circuits.

By applying the same voltage to the first and second electrodes, the spread of a depleted layer is accelerated substantially as in the case of making the semiconductor film thin and it is, therefore, possible to lower the sub-threshold coefficient (S value) of the TFT and to improve the field effect mobility of the TFT. Accordingly, compared with a TFT which includes only one electrode, ON current can be increased. Further, compared with a TFT which includes only one electrode, threshold irregularity can be suppressed. It is thereby possible to decrease driving voltage by using the TFT having this structure in the driver circuit. In addition, since ON current can be increased, the TFT can be made small in size (the channel width thereof can be particularly made small). It is thereby possible to improve the integration density of the TFT.

The circuit diagram of the thin film transistor of the present invention will be described with reference to FIGS. 30A, 30B and 30C. In FIGS. 30A, 30B and 30C, only p-channel TFT is typically shown. An n-channel TFT is opposite in arrow direction to the p-channel TFT. FIG. 30A is a circuit diagram of an ordinary thin film transistor which includes only one electrode. FIG. 30B is a circuit diagram of a thin film transistor according to the present invention wherein two electrodes are provided with a semiconductor film put therebetween, and a constant voltage (ground voltage in this case) is applied to one of the two electrodes. FIG. 30C is a circuit diagram of a thin film transistor according to the present invention wherein two electrodes are provided with a semiconductor film put therebetween and the two electrodes are electrically connected to each other. In this specification, the present invention will be described with reference to the circuit diagrams shown in FIGS. 30A, 30B and 30C.

BRIEF DESCRIPTION OF THE DRAWINGS

FIGS. 3A to 3C are sectional views for explaining the manufacturing process of the light emitting device;

FIGS. 34A, 34C are top views and FIGS. 34B, 34D are sectional views of the TFT calculated with respect to the really measured values.

DESCRIPTION OF THE PREFERRED EMBODIMENTS

Embodiment Mode

Figure 1A:
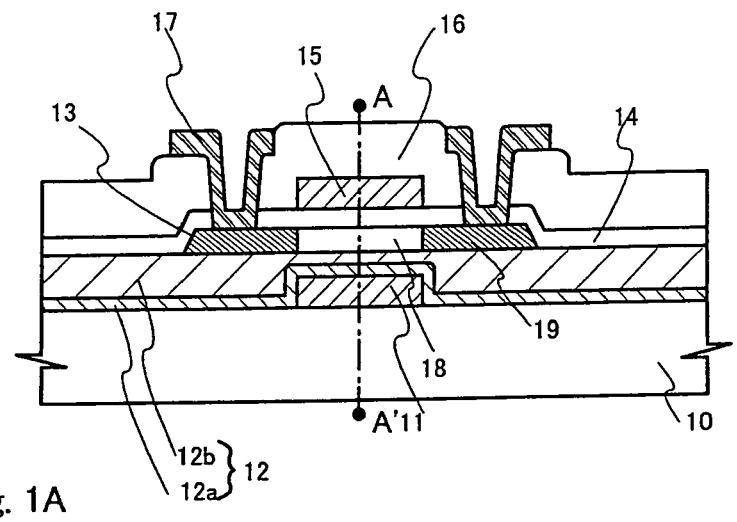
FIGS. 1A to 1C are sectional views for explaining the structure of a TFT of the present invention.

The embodiment mode of the present invention will be described with reference to FIGS. 1A to 1C. In FIG. 1A, a first electrode 11 is formed on a substrate 10 which has an insulating surface. The first electrode 11 may be formed out of a conductive material. The first electrode 11 can be typically formed out of alloy or a compound containing one or a plurality of types of elements selected from a group consisting of aluminum (Al), tungsten (W), molybdenum (Mo), tantalum (Ta) and titanium (Ti). Alternatively, the first electrode 11 may have a layered structure in which a plurality of conductive films is layered. The first electrode 11 has a thickness of 150 to 400 nm.

A first insulating film 12 is formed to cover the first electrode 11. In the embodiment mode of the present invention, a layered film consisting of two-layered insulating films (a first insulating film A 12a and a first insulating film B 12b) is used as the first insulating film 12. In FIGS. 1A, 1B and 1C, a silicon oxide nitride film or a silicon nitride film having a thickness of 10 to 50 nm is formed as the first insulating film A 12a. As the first insulating film B 12b, a silicon oxide nitride film or a silicon oxide film is formed to have a thickness of 0.5 to 1 µm. If the silicon oxide nitride film is used, a film which is manufactured using mixture gas of $SiH_4$, $NH_3$ and $N_2O$ by a plasma CVD method and which contains 20 to 40 atom % nitrogen is applied thereto. By using the nitrogen containing insulating film such as the silicon oxide nitride film stated above or a silicon nitride film, it is possible to prevent impurities such as alkali metal from being diffused from the substrate 10 side.

The surface of the first insulating film 12 has often irregularities resulting from the first electrode 11 formed prior to the first insulating film 12. The irregularities are flattened by polishing the surface of the first insulating film 12. As a planarization method, a chemical-mechanical polishing (to be referred to as "CMP" hereinafter) method may be mentioned. As an abrasive material (slurry) for the CMP applied to the first insulating film 12, a KOH-added aqueous solution into which foamed silica particles obtained by thermally decomposing silicon chloride gas are dispersed may be used. By the CMP, the first insulating film 12 is removed by a thickness of about 0.1 to 0.5 µm to flatten the surface thereof. The surface of the first insulating film 12 is not necessarily polished. The difference in level among the irregularities on the surface of the first insulating film 12 thus flattened is preferably not larger than 5 nm, more preferably not larger than 1 nm. As a result of the improved flatness of the first insulating film 12, it is possible to make the first insulating film to be formed in a later step as a gate insulating film thinner and to thereby improve the mobility of the TFT. In addition, by improving the flatness, it is possible to decrease OFF current in the manufacturing of the TFT.

A semiconductor film 13 is formed on the first insulating film 12 the surface of which is thus flattened. The semiconductor film 13 includes a channel formation region 18 and impurity regions 19 between which the channel formation region 18 is put. A second insulating film 14 is formed on the semiconductor film 13. Further, a second electrode 15 is formed on the semiconductor film 13 with the second insulating film 14 put between the second electrode 15 and the semiconductor region 13.

The first electrode 11 and the second electrode 15 are overlapped with each other with the channel formation region 18 put therebetween.

A third insulating film 16 and a wiring 17 are formed if necessary.

The first electrode 11 and the second electrode 15 may be electrically connected to each other or a common voltage may be applied to one of the first electrode 11 and second electrode 15.

Figure 1B:
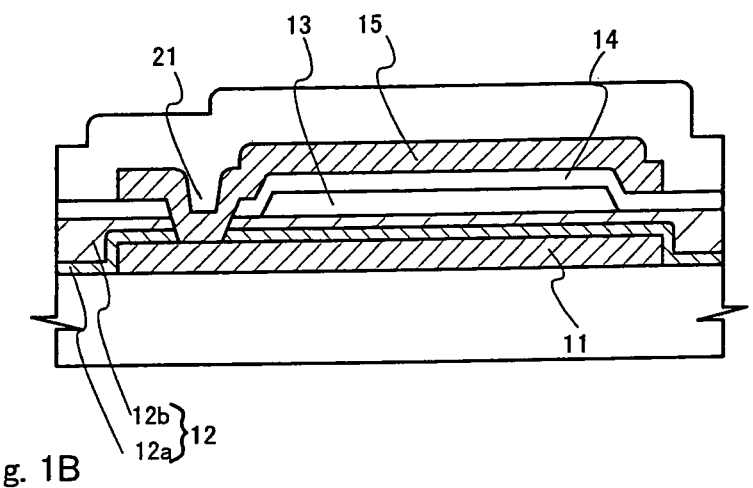

FIG. 1B shows a cross section taken along line A-A' of FIG. 1A in a case the first electrode 11 is directly connected to the second electrode 15.

As shown in FIG. 1B, the first electrode 11 is connected to the second electrode 15 outside of the semiconductor film 13 through a contact hole 21 which is formed in the first insulating film 12 and the second insulating film 14.

Figure 1C:
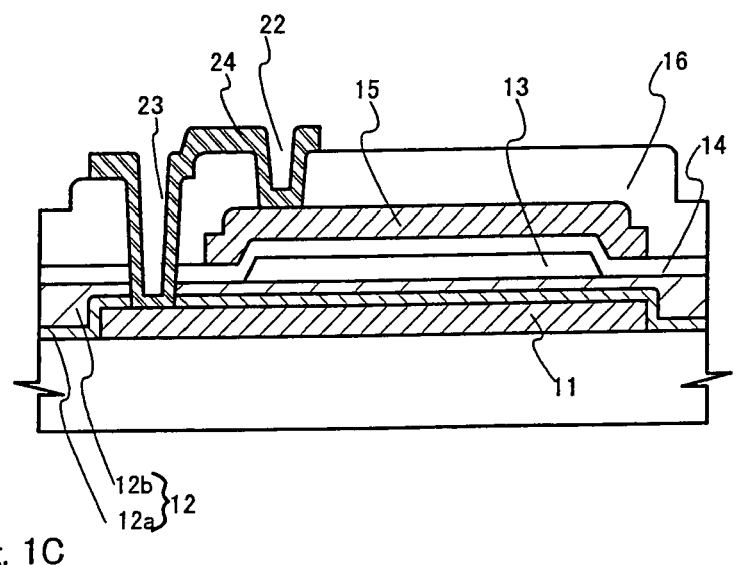

FIG. 1C shows a cross section taken along line A-A' of FIG. 1A in a case the first electrode 11 is connected to the second electrode 15 by a wiring 24 which is formed out of the same conductive film as that of the wiring 17. Note that, the connection means an electrical connection in this specification, if there is not specific limitation.

As shown in FIG. 1C, the first electrode 11 is connected to the wiring 24 through a contact hole 23 which is formed in the first insulating film 12, the second insulating film 14 and the third insulating film 16. In addition, the second electrode 15 is connected to the wiring 24 through a contact hole 22 which is formed in the third insulating film 16.

It is noted that the electrical connection between the first electrode 11 and the second electrode 15 is not limited to the configurations shown FIGS. 1B and 1C.

The thickness of the film removed by the CMP is determined in light of the thickness of the first insulating film 12, the dielectric constant of the first insulating film 12 and the thickness of the second insulating film 14. The remaining film substantially functions as a gate insulating film. Accordingly, if the first insulating film is formed by layering a plurality of insulating films, only the uppermost insulating film thereof on the first electrode 11 may be polished or the lower insulating film thereof may be polished and exposed.

For example, if the first insulating film A 12a and the first insulating film B 12b are formed out of silicon oxide nitride films, respectively, the first insulating film 12 has a dielectric constant of 7.5. If the second insulating film 14 is formed out of a silicon oxide film, the second insulating film 14 has a dielectric constant of 3.9. The first and second insulating films 12 and 14, therefore, differ in dielectric constant. In that case, as finished dimensions after the CMP, the thickness of the first insulating film 12 may be set at 150 nm and that of the second insulating film 14 may be set at 110 nm.

By applying a common voltage to the first electrode 11, it is possible to suppress threshold irregularity and to suppress OFF current compared with a TFT which includes only one electrode.

There are known a top-gate type (planar type) TFT, a bottom-gate type (inverted stagger type) TFT and the like which differ according to the arrangement of a semiconductor film, a gate insulating film and a gate electrode. In any type of TFT, it is necessary to make the thickness of the semiconductor film thin so as to lower a sub-threshold coefficient. If a semiconductor film formed by crystallizing an amorphous semiconductor film is used for the TFT, the crystallinity of the semiconductor film deteriorates as the amorphous semiconductor film is thinner, with the result an advantage of merely thinning the semiconductor film cannot be obtained. However, by electrically connecting the first electrode to the second electrode and, as shown in FIGS. 1A, 1B and 1C, overlapping the two electrodes with the semiconductor film on the upper and lower surfaces thereof, respectively, it is possible to accelerate the formation of a depleted region following the application of a voltage, to lower field effect mobility and the sub-threshold coefficient and to thereby increase ON current in substantially the same manner as that of thinning the semiconductor film.

If the first electrode 11 is electrically connected to the second electrode 15, it is possible to lower the field effect mobility and the sub-threshold coefficient and to increase ON current as the dielectric constant of the first insulating film 12 is closer to that of the second insulating film 14.

Further, it is possible to lower the field effect mobility and the sub-threshold coefficient and to increase ON current as the thickness of the first insulating film 12 when the thickness is uniform in the section in which the first electrode 11 is overlapped with the channel formation region 18 is closer to that of the second insulating film 14 when the thickness thereof is uniform in the section in which the second electrode 15 is overlapped with the channel formation region. If it is assumed that the thickness of the first insulating film 12 in the section in which the first insulating film 12 is overlapped with the first electrode 11 is d1, and that of the second insulating film 14 in the section in which the second insulating film 14 is overlapped with the second electrode 15 is d2, then the thicknesses d1 and d2 preferably satisfy $|d1-d2|/d1 \leq 0.1$ and $|d1-d2|/d2 \leq 0.1$. It is more preferable that the thicknesses d1 and 2d satisfy $|d1-d2|/d1 \leq 0.05$ and $|d1-d2|/d2 \leq 0.05$.

Most preferably, the threshold voltage of the TFT when a ground voltage is applied to the first electrode 11 is set almost equal to that of the TFT when the ground voltage is applied to the second electrode 15 while the first electrode 11 is not electrically connected to the second electrode 15, and then the first electrode 11 is electrically connected to the second electrode 15. By doing so, it is possible to lower the field effect mobility and the sub-threshold coefficient and to increase ON current.

By adopting the above-stated configuration, it is possible to form channels (dual channels) above and below the semiconductor film, respectively and to thereby improve the TFT characteristic.

Further, a wiring for transmitting various signals or power can be formed simultaneously with the first electrode 11. If the wiring formation is combined with a planarization processing by the CMP method, it does not at all influence the semiconductor film and the like to be formed on the wiring. Besides, a multilayer wiring can realize densified wirings. Concrete examples in which the present invention is applied to an active matrix type light emitting device will be shown in the following embodiments.

EMBODIMENTS

The embodiments of the present invention will be described hereafter.

Embodiment 1

In this embodiment, steps of manufacturing a semiconductor device according to the present invention will be described. In addition, a method of manufacturing TFT's for a pixel section will be described in detail here. Note that, this embodiment shows an example that a common voltage is applied to a first electrode on TFT used as a switching element (switching TFT) and the first electrode and a second electrode are connected to each other on TFT controlling current which flows to the light emitting element (driving TFT). Further, although the method of manufacturing TFT's for the pixel section is only described in this embodiment, TFT's for a driver circuit may also be manufactured simultaneously.

FIGS. 2 to 5 are cross-sectional views for explaining the semiconductor device manufacturing steps. FIGS. 6 to 8 are corresponding top views. For the convenience of explanation, common reference symbols are used therein.

Figure 2A:
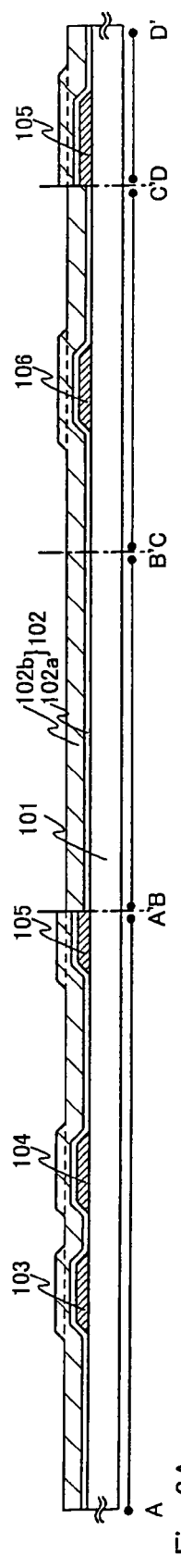
FIGS. 2A to 2D are sectional views for explaining the manufacturing process of a light emitting device.

In FIG. 2A, a substrate made of an arbitrary material can be used as a substrate 101 as long as the substrate has an insulating film and resists treatment temperature in later steps. Typically, a glass substrate, a quartz substrate, a ceramic substrate or the like can be used. Alternatively, a substrate such as a silicon substrate, a metal substrate or a stainless substrate having an insulating film formed on the surface thereof may be used. It is also possible to use a plastic substrate having heat resistance against the treatment temperature in this embodiment.

A first wiring 105 and first electrodes 103, 104 and 106 are formed on the insulating surface of the substrate 101. Each of the first wiring 105 and the first electrodes are formed out of a conductive material made of one or a plurality of types of elements selected from among Al, W, Mo, Ti and Ta. In this embodiment, tungsten (W) is used as the material of the first wiring 105. Alternatively, a conductive material having tungsten (W) layered on TaN may be used as each of the first wiring and the first electrodes.

After forming the first wiring 105 and the first electrodes 103, 104 and 106, a first insulating film 102 is formed. In this embodiment, the first insulating film 102 is formed by layering two insulating films (a first insulating film A 102a and a first insulating film B 102b). The first insulating film A 102a is formed out of a silicon oxide nitride film to have a thickness of 10 to 50 nm. The first insulating film B 102b is formed out of a silicon oxide film or a silicon oxide nitride film to have a thickness of 0.5 to 1 μm.

Figure 6A:
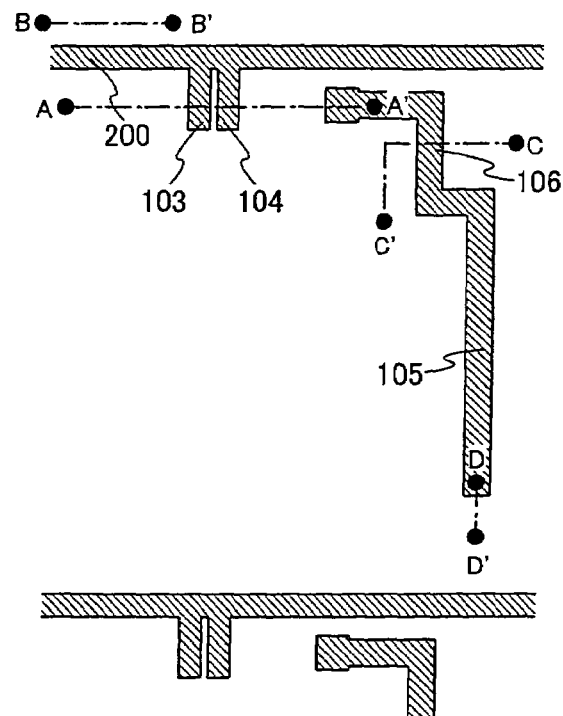
FIGS. 6A and 6B are top views for explaining the manufacturing process of the light emitting device.

FIG. 6A is a top view of a pixel section shown in FIG. 2A. A cross-sectional view taken along line A-A', B-B', C-C', and D-D' corresponds to the FIG. 6A. Note that, the first electrodes 103 and 104 form a part of a common wiring 200. Further the first electrode 106 forms a part of the first wiring 105.

The surface of the first insulating film 102 has often irregularities resulting from the first wiring and the first electrodes formed prior to the first insulating film 102. It is preferable to flatten these irregularities. As a planarization method, the CMP method is used. As an abrasive material (slurry) for the CMP applied to the first insulating film 102, a KOH-added aqueous solution into which foamed silica particles obtained by thermally decomposing silicon chloride gas are dispersed, for example, may be used. By the CMP, the first insulating film 102 is removed by a thickness of about 0.1 to 0.5 μm to thereby flatten the surface thereof.

Figure 2B:
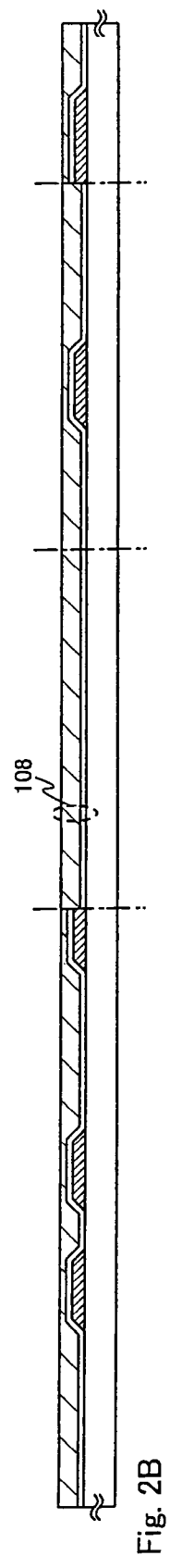

As a result, as shown in FIG. 2B, the flattened first insulating film 108 is formed. A semiconductor layer is formed on the first insulating film 108. The semiconductor layer is formed out of semiconductor of a crystal structure. The semiconductor layer can be obtained by crystallizing an amorphous semiconductor layer formed on the first insulating film 108. After being deposited, the amorphous semiconductor layer is crystallized by a heat treatment or laser irradiation. Although the material of the amorphous semiconductor layer is not limited to a specific one, the amorphous semiconductor layer is preferably formed out of silicon, silicon germanium ($Si_xGe_{1-x}$, where 0<x<1, typically x=0.001 to 0.05) alloy or the like.

Figure 2C:
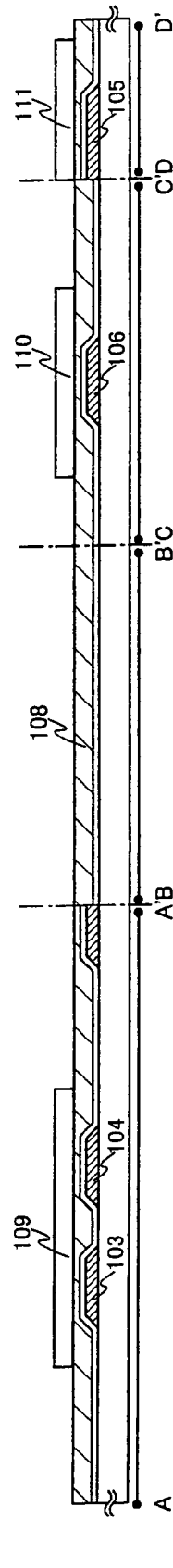

Thereafter, the semiconductor layer is etched to be divided into banded sections to thereby form semiconductor films 109 to 111 as shown in FIG. 2C.

Figure 6B:
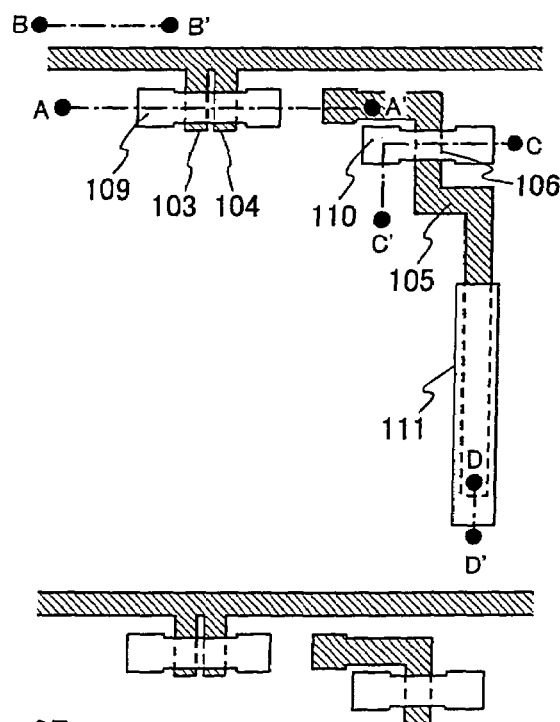

FIG. 6B is a top view of FIG. 2C. A cross-sectional view taken along line A-A', B-B', C-C', and D-D' in FIG. 2C corresponds to the FIG. 6B. The first electrodes 103 and 104 are overlapped with the semiconductor film 109 with the first insulating film 108 interposed therebetween. In addition, the first electrode 106 is overlapped with the semiconductor film 110 with the first insulating film 108 interposed therebetween. A semiconductor film 111 is provided to form a capacitance and overlapped with the first wiring 105 with the first insulating film 108 interposed therebetween.

Next, a second insulating film 112 which covers the semiconductor films 109 to 111 is formed. The second insulating film 112 is formed out of insulator containing silicon by a plasma CVD method or a sputtering method. The thickness of the second insulating film 112 is 40 to 150 nm.

Figure 2D:
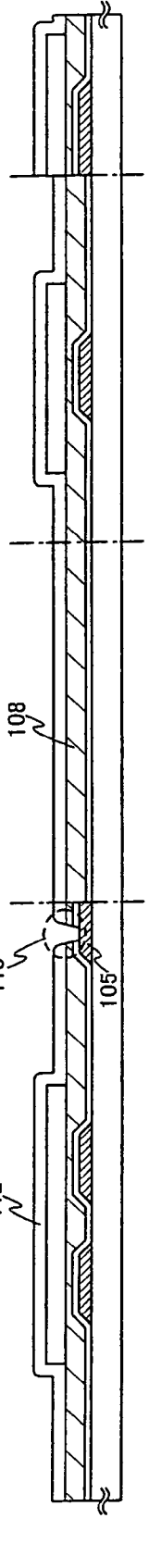

A contact hole 113 is formed on the first insulating film 108 and the second insulating film 112 so as to expose a part of the wiring 105 (FIG. 2D).

As shown in FIG. 3A, conductive films for forming a second gate electrode and a second wiring, are formed on the second insulating film 112. According to the present invention, the second gate electrode is formed by layering two or more conductive films. A first conductive film 120 provided on the second insulating film 112 is formed out of a nitride of high melting point metal such as molybdenum or tungsten. A second conductive film 121 provided on the first conductive film 120 is formed out of high melting point metal, low resistance metal such as copper or aluminum or polysilicon. More specifically, as the first conductive film, a metal nitride of one or a plurality of elements selected from among W, Mo, Ta and Ti is used. As the second conductive film, alloy of one or a plurality of elements selected from W, Mo, Ta, Ti, Al and Cu or n type polycrystalline silicon is used. For example, the first conductive film 120 may be formed out of TaN and the second conductive film 121 may be formed out of tungsten (W). If the second gate electrode or the second wiring is formed out of three layers of conductive films, the first layer may be an Mo film, the second layer may be an Al film and the third layer may be a TiN film. Alternatively, the first layer may be a W film, the second layer may be an Al film and the third layer may be a TiN film. By providing a multilayer wiring, the thickness of the wiring itself increases to make it possible to suppress wiring resistance.

A shown in FIG. 3B, the first etching treatment is conducted for the first conductive layer 120 and the second conductive layer 121 by using a mask 122. First shape type electrodes 123 to 129 each having tapered end sections (which electrodes consist of the first conductive films 123a to 129a and the second conductive films 123b to 129b, respectively) are formed by the first etching treatment. The surface of the second insulating film 112 is etched and thinned by a thickness of about 20 to 50 nm in the sections in which the second insulating film 112 is not covered with the first shape type electrodes 123 to 129.

The first doping treatment is carried out by an ion injection method or an ion doping method for injecting ions without causing mass separation. In the doping, using the first shape type electrodes 124 to 126 and 129 as masks, first concentration, one conductive type impurity regions 151 to 153 are formed in the semiconductor films 109 to 111, respectively. The first concentration is set at $1\times10^{20}$ to $1.5\times10^{21}/cm^3$.

Next, the second etching treatment is carried out as shown in FIG. 3C without removing a mask made of resist. In the second etching treatment, second shape type electrodes 134 to 140 (which consist of first conductive films 134a to 140a and second conductive films 134b to 140b, respectively) are formed by subjecting the second conductive film to anisotropic etching. The second shape type electrodes 134 to 140 are formed so that the widths thereof are reduced by the second etching treatment and the end sections thereof are located inward of the first concentration, one conductive type impurity regions 151 to 153 (second impurity regions). As shown in the next step, the length of an LDD is determined according to each reduced width. The second shape type electrodes 134 to 140 function as second electrodes, respectively.

Figure 7A:
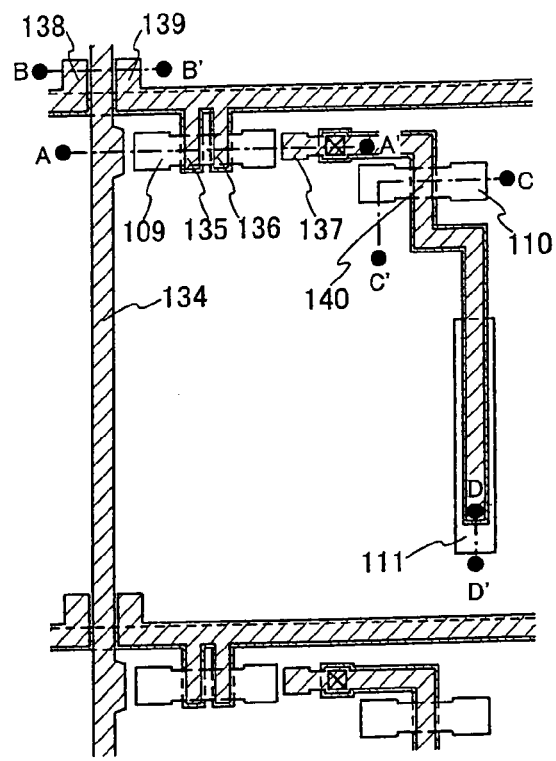
FIGS. 7A and 7B are top views for explaining the manufacturing process of the light emitting device.
Figure 8:
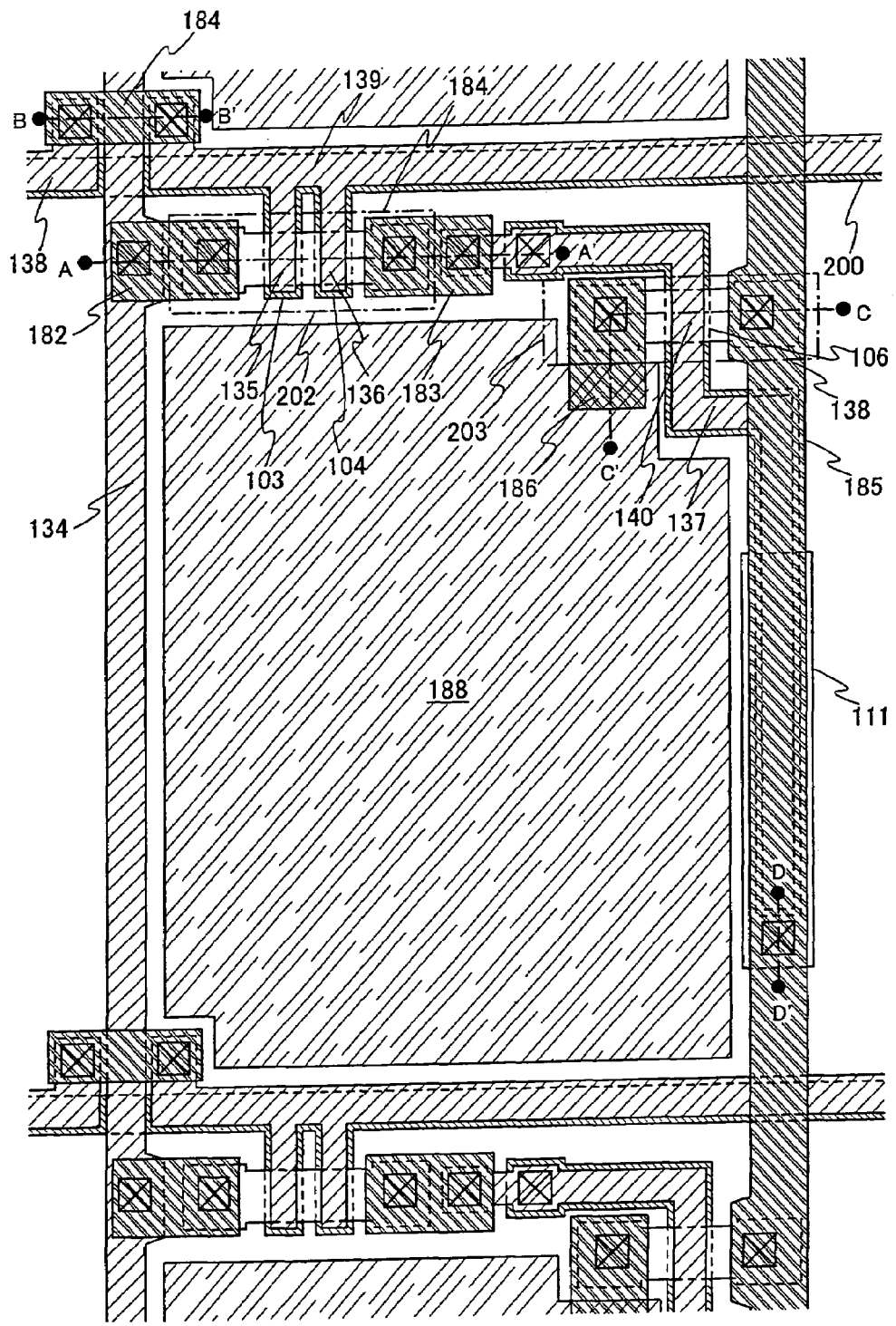
FIG. 8 is a top view of a pixel of the light emitting device.

FIG. 7A is a top view of FIG. 3C. A cross-sectional view taken along line A-A', B-B', C-C', and D-D' in FIG. 3C corresponds to the FIG. 7A. The second shape type electrodes 135 and 136 form a part of an electrode 138 and 139 functioning as a gate wiring. The second shape type electrodes 135 and 136 are overlapped with the first electrodes 103 and 104, respectively, with the first insulating film 108, the semiconductor layer 109 and the second insulating film 112 interposed therebetween. The second shape type electrode 140 is overlapped with the first electrode 106 with the first insulating film 108, the semiconductor layer 110 and the second insulating film 112 interposed therebetween.

In addition, the second shape type electrode 140 forms a part of the electrode 137 functioning as the second wirings. The second wirings 137 is overlapped with the first wiring 105 with the second insulating film 112, the semiconductor layer 111 and the first insulating film 108 interposed therebetween. The second wiring 137 is connected to the first wiring 105 through the contact hole 113. The electrode 134 functions as source wirings.

In this state, the second doping treatment is carried out to thereby inject one conductive type impurities into the semiconductor films 109 to 111 (FIG. 3C). Second concentration, one conductive type impurity regions (first impurity regions) 155, 156, 158, 159, 161, 162, 164, 165, 168, 169, 171, 172, 175, and 176 are formed by the second doping treatment. First impurity regions 156, 158, 162, 164, 169, 171, and 175 are formed to be overlapped with the first conductive films 135a to 137a and 140a which constitute the second shape type electrodes 135 to 137 and 140 in a self-aligning manner, respectively. Since the impurities doped by the ion doping method are passed through the first conductive films 135a to 137a and 140a and then added to the semiconductor films, the number of ions which reach the semiconductor films decreases and the ion concentration of each semiconductor film, quite naturally, becomes low. The concentration is $1\times10^{17}$ to $1\times10^{19}/cm^3$. Moreover, the first impurity regions 155, 159, 161, 165, 168, 172, and 176 are formed not to be overlapped with the first conductive films 135a to 137a and 140a which constitute the second shape type electrodes 135 to 137 and 140 in self-aligning manner, respectively.

Further, the second impurity regions 154, 160, 166, 167, 173, and 177 having higher impurity concentration than that of the channel forming regions 157, 163, 170, and 174 and the first concentration, one conductive type impurity regions 151 to 153 are formed by the second doping treatment.

Figure 4A:
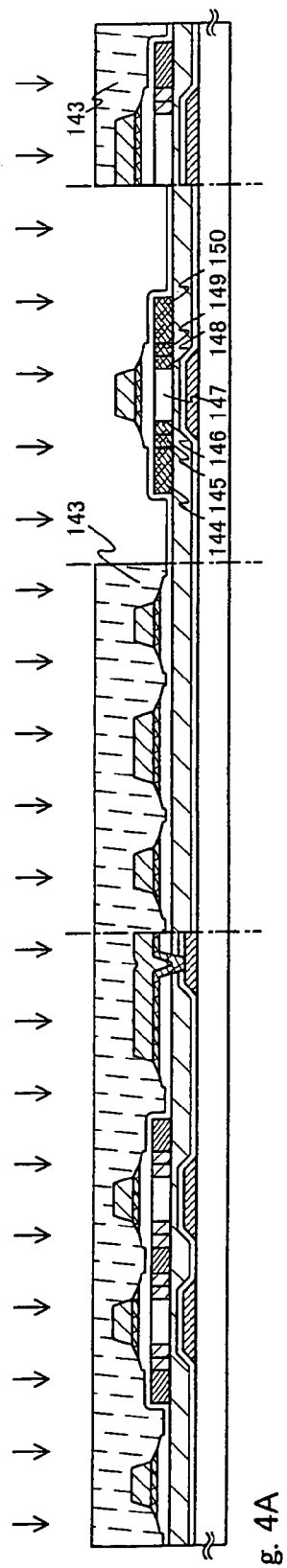
FIGS. 4A to 4C are sectional views for explaining the manufacturing process of the light emitting device.

Next, as shown in FIG. 4A, masks 143 made of resist are formed. Using the masks 143, the third doping treatment is carried out. In this third doping treatment, third impurity regions 144 to 150 of a conductive type opposite to one conductive type of a third concentration are formed in the semiconductor films 110, respectively. The third impurity regions are divided into the a regions 146 and 148 where overlapping with the second shape type electrode 140 and a regions 144 to 145, and 149 to 150 where not overlapping with the second shape type electrode 140. Then, the impurity element is added to the third impurity regions 144 to 150 in a concentration range of $1.5\times10^{20}$ to $1.5\times10^{21}/cm^3$.

As a result of the above steps, the impurity doped regions intended for valence electron control are formed in the respective semiconductor films. The first electrodes 103 to 104 and 106, and the second shape type electrodes 135, 136 and 140 function as gate electrodes at positions at which the electrodes cross the semiconductor films, respectively.

Thereafter, a step of activating the impurity elements doped into the respective semiconductor films is executed. In this activation treatment, gas heating type instantaneous heat annealing is employed. The heat treatment is carried out at a temperature of 400 to 700° C. in a nitrogen atmosphere, typically at a temperature of 450 to 500° C. In addition to the heat annealing, laser annealing using the second higher harmonic wave (532 nm) of a YAG laser is available. If the impurities are activated by the irradiation of a laser beam, the laser beam is applied to the semiconductor films using the second higher harmonic wave (532 nm) of the YAG laser. Needles to say, the RTA method which uses a lamp light source instead of laser light is also applicable. In the RTA method, the lamp light source is radiated from the both sides or one side of a substrate to thereby heat the semiconductor films.

Figure 4B:
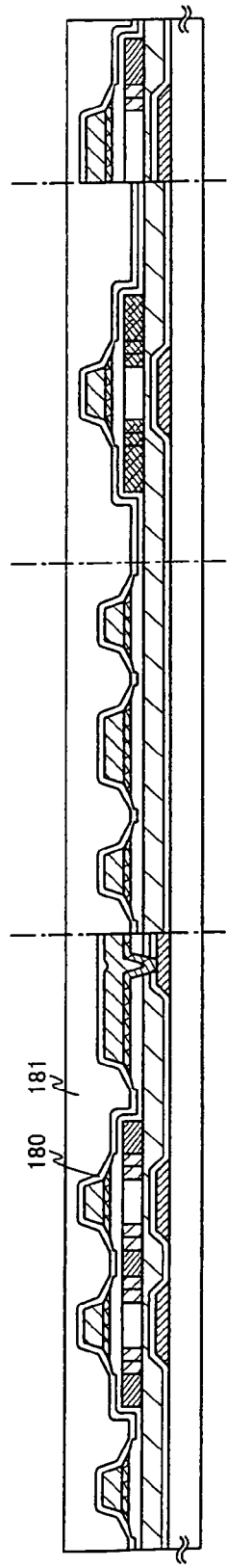

Thereafter, as shown in FIG. 4B, a passivation film 180 made of silicon nitride is formed to have a thickness of 50 to 100 nm by the plasma CVD method, a heat treatment is carried out at a temperature of 410° C. using a clean oven and the semiconductor films are hydrogenated with hydrogen emitted from the silicon nitride film.

Next, a third insulating film 181 made of an organic insulating material is formed on the passivation film 180. The reason for using the organic insulating material is to flatten the surface of the third insulating film 181. To obtain a more completely flattened surface, the surface of the third insulating film 181 is preferably subjected to a planarization treatment by the CMP method. If the CMP is used in combination with the planarization, a silicon oxide film formed by the plasma CVD method, an SOG (Spin on Glass) film or a PSG film formed by a coating method, or the like can be used as the third insulating film 181. The passivation film 180 may be regarded as a part of the third insulating film 181.

Figure 4C:
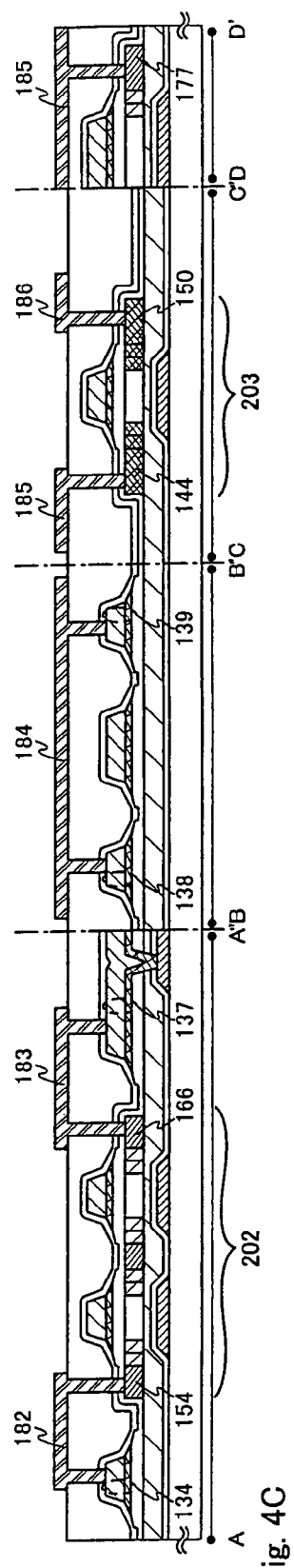

As shown in FIG. 4C, contact holes are formed on the second insulating film 112, a passivation film 180, and the third insulating film 181. And then, wirings 182 to 186 are formed. The wirings are formed to be laminated a titanium film and an aluminum film.

Figure 7B:
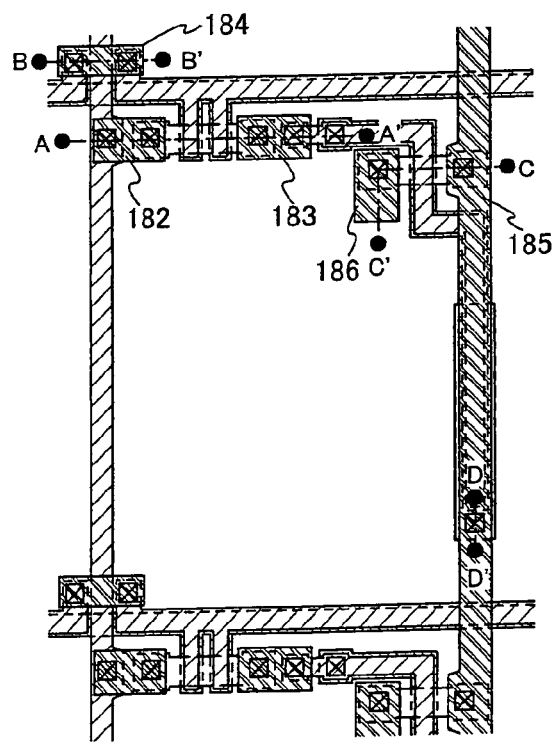

FIG. 7B show a top view of FIG. 4C. A sectional view taken along line A-A', B-B', C-C', and D-D' in FIG. 4C corresponds to FIG. 7B.

The wiring 182 is connected to the source wiring 134 and the second impurity region 154 respectively. The wiring 183 is connected to the second impurity region 166 and the first wiring 137 respectively. The wiring 184 is connected to the gate wirings 138 and 139 respectively. The wiring 185 functions as the power supply line and is connected to the third impurity region 144 and the second impurity region 177 respectively. The wiring 186 is connected to the third impurity region 150.

In the steps described so far, if the one conductive type impurity region is n-type region and the impurity region of the conductive type opposite to one conductive type is p-type region, an n-channel TFT 202 as a switching TFT and p-channel TFT 203 as a driver circuit are formed respectively. Note that, although the n-channel TFT is used for the switching TFT and p-channel TFT is used for the driver circuit in this embodiment, present invention is not limited to this configuration. The p-channel TFT and n-channel TFT may be used as the switching TFT and the driving TFT respectively. However, if an anode of OLED is used as the pixel electrode, it is preferable that the p-channel TFT is used to the driver circuit. If an cathode of OLED is used as the pixel electrode, the n-channel TFT is used to the driver circuit.

Figure 5:
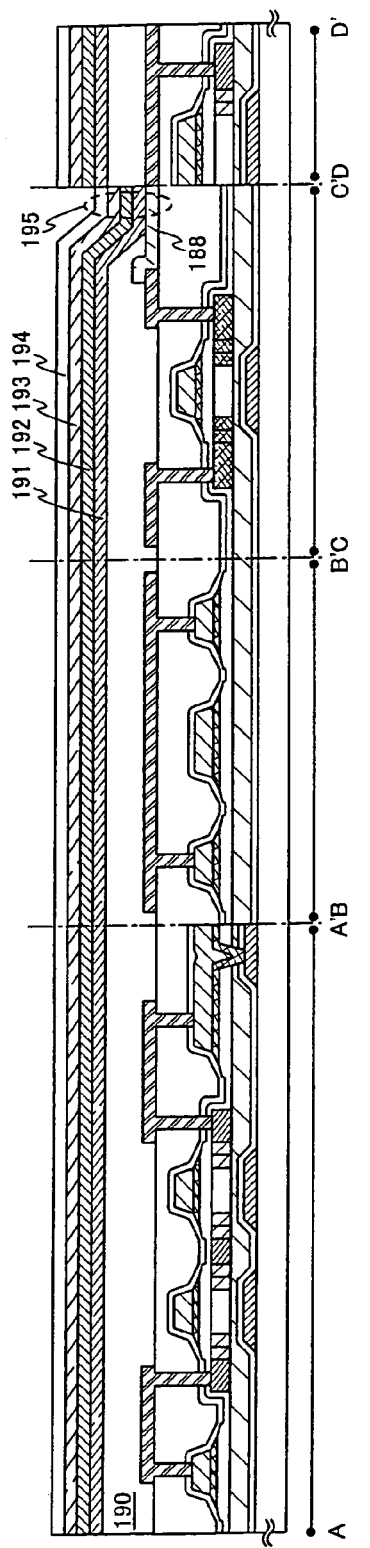
FIG. 5 is a sectional view for explaining the manufacturing process of the light emitting device.

As shown in FIG. 5, a transparent conductive film containing indium oxide or tin oxide as its main component is formed with a thickness of 60 to 120 nm on the surface of the flatten third insulating film 181. Then, the transparent conductive film is etched to form a pixel electrode (third electrode) 188 connecting to the wirings 186. FIG. 8 shows a top view of FIG. 5 immediately after the pixel electrode is formed. A sectional view taken along the lines A-A', B-B', C-C', and D-D' in FIG. 8 corresponds to the FIG. 5.

In the n-channel TFT 202, the first impurity regions 156, 158, 162, and 164 function as LDD respectively, and the second impurity regions 154 and 166 function as a source or drain region respectively. This n-channel TFT 202 is in a form wherein two TFTs are connected to each other in series so as to sandwich the second impurity region 160. The length, in the channel length direction, of the LDD is form 0.5 to 2.5 μm, preferably 1.5 μm. A main purpose of such a construction of the LDD is to prevent deterioration of the TFTs based on hot carrier effect. In the p-channel TFT 203, the third impurity regions 144 and 150 function as a source or drain region.

In this embodiment, by always applying a constant voltage (common voltage) to the common wiring 200, the common voltage is applied to the first electrodes 103 and 104. This constant voltage is set to be lower than a threshold voltage in case of the n-channel TFT and higher than the threshold voltage in case of the p-channel TFT. By applying the common voltage to the first electrode, the threshold irregularity of the TFT can be suppressed compared with the TFT which includes only one electrode. It is also possible to suppress OFF current. The decrease of OFF current rather than the increase of ON current influences the TFT which is formed as a switching element in the pixel section of the semiconductor device. The above-stated configuration is, therefore, advantageous to this TFT.

Further, in this embodiment, by forming a pair of electrodes 106 and 140 electrically connected to each other through the semiconductor film on the driving TFT, the thickness of the semiconductor film is substantially halved, the formation of a depleted region is accelerated following the application of a gate voltage, making it possible to improve the field effect mobility and to lower the sub-threshold coefficient. As a result, by using the TFT of such a structure in the driving TFT, it is possible to decrease driving voltage. In addition, current driving capability is improved and the TFT can be thereby made smaller in size (channel width thereof can be particularly made smaller). It is thus possible to improve the integration density of the semiconductor device.

A capacitance is formed in the section in which the first wirings 105 and the first insulating film 108, and the semiconductor layer 111 are overlapped with one another. A capacitance is also formed in the section in which the second wirings 137, the second insulating film 112, and the semiconductor layer 111 are overlapped with one another.

Further, as shown in FIG. 5, a partition layer 190 which covers the n-channel TFT 202 and the p-channel TFT 203, is formed on the third insulating film 181. Since an organic compound layer or a cathode cannot be subjected to a wet treatment (such as etching with chemicals or washing), the partition layer 190 formed out of a photosensitive resin material is provided on a third insulating film adjusting to the position of the pixel electrode 188. The partition layer 190 is formed out of an organic resin material such as polyimide, polyamide, polyimide amide or acryl. This partition layer 190 is formed to cover the end sections of the pixel electrode. In addition, each of the end sections of the partition layer 190 is formed to have a taper angle of 45 to 60 degrees.

An active matrix driven type light emitting device shown herein is constituted by arranging light emitting elements in a matrix. The light emitting element 195 consists of an anode, a cathode and an organic compound layer formed between the anode and the cathode. If the pixel electrode 188 is formed out of a transparent conductive film, the pixel electrode 188 serves as the anode. The organic compound layer 192 is formed out of a combination of a hole transport material having relatively high hole mobility, an electron transport material opposite to the hole transport material, a light emitting material and the like. These materials may be formed into respective layers or mixed with one another.

The organic compound material is formed as thin film layers having a total thickness of about 100 nm. To this end, the surface of the ITO conductive thin film formed as the anode should have improved flatness. If flatness is low, the anode or the ITO film is short-circuited with the cathode formed on the organic compound layer at the worst. As another method for preventing short-circuit, a method of forming an insulating film having a thickness of 1 to 5 nm may be adopted. As the insulating film, a film made of polyimide, polyimide amide, polyamide, acryl or the like can be used. If an opposed electrode (fourth electrode) 193 is formed out of alkali metal such as MgAg or LiF or alkaline-earth metal, the opposed electrode 193 can function as the cathode.

The opposed electrode 193 is formed out of a material containing magnesium (Mg), lithium (Li) or calcium (Ca) having a low work function. Preferably, the opposed electrode 193 containing MgAg (a material of mixture of Ag and Mg with a mixture ratio of Mg:Ag=10:1) is used. In addition to the MgAg electrode, an MgAgAl electrode, an LiAl electrode or an LiFAl electrode is available. An insulating film 194 made of silicon nitride or a DLC film is formed on the opposed electrode 193 to have a thickness of 2 to 30 nm, preferably 5 to 10 nm. The DLC film can be formed by the plasma CVD method. Even at a temperature of not higher than 100° C., the DLC film can be formed to cover the end sections of the partition layer 190 with good covering property. The internal stress of the DLC film can be lessened by mixing argon in small quantities into the DLC film. The DLC film can be, therefore, used as a protection film. In addition, the DLC film has high gas barrier property against CO, $CO_2$, $H_2O$ and the like as well as oxygen, so that the DLC film is suited as the insulating film 194 which functions as a barrier film.

Note that, a source wiring and a drain wiring are formed at the simultaneously, and then a wiring to supply the drain current for the driving TFT to the pixel electrode and power-supply wiring are formed simultaneously. A thickness of the wiring becomes thicker, the step difference cased by the wirings is increased. When, the step difference is increased, the possibility, to which the wirings fabricated in the later step are disconnected and the element characteristic is deteriorated, is improved. Therefore, the thickness of wiring should be thinner than the thickness of wiring fabricated in the previous steps. Because the power-supply wiring functions to supply the current in the light emitting elements, it is preferable to thicken the film thickness and to lower resistance. The power-supply wiring is fabricated after the source wiring and drain wiring are formed in the light emitting device of this embodiment. Therefore, the film thickness of the power-supply wiring can be made thicker, and resistance can be lowered.

The source wiring and the gate wiring are simultaneously formed under the third insulating film, and the pixel electrode is formed on the third insulating film in this specification. Therefore, it is possible that the source wiring and the pixel electrode are overlapped each other without connecting the source wiring and the pixel electrode directly even if the insulating film in not newly formed.

Although an example that the common voltage is applied to a switching TFT 202 and the first electrode and the second electrode of driving TFT 203 are connected each other is shown in this embodiment, present invention in not limited to this configuration. The first electrode and the second electrode of switching TFT 202 may be connected each other, and the common voltage may also be applied to the first electrode of the driving TFT 203.

Moreover, although, the switching TFT has the double gate structure (structure which contains an active layer including two channel forming regions connected with the series) in the light emitting device of this embodiment, present invention is not limited to this configuration. The switching TFT may take a single structure or a multi gate structure such as a triple gate structure (structure which contains an active layer including the two channel forming regions or more connected with the series). Moreover, instead of single gate structure, the driving TFT may take the multi gate structure such as the double gate structure and triple gate structure (structure which contains an active layer including the two channel forming regions or more connected with the series).

After air tightness is improved by a processing such as packaging, connectors (flexible print circuits: FPC's) are attached to connect terminals pulled out from the elements of circuits formed on the substrate to external signal terminals, whereby the semiconductor device is completed as a product.

Embodiment 2

In this embodiment, the construction of a pixel of the light emitting device of the present invention different from that in the embodiment 1 will be explained.

Figure 9:
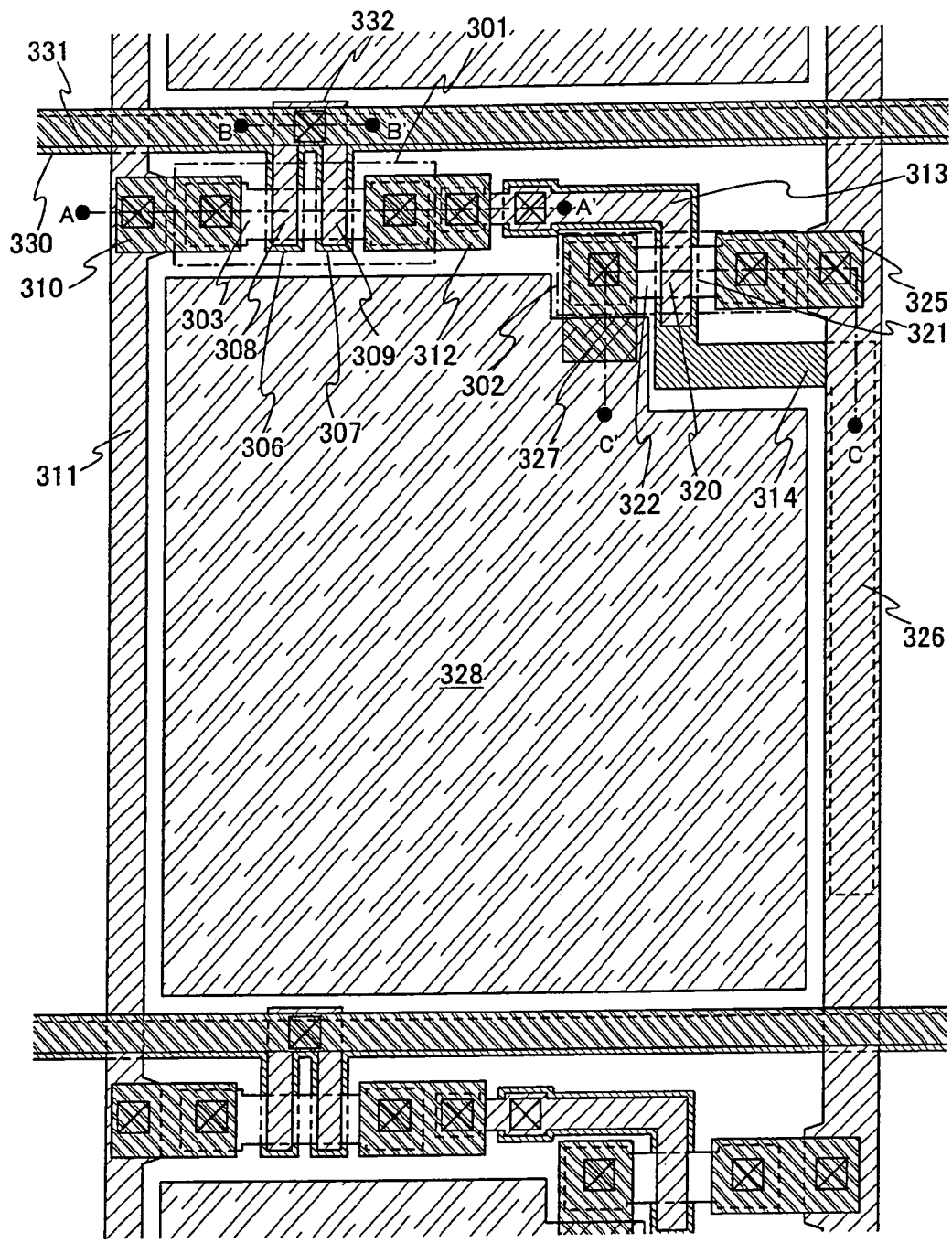
FIG. 9 is a top view of the pixel of the light emitting device.
Figure 10:
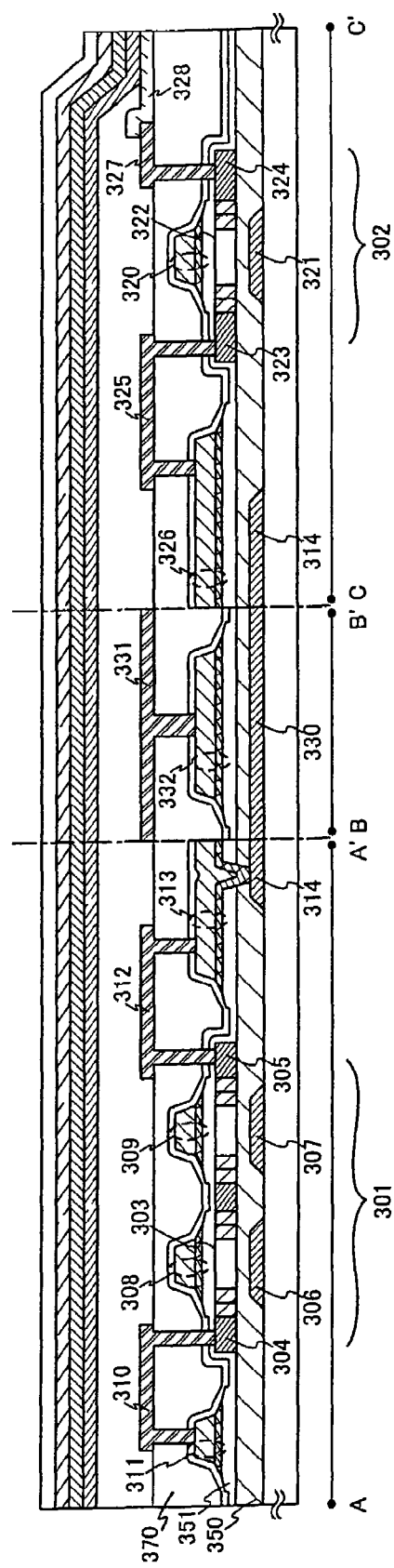
FIG. 10 is a sectional view of the pixel of the light emitting device.

FIG. 9 shows a top view of the pixel of the light emitting device of this embodiment. FIG. 10 shows a sectional view in A-A', B-B' and C-C' of FIG. 9. A partition wall layer, an organic light emitting layer, a cathode and a protecting film manufactured in the process subsequent to the formation of a pixel electrode are omitted to clarify the construction of the pixel in FIG. 9.

Reference numeral 301 designates a TFT for switching, and an n-channel TFT is used in this embodiment. Reference numeral 302 designates a TFT for driving, and a p-channel TFT is used in this embodiment. The TFT for switching and the TFT for driving may be set to the n-channel TFT and the p-channel TFT.

The TFT 301 for switching has first electrodes 306, 307, a first insulating film 350 abutting on the first electrodes 306, 307, a semiconductor film 303 abutting on the first insulating film 350, a second insulating film 351 abutting on the semiconductor film 303, and second electrodes 308, 309 abutting on the second insulating film 351.

One of source and drain areas 304, 305 arranged in the semiconductor film 303 is connected to a source wiring 311 through a wiring 310, and the other is connected to a second wiring 313 through a wiring 312. The second wiring 313 is connected to a first wiring 314 through a contact hole.

The first electrodes 306, 307 are overlapped with the second electrodes 308, 309 through the first insulating film 350, the semiconductor film 303 and the second insulating film 351.

The TFT 302 for driving has a first electrode 321, a first insulating film 350 abutting on the first electrode 321, a semiconductor film 322 abutting on the first insulating film 350, a second insulating film 351 abutting on the semiconductor film 322, and a second electrode 320 abutting on the second insulating film 351.

The first electrode 321 is one portion of the first wiring 314, and the second electrode 320 is one portion of the second wiring 313.

One of source and drain areas 323, 324 arranged in the semiconductor film 322 is connected to a power line 326 through a wiring 325, and the other is connected to a pixel electrode 328 through a wiring 327.

The first electrode 321 is overlapped with the second electrode 320 through the first insulating film 350, the semiconductor film 322 and the second insulating film 351.

A storage capacitor is formed in a portion in which the power line 326 and the first wiring 314 are overlapped with each other through the first insulating film 350 and the second insulating film 351.

Reference numeral 330 designates a common wiring, and a constant voltage (a ground voltage in this embodiment) is applied to the common wiring 330. A wiring 332 partially has the second electrodes 308, 309, and is connected to a gate wiring 331 through a contact hole formed in the first insulating film 350 and the second insulating film 351.

In this embodiment, a common voltage is applied to the first electrode in the TFT 301 for switching even in the TFTs within the same pixel. The dispersion of a threshold value and an off-electric current can be restrained by applying the common voltage to the first electrode in comparison with the case of one electrode.

Further, the TFT 302 for driving through which an electric current larger than that of the TFT for switching flows, electrically connects the first and second electrodes. A depletion layer is rapidly spread by applying the same voltage to the first and second electrodes as in a case in which the thickness of the semiconductor film is substantially thinned. Accordingly, a sub-threshold coefficient can be reduced and electric field effect mobility can be improved. Accordingly, the on-electric current can be increased in comparison with the case of one electrode. Further, the dispersion of the threshold value can be restrained in comparison with the case of one electrode. Accordingly, a driving voltage can be reduced by using the TFT of this structure in a driving circuit. Further, since the on-electric current can be increased, the size (particularly channel width) of the TFT can be reduced. Therefore, integration density can be improved.

The present invention is not limited to this construction. The first and second electrodes may be connected in the TFT for switching, and the common voltage may be also applied to the first electrode in the TFT for driving.

In the light emitting device of this embodiment, the TFT for switching has a double gate structure (a structure including an active layer having two channel forming areas connected in series). However, this embodiment is not limited to this construction. The TFT for switching may have a single gate structure, and may also have a multigate structure (a structure including an active layer having two or more channel forming areas connected in series) such as a triple gate structure, etc. Further, the TFT for driving may have a multigate structure (a structure including an active layer having two or more channel forming areas connected in series) such as a double gate structure, a triple gate structure, etc. instead of the single gate structure.

In this embodiment, the source wiring and the power line are simultaneously formed, and the gate wiring and a wiring for supplying the drain electric current of the TFT for driving to the pixel electrode are then simultaneously formed. Since the source wiring and the power line are formed below a third insulating film 370 and the pixel electrode is formed on the third insulating film, the source wiring, the power line and the pixel electrode can be overlapped without direct connection even when no insulating film is newly arranged. Accordingly, the light emitting area of a light emitting element can be further widened.

Embodiment 3

In this embodiment, the construction of a pixel of the light emitting device of the present invention different from that in the embodiments 1, 2 will be explained.

Figure 11:
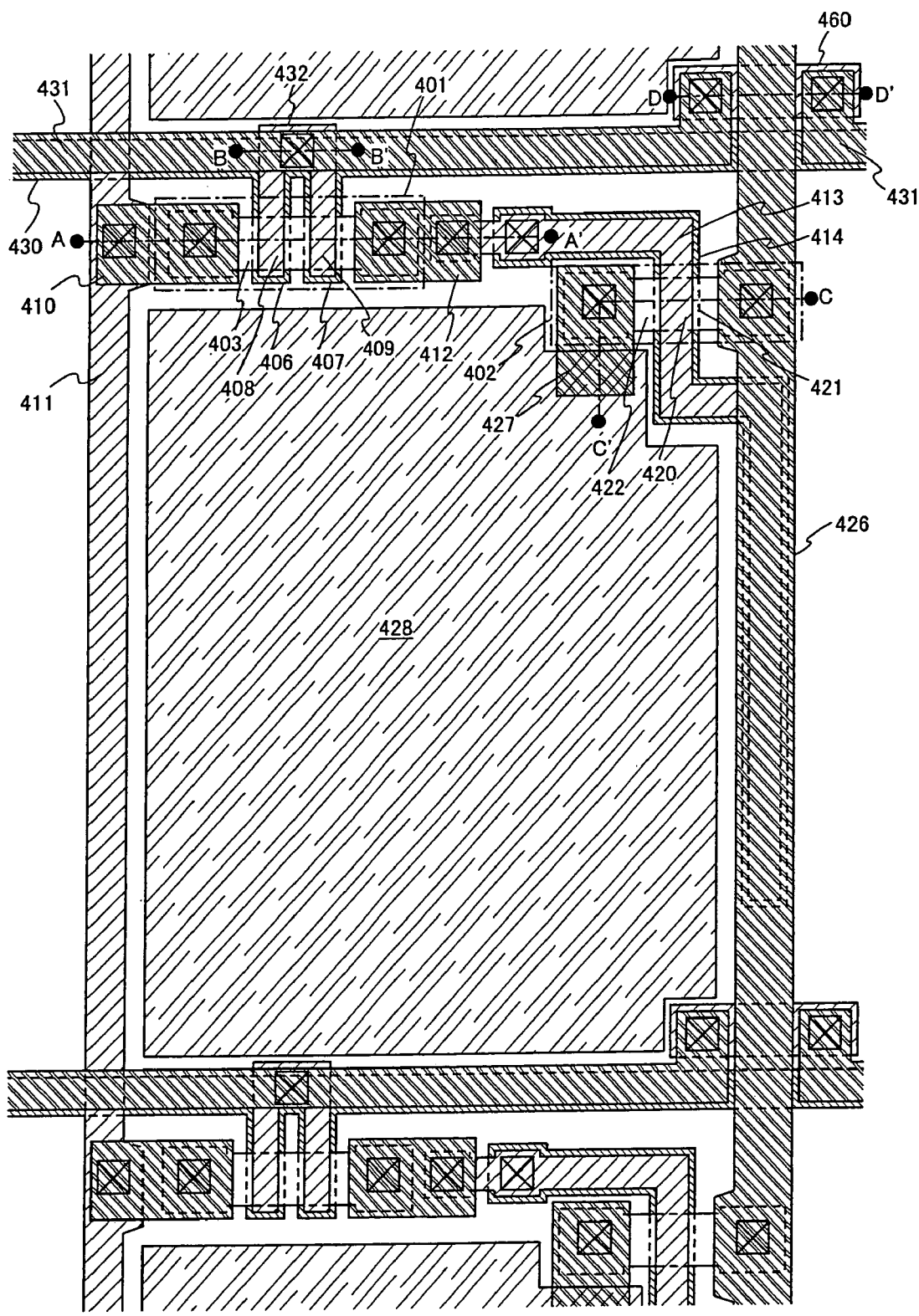
FIG. 11 is a top view of the pixel of the light emitting device.
Figure 12:
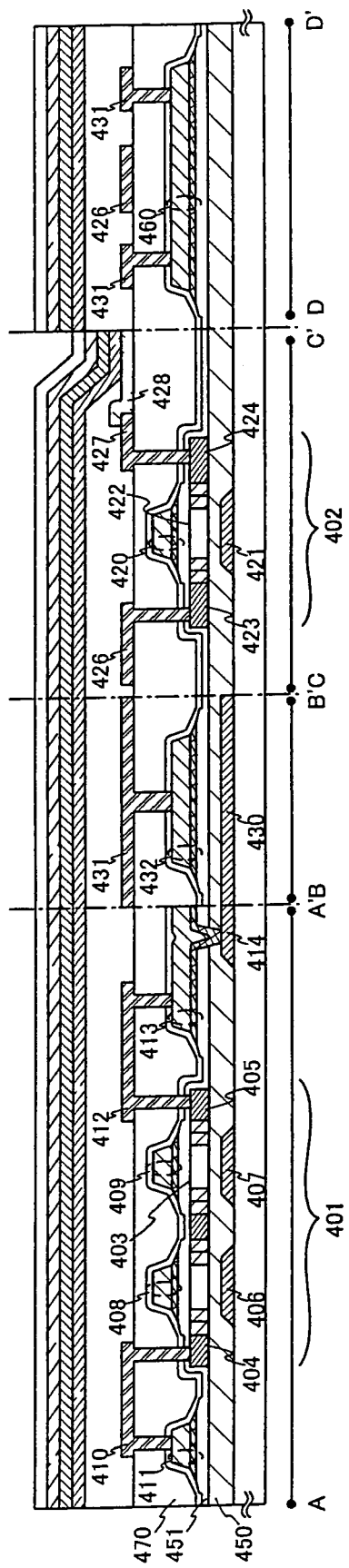
FIG. 12 is a sectional view of the pixel of the light emitting device.

FIG. 11 shows a top view of the pixel of the light emitting device of this embodiment. FIG. 12 shows a sectional view in A-A', B-B', C-C' and D-D' of FIG. 11. A partition wall layer, an organic light emitting layer, a cathode and a protecting film manufactured in the process subsequent to the formation of a pixel electrode are omitted to clarify the construction of the pixel in FIG. 11.

Reference numeral 401 designates a TFT for switching, and an n-channel TFT is used in this embodiment. Reference numeral 402 designates a TFT for driving, and a p-channel TFT is used in this embodiment. The TFT for switching and the TFT for driving may be also set to the n-channel TFT and the p-channel TFT.

The TFT 401 for switching has first electrodes 406, 407, a first insulating film 450 abutting on the first electrodes 406, 407, a semiconductor film 403 abutting on the first insulating film 450, a second insulating film 451 abutting on the semiconductor film 403, and second electrodes 408, 409 abutting on the second insulating film 451.

One of source and drain areas 404, 405 arranged in the semiconductor film 403 is connected to a source wiring 411 through a wiring 410, and the other is connected to a second wiring 413 through a wiring 412. The second wiring 413 is connected to a first wiring 414 through a contact hole.

The first electrodes 406, 407 are overlapped with the second electrodes 408, 409 through the first insulating film 450, the semiconductor film 403 and the second insulating film 451.

The TFT 402 for driving has a first electrode 421, a first insulating film 450 abutting on the first electrode 421, a semiconductor film 422 abutting on the first insulating film 450, a second insulating film 451 abutting on the semiconductor film 422, and a second electrode 420 abutting on the second insulating film 451.

The first electrode 421 is one portion of the first wiring 414, and the second electrode 420 is one portion of the second wiring 413.

One of source and drain areas 423, 424 arranged in the semiconductor film 422 is connected to a power line 426, and the other is connected to a pixel electrode 428 through a wiring 427.

The first electrode 421 is overlapped with the second electrode 420 through the first insulating film 450, the semiconductor film 422 and the second insulating film 451.

A holding capacitor is formed in a portion in which the power line 426 and the second wiring 413 are overlapped with each other through a third insulating film 470. A holding capacitor is also formed in a portion in which the second wiring 413 and the first wiring 414 are overlapped with each other through the first insulating film 450 and the second insulating film 451.

Reference numeral 430 designates a common wiring, and a constant voltage (a ground voltage in this embodiment) is applied to the common wiring 430. A wiring 432 partially has the second electrodes 408, 409, and is connected to a gate wiring 431 through a contact hole formed in the first insulating film 450 and the second insulating film 451.

Adjacent gate wirings 431 are connected by a wiring 460 without coming in contact with the power line 426.

In this embodiment, the common voltage is applied to the first electrode in the TFT 401 for switching even in the TFTs within the same pixel. The dispersion of a threshold value and an off-electric current can be restrained by applying the common voltage to the first electrode in comparison with the case of one electrode.

The TFT 402 for driving through which an electric current larger than that of the TFT for switching flows, electrically connects the first and second electrodes to each other. A depletion layer is rapidly spread by applying the same voltage to the first and second electrodes as in a case in which the thickness of the semiconductor film is substantially thinned. Accordingly, a sub-threshold coefficient can be reduced and electric field effect mobility can be improved. Further, the dispersion of the threshold value can be restrained in comparison with the case of one electrode. Accordingly, the on-electric current can be increased in comparison with the case of one electrode. Therefore, a driving voltage can be reduced by using the TFT of this structure in a driving circuit. Further, since the on-electric current can be increased, the size (particularly channel width) of the TFT can be reduced. Therefore, integration density can be improved.

The present invention is not limited to this construction. The first and second electrodes may be connected in the TFT for switching, and the common voltage may be also applied to the first electrode in the TFT for driving.

In the light emitting device of this embodiment, the TFT for switching has a double gate structure (a structure including an active layer having two channel forming areas connected in series). However, this embodiment is not limited to this construction. The TFT for switching may have a single gate structure, and may also have a multigate structure (a structure including an active layer having two or more channel forming areas connected in series) such as a triple gate structure, etc. Further, the TFT for driving may have a multigate structure (a structure including an active layer having two or more channel forming areas connected in series) such as a double gate structure, a triple gate structure, etc. instead of the single gate structure.

In this embodiment, the gate wiring and the power line are simultaneously formed, and the source wiring and a wiring for supplying the drain electric current of the TFT for driving to the pixel electrode are then simultaneously formed. Since the source wiring is formed below a third insulating film 470 and the pixel electrode is formed on the third insulating film, the source wiring and the pixel electrode can be overlapped without direct connection even when no insulating film is newly arranged. Accordingly, the light emitting area of a light emitting element can be further widened.

Embodiment 4

In this embodiment, the construction of a pixel of the light emitting device of the present invention different from that of the embodiments 1, 2 and 3 will be explained.

Figure 13:
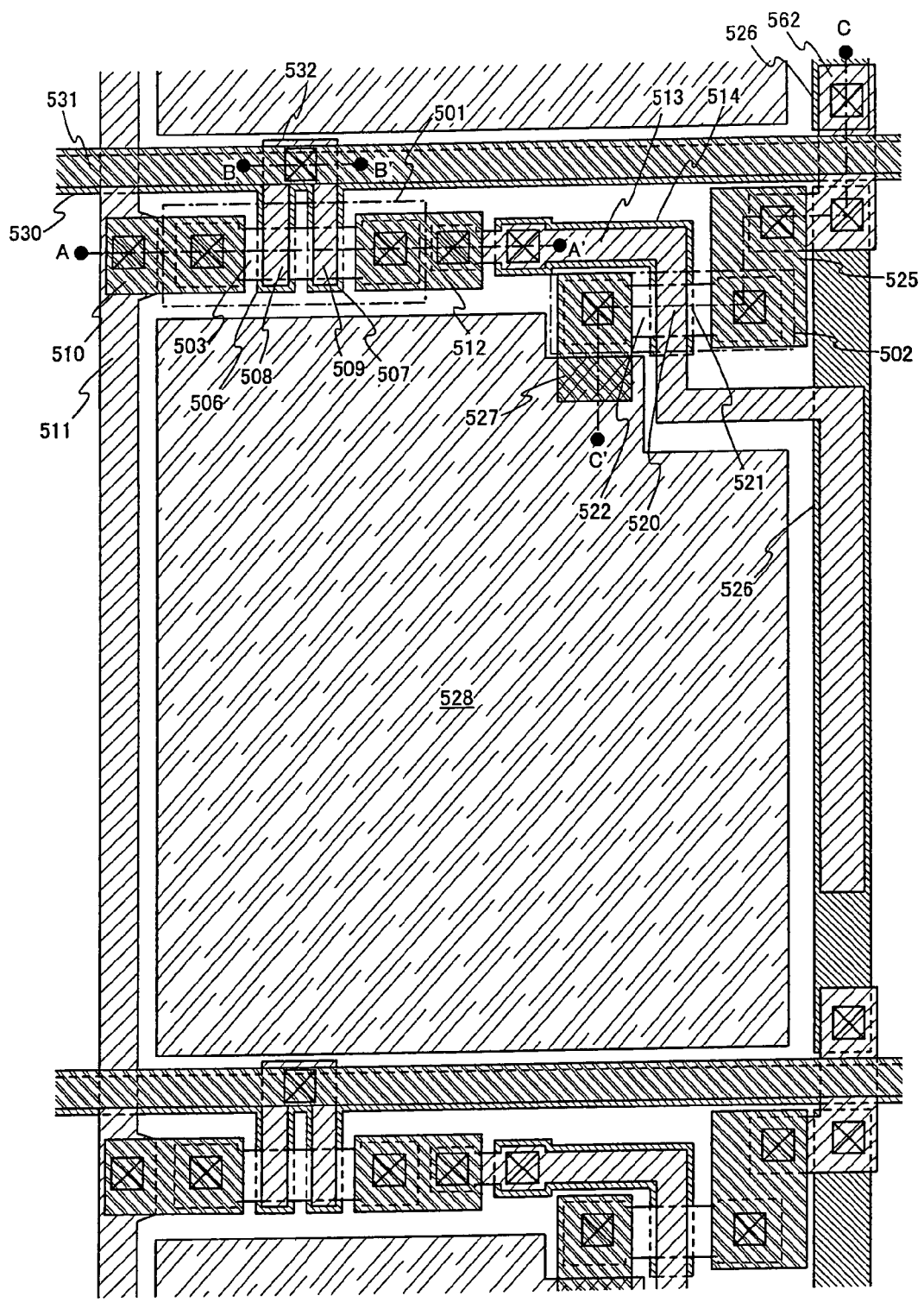
FIG. 13 is a top view of the pixel of the light emitting device.
Figure 14A:
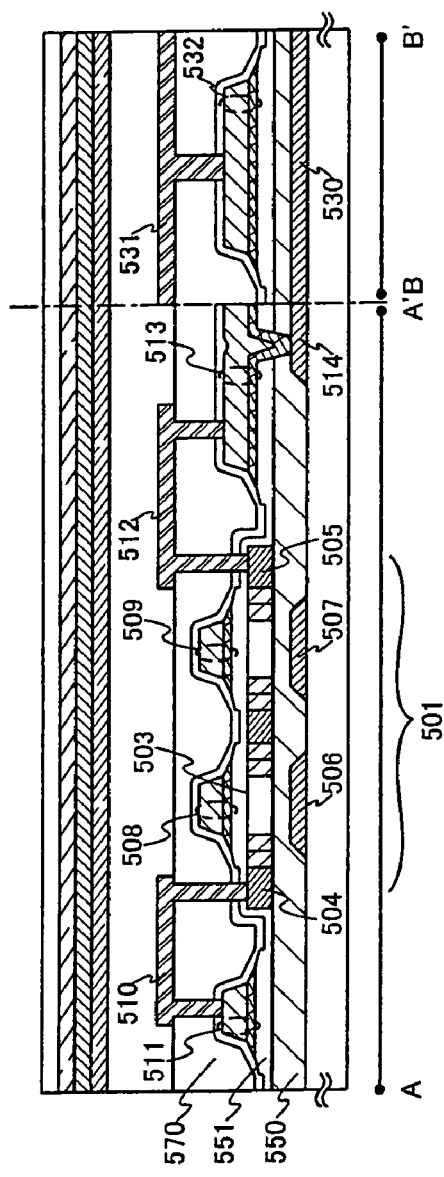
FIGS. 14A and 14B are sectional views of the pixel of the light emitting device.
Figure 14B:
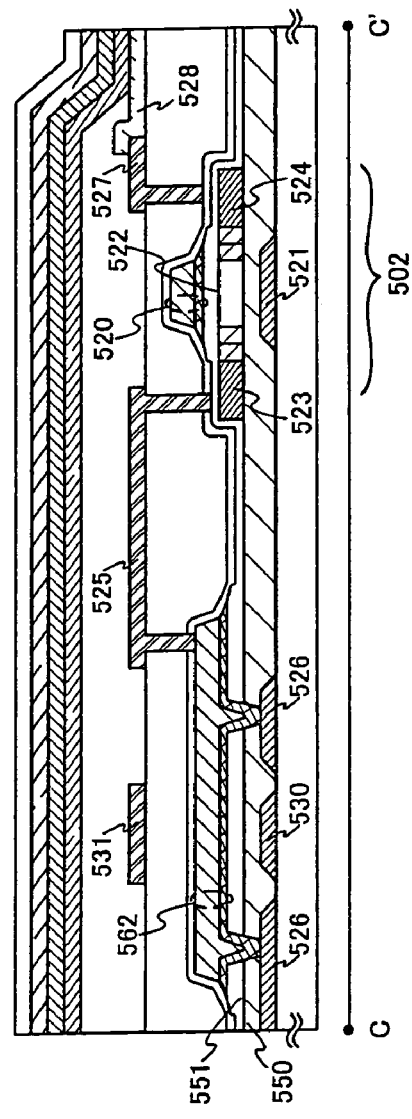

FIG. 13 shows a top view of the pixel of the light emitting device of this embodiment. FIGS. 14A and 14B show sectional views in A-A', B-B' and C-C' of FIG. 13. A partition wall layer, an organic light emitting layer, a cathode and a protecting film manufactured in the process subsequent to the formation of a pixel electrode are omitted to clarify the construction of the pixel in FIG. 13.

Reference numeral 501 designates a TFT for switching, and an n-channel TFT is used in this embodiment. Reference numeral 502 designates a TFT for driving, and a p-channel TFT is used in this embodiment. The TFT for switching and the TFT for driving may be also set to the n-channel TFT and the p-channel TFT.

The TFT 501 for switching has first electrodes 506, 507, a first insulating film 550 abutting on the first electrodes 506, 507, a semiconductor film 503 abutting on the first insulating film 550, a second insulating film 551 abutting on the semiconductor film 503, and second electrodes 508, 509 abutting on the second insulating film 551.

One of source and drain areas 504, 505 arranged in the semiconductor film 503 is connected to a source wiring 511 through a wiring 510, and the other is connected to a second wiring 513 through a wiring 512. The second wiring 513 is connected to a first wiring 514 through a contact hole.

The first electrodes 506, 507 are overlapped with the second electrodes 508, 509 through the first insulating film 550, the semiconductor film 503 and the second insulating film 551.

The TFT 502 for driving has a first electrode 521, a first insulating film 550 abutting on the first electrode 521, a semiconductor film 522 abutting on the first insulating film 550, a second insulating film 551 abutting on the semiconductor film 522, and a second electrode 520 abutting on the second insulating film 551.

The first electrode 521 is one portion of the first wiring 514, and the second electrode 520 is one portion of the second wiring 513.

One of source and drain areas 523, 524 arranged in the semiconductor film 522 is connected to a wiring 562 through a wiring 525, and the other is connected to a pixel electrode 528 through a wiring 527. The wiring 562 is connected to a power line 526.

The first electrode 521 is overlapped with the second electrode 520 through the first insulating film 550, the semiconductor film 522 and the second insulating film 551.

A holding capacitor is also formed in a portion in which the power line 526 and the second wiring 513 are overlapped with each other through the first insulating film 550 and the second insulating film 551.

Reference numeral 530 designates a common wiring, and a constant voltage (a ground voltage in this embodiment) is applied to the common wiring 530. A wiring 532 partially has the second electrodes 508, 509, and is connected to a gate wiring 531 through a contact hole formed in the first insulating film 550 and the second insulating film 551.

In this embodiment, the common voltage is applied to the first electrode in the TFT 501 for switching even in the TFTs within the same pixel. The dispersion of a threshold value and an off-electric current can be restrained by applying the common voltage to the first electrode in comparison with the case of one electrode.

The TFT 502 for driving through which an electric current larger than that of the TFT for switching flows, electrically connects the first and second electrodes to each other. A depletion layer is rapidly spread by applying the same voltage to the first and second electrodes as in a case in which the thickness of the semiconductor film is substantially thinned. Accordingly, a sub-threshold coefficient can be reduced and electric field effect mobility can be improved. Further, the dispersion of the threshold value can be restrained in comparison with the case of one electrode. Accordingly, the on-electric current can be increased in comparison with the case of one electrode. Therefore, a driving voltage can be reduced by using the TFT of this structure in a driving circuit. Further, since the on-electric current can be increased, the size particularly channel width) of the TFT can be reduced. Therefore, integration density can be improved.

The present invention is not limited to this construction. The first and second electrodes may be connected in the TFT for switching, and the common voltage may be also applied to the first electrode in the TFT for driving.

In this embodiment, the power line and the common wiring are simultaneously formed, and the source wiring is then formed. Thereafter, the gate wiring and a wiring for supplying the drain electric current of the TFT for driving to the pixel electrode are simultaneously formed. Since the source wiring and the power line are formed below a third insulating film 570 and the pixel electrode is formed on the third insulating film 570, the source wiring, the power line and the pixel electrode can be overlapped without direct connection even when no insulating film is newly arranged. Accordingly, the light emitting area of a light emitting element can be further widened.

Embodiment 5

In this embodiment, the construction of a pixel of the light emitting device of the present invention different from that of the embodiments 1, 2, 3 and 4 will be explained.

Figure 15:
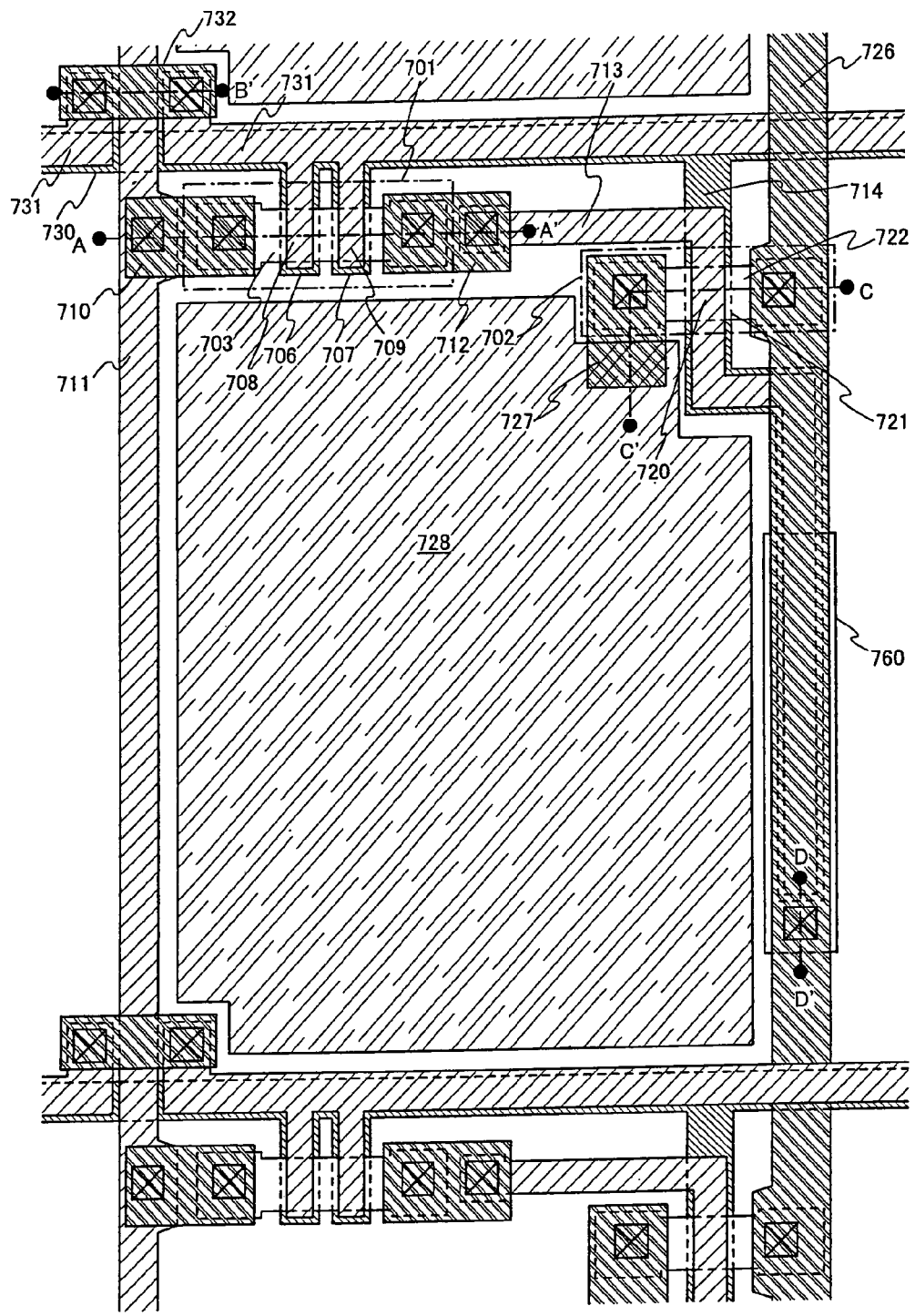
FIG. 15 is a top view of the pixel of the light emitting device.
Figure 16:
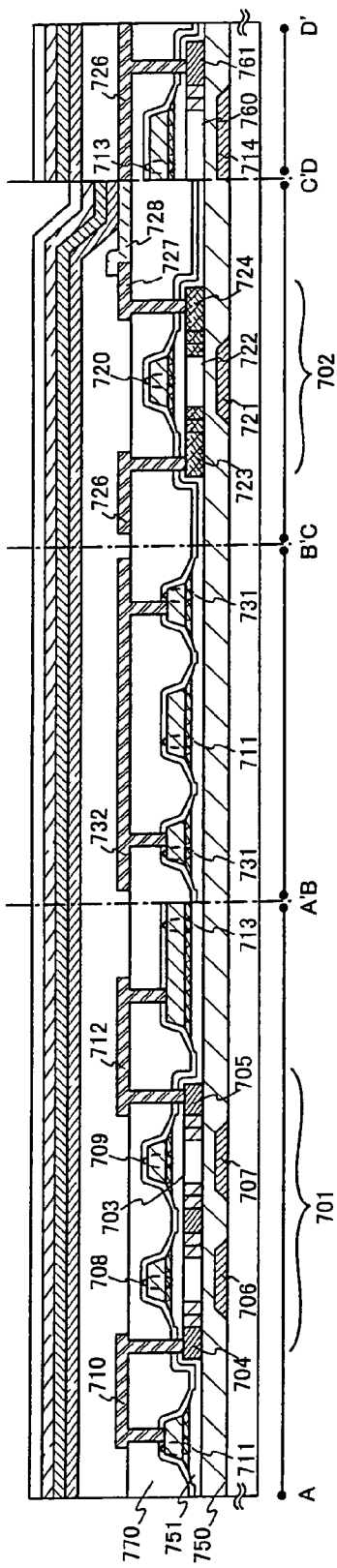
FIG. 16 is a sectional view of the pixel of the light emitting device.

FIG. 15 shows a top view of the pixel of the light emitting device of this embodiment. FIG. 16 show a sectional view in A-A', B-B', C-C' and D-D' of FIG. 15. A partition wall layer, an organic light emitting layer, a cathode and a protecting film manufactured in the process subsequent to the formation of a pixel electrode are omitted to clarify the construction of the pixel in FIG. 15.

Reference numeral 701 designates a TFT for switching, and an n-channel TFT is used in this embodiment. Reference numeral 702 designates a TFT for driving, and a p-channel TFT is used in this embodiment. The TFT for switching and the TFT for driving may be also set to the n-channel TFT and the p-channel TFT.

The TFT 701 for switching has first electrodes 706, 707, a first insulating film 750 abutting on the first electrodes 706, 707, a semiconductor film 703 abutting on the first insulating film 750, a second insulating film 751 abutting on the semiconductor film 703, and second electrodes 708, 709 abutting on the second insulating film 751.

One of source and drain areas 704, 705 arranged in the semiconductor film 703 is connected to a source wiring 711 through a wiring 710, and the other is connected to a second wiring 713 through a wiring 712.

The first electrodes 706, 707 are overlapped with the second electrodes 708, 709 through the first insulating film 750, the semiconductor film 703 and the second insulating film 751.

The TFT 702 for driving has a first electrode 721, a first insulating film 750 abutting on the first electrode 721, a semiconductor film 722 abutting on the first insulating film 750, a second insulating film 751 abutting on the semiconductor film 722, and a second electrode 720 abutting on the second insulating film 751.

The first electrode 721 is one portion of a wiring 714 connected to a common wiring 730, and the second electrode 720 is one portion of the second wiring 713.

One of source and drain areas 723, 724 arranged in the semiconductor film 722 is connected to a power line 726, and the other is connected to a pixel electrode 728 through a wiring 727.

The first electrode 721 is overlapped with the second electrode 720 through the first insulating film 750, the semiconductor film 722 and the second insulating film 751.

The power line 726 is connected to an impurity area 761 arranged in the semiconductor film 760 for forming capacity. A storage capacitor is formed in a portion in which the power line 726 and the second wiring 713 are overlapped with each other through a third insulating film 770. A storage capacitor is also formed in a portion in which the second wiring 713 and the semiconductor film 760 are overlapped with each other through the second insulating film 751. Further, a storage capacitor is formed in a portion in which the semiconductor film 760 and the first wiring 714 are overlapped with each other through the first insulating film 750.

A constant voltage (a ground voltage in this embodiment) is applied to the common wiring 730. A wiring 732 connects adjacent gate wirings 731 without coming in contact with the source wiring 711. The gate wiring 731 partially has the second electrodes 708, 709.

In this embodiment, the common voltage is applied to the first electrode in the TFT 701 for switching and the TFT 702 for driving. The dispersion of a threshold value and an off-electric current can be restrained by applying the common voltage to the first electrode in comparison with the case of one electrode.

The present invention is not limited to this construction, but the first and second electrodes may be also connected to each other.

Further, in the light emitting device of this embodiment, the TFT for switching has a double gate structure (a structure including an active layer having two channel forming areas connected in series), but this embodiment is not limited to this construction. The TFT for switching may have a single gate structure, and may also have a multigate structure (a structure including an active layer having two or more channel forming areas connected in series) such as a triple gate structure, etc. Further, the TFT for driving may also have a multigate structure (a structure including an active layer having two or more channel forming areas connected in series) such as a double gate structure, a triple gate structure, etc. instead of the single gate structure.

In this embodiment, the source wiring and the gate wiring are simultaneously formed, and the power line and a wiring for supplying the drain electric current of the TFT for driving to the pixel electrode are then simultaneously formed. As the thickness of the wiring is increased, a step difference caused by the wiring is increased. When the step difference is increased, the possibilities of disconnecting the wiring manufactured in the subsequent process and deteriorating the characteristics of an element are raised. Accordingly, it is desirable to thinly set the thickness of the wiring as the wiring is made in the previous process. Since the power line is a wiring for supplying the electric current flowing through the light emitting element, it is desirable to reduce resistance by increasing the film thickness. In the light emitting device of this embodiment, since the power line is formed after the source wiring and the gate wiring are formed, the thickness of the power line can be further increased and resistance can be reduced.

Further, in this embodiment, the source wiring is formed below the third insulating film 770 at the same time as the gate wiring, and the pixel electrode is formed on the third insulating film 770. Therefore, the source wiring and the pixel electrode can be overlapped with each other without direct connection even when no insulating film is newly formed. Accordingly, the light emitting area of the light emitting element can be further widened.

Embodiment 6

In this embodiment, a case of manufacturing a semiconductor film by a different method from that in the first embodiment will be described.

Figure 17A:
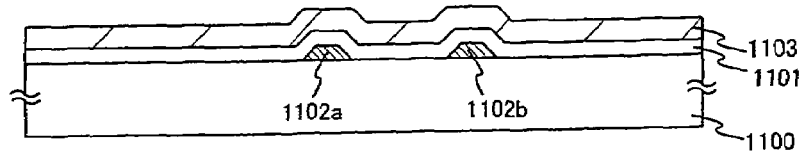
FIGS. 17A to 17G are views showing the process of crystallization of a semiconductor layer.

In FIG. 17A, reference numeral 1100 denotes a substrate which includes an insulating surface. In FIG. 17A, a glass substrate, a quartz substrate, a ceramic substrate or the like can be used as the substrate 1100. Alternatively, a substrate such as a silicon substrate, a metal substrate or a stainless substrate having an insulating film formed on the surface thereof may be used. It is also possible to use a plastic substrate having heat resistance against the treatment temperature in the steps of this embodiment.

As shown in FIG. 17A, first electrode 1102*a* and 1102*b* are first formed on the substrate 1100. The first electrodes 1102*a* and 1102*b* may be formed out of a conductive substance. Typically, the first electrodes 1102*a* and 1102*b* can be formed out of alloy or a compound consisting of one or a plurality of elements selected from among aluminum (Al), tungsten (W), molybdenum (Mo), tantalum (Ta) and titanium (Ti). Alternatively, layered conductive films may be used as the first electrodes.

A first insulating film 1101 is formed on the insulating surface of the substrate 1100 to cover the first electrodes 1102*a* and 1102*b*. The first insulating film 1101 is formed out of a silicon oxide film, a silicon nitride film, a silicon oxide nitride film ($SiO_xN_y$) or the like. As a typical example, a film having a two-layer structure in which a first silicon oxide nitride film formed using $SiH_4$, $NH_3$ and $N_2O$ as reaction gas and having a thickness of 50 to 100 nm and a second silicon oxide nitride film formed using $SiH_4$ and $N_2O$ as reaction gas and having a thickness of 100 to 150 nm are layered, is used as the first insulating film 1101. It is also preferable that a silicon nitride film (SiN film) having a thickness of 10 nm or less, or the second silicon oxide nitride film ($SiN_xO_y$ film, where X>>Y) is used as one layer of the first insulating film 1101. During gettering, nickel tends to move toward a region having a high oxygen concentration. It is, therefore, quite effective to use the silicon nitride film as the first insulating film which contacts with the semiconductor film. Alternatively, a film having a three-layer structure in which a first silicon oxide nitride film, a second silicon oxide nitride film and a silicon nitride film are sequentially layered may be used as the first insulating film 1101.

Next, a first semiconductor layer 1103 having an amorphous structure is formed on the first insulating film 1101. A semiconductor material mainly containing silicon is used to form the first semiconductor layer 1103. Typically, an amorphous silicon film or an amorphous silicon germanium film is used as the first semiconductor layer 1103. The first semiconductor layer 1103 is formed to have a thickness of 10 to 100 nm by the plasma CVD method, a low pressure CVD method or a sputtering method. It is preferable that the concentration of impurities such as oxygen and nitrogen contained in the film of the first semiconductor layer 1103 having an amorphous structure, is decreased to not higher than $5 \times 10^{18}/cm^3$ (atom concentration measured by secondary ion mass spectroscopy (SIMS)). These impurities prevent later crystallization and, even after the crystallization, increase the density of a trapping center or recombination center. For these reasons, it is preferable to use not only high purity material gas but also use an extreme high vacuum CVD system which includes a mirror treatment (field polishing) reaction chamber or an oil-free evacuation system.

Figure 17B:
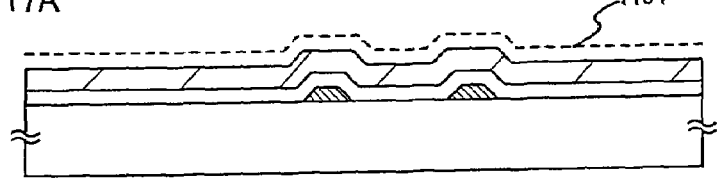

Next, to crystallize the first semiconductor layer 1103 having an amorphous structure, a technique described in Japanese Patent Application Laid-open No. Hei 8-78329 is employed in this embodiment. The technique described therein is for selectively adding a metal element which accelerates crystallizing an amorphous silicon film, carrying out a heat treatment and thereby forming a semiconductor layer having a crystal structure spreading from the metal element added regions. A nickel acetate solution which contains a metal element (nickel in this embodiment) of 1 to 100 ppm in weight terms, which has a catalytic action for accelerating crystallization, is coated on the surface of the first semiconductor layer 1103 having an amorphous structure by a spinner to thereby form a nickel containing layer 1104 (FIG. 17B). Instead of the coating means, a means for forming a very thin film by sputtering, deposition or plasma treatment may be used to form the nickel containing layer 1104. While an example of coating the nickel acetate solution on the entire surface of the first semiconductor layer 1103 is shown in this embodiment, it is also possible to form a mask and to selectively form a nickel containing layer using the mask.

Figure 17C:
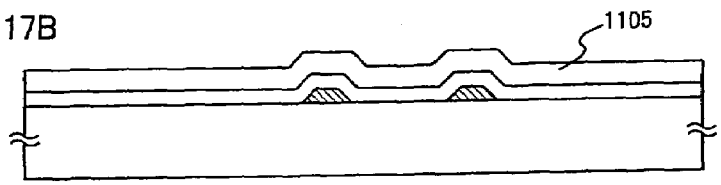

Next, a heat treatment is carried out for crystallization. In this case, silicide is formed in the sections of the semiconductor layer contacted by the metal element which accelerates the crystallization of the semiconductor and crystallization progresses while centering around the silicide. As a result, the first semiconductor layer 1105 having an amorphous structure shown in FIG. 17C is formed. It is preferable that the concentration of oxygen contained in the first semiconductor layer 1105 thus crystallized is set at not higher than $5 \times 10^{18}/cm^3$. In this embodiment, after a heat treatment (at 450° C. for 1 hour) for dehydrogenation, the heat treatment (at 550 to 650° C. for 4 to 24 hours) for crystallization is carried out. If crystallization is conducted by the irradiation of strong light, one of infrared light, visible light and ultraviolet light or a combination thereof can be used. Typically, light radiated from a halogen lamp, a metal halide lamp, a xenon arc lamp, a carbon arc lamp, a high pressure sodium lamp or a high pressure mercury lamp is used. The lamp light source is turned on for 1 to 60 seconds, preferably 30 to 60 seconds one to ten times so as to instantaneously heat the semiconductor layer up to about 600 to 1000° C. If necessary, a heat treatment for discharging hydrogen contained in the first semiconductor layer 1105 of the amorphous structure before the strong light is applied to the first semiconductor layer 1105 may be carried out. Alternatively, the heat treatment and the strong light irradiation may be conducted simultaneously. In light of productivity, it is preferable to crystallize the semiconductor by the irradiation of strong light.

The metal element (nickel in this embodiment) remains in the first semiconductor layer 1105 thus obtained. The metal element remains at a mean concentration higher than $1\times10^{19}/cm^3$ even if they are not uniformly distributed in the film. Although it is possible to form various semiconductor elements including TFT's even in such a state, the element is removed by the following method in this embodiment.

Figure 17D:
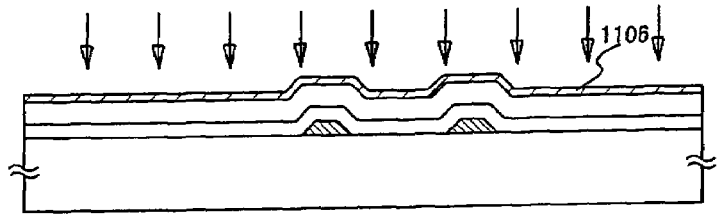

To enhance a crystallization rate (the rate of crystal components in the entire product of the film) and to repair defects left in crystal grains, a laser beam (first laser beam) is applied to the first semiconductor layer 1105 having an amorphous structure in the atmosphere or in an oxygen atmosphere. If the laser beam (first laser beam) is applied to the first semiconductor layer 1105, irregularities are formed on the surface thereof and a thin oxide film 1106 is formed (FIG. 17D). This laser beam (first laser beam) may be an excimer laser beam having a wavelength of not less than 400 nm or the second and third higher harmonic waves of the YAG laser. Alternatively, a beam emitted from an ultraviolet lamp may be used in place of the excimer laser beam.

Figure 17E:
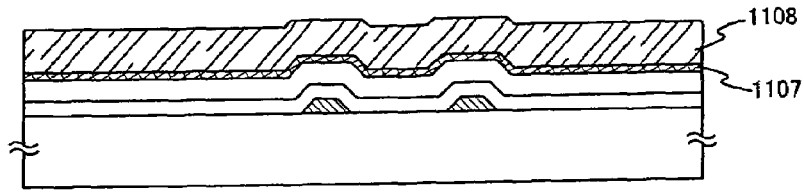

Furthermore, an oxide film (referred to as "chemical oxide") is formed using an ozone containing aqueous solution (typically ozone water) to thereby form a barrier layer 1107 which consists of the oxide film and has a total thickness of 1 to 10 nm. A second semiconductor layer 1108 containing a rare gas element is formed on this barrier layer 1107 (FIG. 17E). In this embodiment, the oxide film 1106 formed as a result of the application of the laser beam against the first semiconductor layer 1105 having an amorphous structure is regarded as a part of the barrier layer. This barrier layer 1107 functions as an etching stopper when only the second semiconductor layer 1108 is selectively removed in a later step. Even if an aqueous solution in which sulfuric acid, hydrochloric acid, nitric acid or the like is mixed with oxygenated water, in place of the ozone containing aqueous solution is used, the chemical oxide can be formed. Alternatively, as another method of forming the barrier layer 1107, ultraviolet rays may be irradiated to the first semiconductor layer 1105 in an oxygen atmosphere to thereby generate ozone and to oxidize the surface of the semiconductor layer having an amorphous structure. As yet another formation method, the barrier layer 1107 may be formed by depositing an oxide film having a thickness of about 1 to 10 nm by the plasma CVD method, the sputtering method, the deposition method or the like. Further, as still another method, a thin oxide film may be formed as the barrier layer 1107 by heating the first semiconductor layer 1105 up to about 200 to 350° C. in a clean oven. Although the barrier layer 1107 is not limited to any specific layer as long as the barrier layer 1107 is formed by any one of the above-stated methods or a combination thereof, it is necessary that the barrier layer 1107 has a sufficient film property or thickness to enable nickel contained in the first semiconductor layer 1105 to move to the second semiconductor layer 1108 in a later gettering step.

In this embodiment, the second semiconductor layer 1108 containing a rare gas element is formed by the sputtering method and a gettering site is formed (FIG. 17E). It is preferable that sputtering conditions are appropriately adjusted so as not to add the rare gas element to the first semiconductor layer 1105. As the rare gas element, one or a plurality of elements selected from among helium (He), neon (Ne), argon (Ar), krypton (Kr) and xenon (Xe) are employed. Among them, argon (Ar) which is inexpensive gas, is preferable. In this embodiment, a target which consists of silicon is used in a rare gas element containing atmosphere to form the second semiconductor layer 1108. There are two meanings to contain rare gas element ions as inert gas ions in the film. One is to form dangling bonds so as to distort the semiconductor layer. The other is to generate distortions between the lattices of the semiconductor layer. The distortions between the lattices of the semiconductor layer are generated conspicuously when an element, such as argon (Ar), krypton (Kr) or xenon (Xe), larger than silicon in atomic diameter is used. Further, by containing the rare gas element in the film, not only lattice distortions but also unpaired bonds are formed, contributing to the gettering action.

Furthermore, if the second semiconductor layer 1108 is formed using a target containing phosphorus which is a one conductive type impurity element, not only gettering by the rare gas element but also gettering using the Coulomb force of phosphorus can be conducted.

In addition, since nickel tends to move to a region having a high oxygen concentration during the gettering, it is preferable that the concentration of oxygen contained in the second semiconductor layer 1108 is set higher than that of oxygen contained in the first semiconductor layer 1105, e.g., not lower than $5\times10^{18}/cm^3$.

Figure 17F:
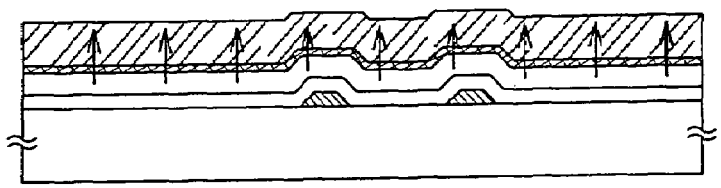

Thereafter, a heat treatment is carried out to conduct gettering for decreasing the concentration of the metal element (nickel) in the first semiconductor layer 1105 or removing the metal element (nickel) (FIG. 17F). As the heat treatment for the gettering, a treatment for applying strong light or an ordinary heat treatment may be conducted. As a result of this gettering, the metal element moves in an arrow direction shown in FIG. 17F (i.e., a direction from the substrate side to the surface of the second semiconductor layer 1108), thereby removing the metal element contained in the first semiconductor layer 1105 or decreasing the concentration of the metal element. The moving distance of the metal element during the gettering may be at least the same as the thickness of the first semiconductor layer 1105. With such a distance, it is possible to complete the gettering in relatively short time. In this embodiment, nickel is entirely moved to the second semiconductor layer 1108 so as not to segregate nickel in the first semiconductor layer 1105. As a result, nickel is hardly contained in the first semiconductor layer 1105. Namely, gettering is sufficiently conducted so that the nickel concentration of the film becomes not higher than $1\times10^{18}/cm^3$, preferably not higher than $1\times10^{17}/cm^3$.

Furthermore, depending on the conditions of this gettering heat treatment, it is possible to enhance the crystallization rate of the first semiconductor layer 1105 and to repair the defects left in crystal grains, i.e., to improve crystallinity simultaneously with the gettering.

In this specification, gettering means that a metal element in a gettering target region (corresponding to the first semiconductor layer 1105 in this embodiment) is discharged by heat energy and diffused and thereby moved to a gettering site. Accordingly, the gettering depends on treatment temperature, which follows that the gettering can be conducted in shorter time as the treatment temperature is higher.

In addition, if a strong light irradiation treatment is used as the heat treatment for this gettering, a lamp light source for heating is turned on for 1 to 60 seconds, preferably 30 to 60 seconds repeatedly one to ten times, preferably two to six times. The luminous intensity of the lamp light source may be arbitrarily set. However, it is necessary to set the luminous intensity thereof so that the semiconductor layer is instantaneously heated up to about 600 to 1000° C., preferably about 700 to 750° C.

Additionally, if the gettering is conducted by a heat treatment, the heat treatment may be carried out at a temperature of 450 to 800° C. for 1 to 24 hours, e.g., at 550° C. for 14 hours in a nitrogen atmosphere. Alternatively, strong light may be irradiated to the semiconductor layer in addition to the heat treatment.

Next, using the barrier layer 1107 as an etching stopper, only the second semiconductor layer denoted by the reference numeral 1106 is selectively removed and then the barrier layer 1107 consisting of the oxide film is removed. As a method of selectively etching only the second semiconductor layer, dry etching using $ClF_3$ without using plasma or wet etching using an alkali solution such as an aqueous solution containing hydrazine or tetraethyl ammonium hydroxide (expressed by a chemical formula $(CH_3)_4NOH$) can be conducted. In addition, if the nickel concentration of the surface of the barrier layer is measured by TXRF after removing the second semiconductor layer, the nickel concentration is detected to be high. It is, therefore, preferable to remove the barrier layer using fluorine containing etchant.

Figure 17G:
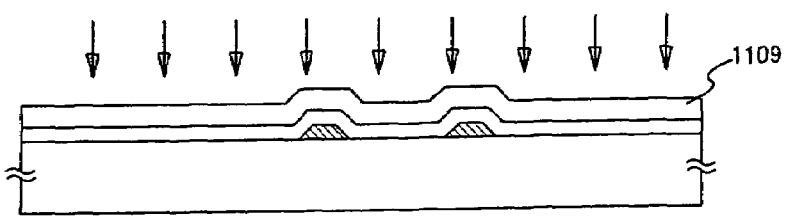

Next, a laser beam (second laser beam) is applied to the first semiconductor layer 1105 having a crystal structure either in a nitrogen atmosphere or in vacuum. If the laser beam (second laser beam) is irradiated, the difference in level (P-V value: Peak to Valley value; difference in height between maximum and minimum) among the irregularities formed by the irradiation of the first laser beam is decreased, i.e., the surface is flattened (FIG. 17G). The P-V value of the irregularities may be observed with an AFM (atomic force microscope). Specifically, the P-V value of the irregularities formed by the irradiation of the first laser beam of about 10 nm to 30 nm can be decreased to 5 nm or less by the irradiation of the second laser beam. Depending on the conditions, the P-V value can be decreased to 1.5 nm or less. As this laser beam (second laser beam), an excimer laser beam having a wavelength of not more than 400 nm or the second and third higher harmonic waves of the YAG laser can be employed. Alternatively, a light beam emitted from a ultraviolet lamp may be used in place of the excimer laser beam.

The energy density of the second laser beam is set higher than that of the first laser beam, preferably higher than that of the first laser beam by 30 to 60 $mJ/cm^2$. It is noted, however, if the energy density of the second laser beam is higher than that of the first laser beam by 90 $mJ/cm^2$ or more, surface roughness tends to increase and crystallinity tends to deteriorates or crystal grains tend to be transformed to crystallites, thereby deteriorating the characteristics of the first semiconductor layer.

Although the energy density of the second laser beam is higher than that of the first laser beam, the crystallinity of the semiconductor layer hardly changes before and after the irradiation. In addition, crystal states such as grain diameters hardly change. In other words, it is considered that the irradiation of the second laser beam is intended only to flatten the surface of the semiconductor layer.

The flattening of the semiconductor layer having a crystal structure by the irradiation of the second laser beam possesses high merit. For example, by improving the flatness of the semiconductor layer, it is possible to make the second insulating film to be formed in a later step as a gate insulating film thinner and to thereby improve the mobility of the TFT. In addition, by improving the flatness, it is possible to decrease OFF current in the manufacturing of the TFT.

Furthermore, the irradiation of the second laser beam has an advantage in that if the rare gas element is inadvertently added to the first semiconductor layer when the gettering site is formed, the rare gas element in the semiconductor layer having a crystal structure can be removed or decreased.

Next, using a well-known patterning technique, the first semiconductor layer 1109 thus flattened is patterned to thereby form a semiconductor film having a desired shape.

This embodiment can be carried out in free combination with the first to fifth embodiments.

Embodiment 7

In the seventh embodiment, a case of forming a semiconductor film by a thermal crystallization method using a catalytic element.

If the catalytic element is used, it is preferable to use the technique disclosed Japanese Patent Application Laid-open No. Hei 7-130652 or 8-78329.

Figure 18A:
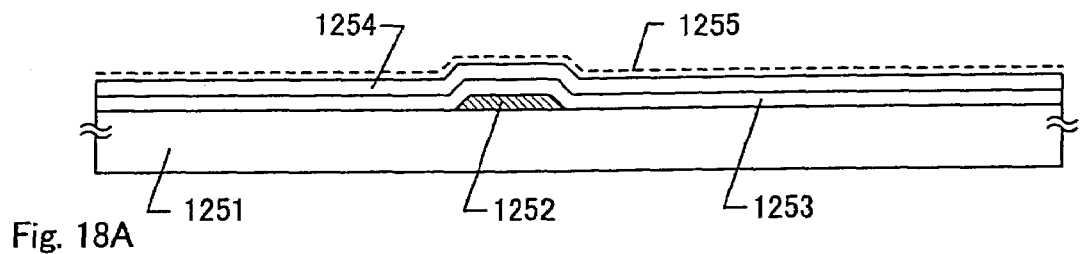
FIGS. 18A and 18B are views showing the process of the crystallization of the semiconductor layer.
Figure 18B:
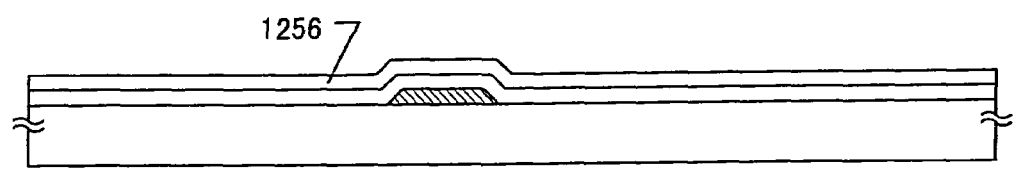

A case of applying the technique disclosed in Japanese Patent Application Laid-open No. Hei 7-130652 to the present invention will first be described with reference to FIGS. 18A and 18B. First, a first electrode 1252 is formed on a substrate 1251. A first insulating film 1253 is then formed on the substrate 1251 to cover the first electrode 1252, and an amorphous silicon film 1254 is formed on the first insulating film 1253. Further, a nickel acetate solution containing nickel of 10 ppm in weight terms is coated on the resultant substrate to thereby form a nickel containing layer 1255 (FIG. 18A).

Next, after a dehydrogenation step at a temperature of 500° C. for 1 hour, a heat treatment is conducted at a temperature of 500 to 650° C. for 4 to 12 hours, e.g., at 550° C. for 8 hours, thereby forming a crystalline silicon film 1256. The crystalline silicon film 1256 thus obtained exhibits quite excellent crystallinity (FIG. 18B).

Meanwhile, according to the technique disclosed in Japanese Patent Application Laid-open No. Hei 8-78329, an amorphous semiconductor film can be selectively crystallized by selectively adding a catalytic element thereto. A case of applying this technique to the present invention will be described with reference to FIGS. 19A and 19B.

First, a first electrode 1302 is formed on a glass substrate 1301. A first insulating film 1303 is formed on the substrate 1301 to cover the first electrode 1302, and an amorphous silicon film 1304 is formed on the first insulating film 1303. A silicon oxide film 1305 is continuously formed on the amorphous silicon film 1304. At this moment, the thickness of the silicon oxide film 1305 is 150 nm.

Figure 19A:
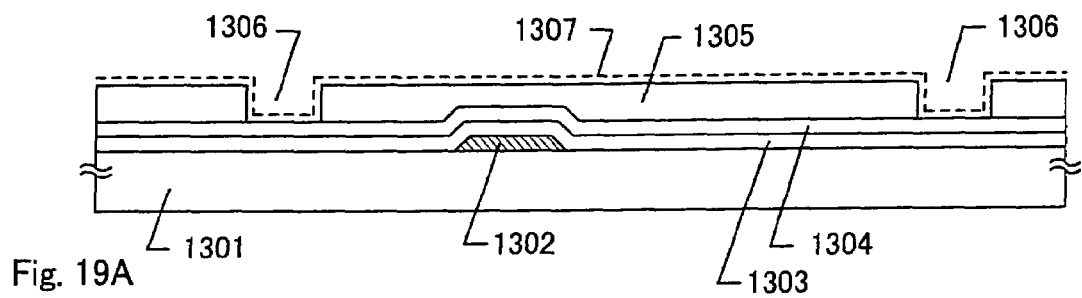
FIGS. 19A and 19B are views showing the process of the crystallization of the semiconductor layer.

Next, the silicon oxide film 1305 is patterned to thereby selectively form contact holes 1306 and a nickel acetate solution containing nickel of 10 ppm in weight terms is coated on the resultant substrate. As a result, a nickel containing layer 1307 is formed. The nickel containing layer 1307 contacts with the amorphous silicon film 1304 only at the bottoms of the contact holes 1306 (FIG. 19A).

Figure 19B:
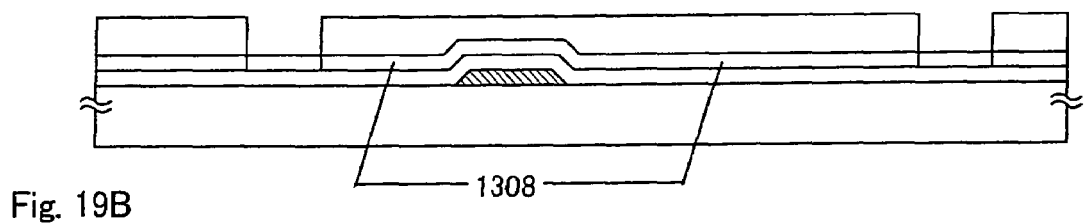

Thereafter, a heat treatment is carried out at a temperature of 500 to 650° C. for 4 to 24 hours, e.g., at 570° C. for 14 hours, thereby forming a crystalline silicon film 1308. In this crystallization process, parts of the amorphous silicon film which contact with nickel are first crystallized and the crystallization proceeds therefrom in lateral direction. The crystalline silicon film 1308 thus formed is constituted so that stick-like or needle-like crystals are collected together. Since each crystal grows with a certain directivity macroscopically, the crystalline silicon film 1308 is advantageous of having uniform crystallinity (FIG. 19B).

The catalytic element available in the above-stated two techniques may be germanium (Ge), iron (Fe), palladium (Pd), tin (Sn), lead (Pb), cobalt (Co), platinum (Pt), copper (Cu) or gold (Au) in place of nickel (Ni).

By forming the crystalline semiconductor film (including a crystalline silicon film and a crystalline silicon germanium film) using one of the above-stated techniques and patterning the crystalline semiconductor film, a semiconductor layer of a crystalline TFT can be formed. Although the TFT formed out of the crystalline semiconductor film by the technique described in this embodiment exhibits excellent characteristics, it is required to ensure high reliability, accordingly. Nevertheless, by adopting the TFT structure of the present invention, it is possible to manufacture a TFT while making the most use of the technique in this embodiment.

Figure 20A:
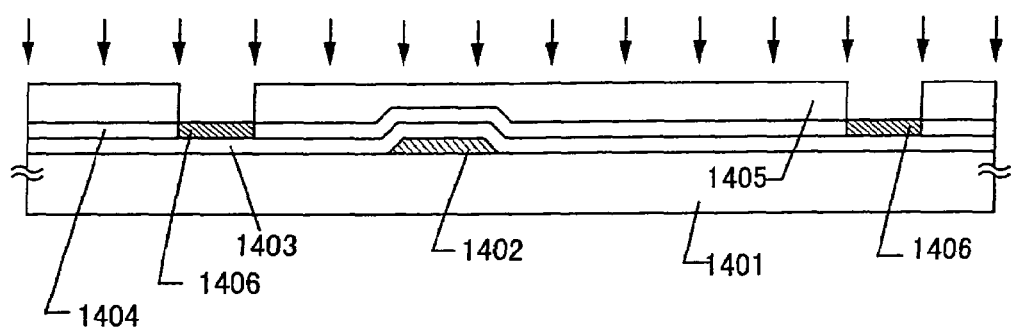
FIGS. 20A and 20B are views showing the process of the crystallization of the semiconductor layer.

Next, a case of executing steps of forming a crystalline semiconductor film using an amorphous silicon film as an initial film and using the catalytic element stated above, and then removing the catalytic element from the crystalline semiconductor film, will be described with reference to FIGS. 20A and 20B. In this embodiment, the steps are executing using the technique described in Japanese Patent Application Laid-open No. Hei 10-135468 or 10-135469.

The technique described therein is for removing a catalytic element used to crystallize an amorphous semiconductor film using the gettering action of phosphorus after the crystallization. By utilizing this technique, it is possible to decrease the concentration of the catalytic element in the crystalline semiconductor film to lower than $1 \times 10^{17}$ atms/cm$^3$, preferably $1 \times 10^{16}$ atms/cm$^3$.

In this embodiment, a no-alkali glass substrate represented by a 1737 substrate manufactured by Corning Inc. is used as a substrate 1401. As shown in FIG. 20A, a first electrode 1402 is formed on the substrate 1401. A first insulating film 1403 is formed on the substrate 1401 to cover the first electrode 1402 and a crystalline silicon film 1404 is formed on the first insulating film 1403.

A silicon oxide film 1405 having a thickness of 150 nm is formed on the surface of the crystalline silicon film 1404 as a mask, contact holes are formed by patterning and regions in which part of the crystalline silicon film 1404 is exposed are provided. Thereafter, a step of adding phosphorus is executed to thereby provide a region 1406 in which phosphorus is added to the crystalline silicon film 1404.

Figure 20B:
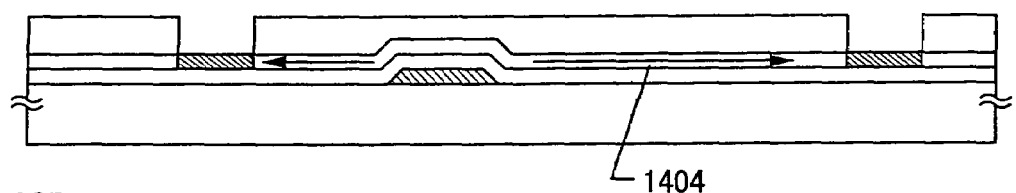

In this state, if a heat treatment is carried out at a temperature of 550 to 800° C. for 5 to 24 hours, e.g., 600° C. for 12 hours in a nitrogen atmosphere, the region 1406 in which phosphorus is added to the crystalline silicon film 1404 acts as a gettering site, making it possible to segregate the catalytic element remaining in the crystalline silicon film 1404 to the gettering region 1406 in which phosphorus is added to the crystalline silicon film 1404 (FIG. 20B).

The oxide silicon film 1405 serving as a mask and the phosphorus-added region 1406 are etched away, whereby the crystalline silicon film having the is concentration of the catalytic element, used in the crystallization step, decreased to $1 \times 10^{17}$ atms/cm$^3$ can be obtained. This crystalline silicon film can be used as the semiconductor layer of the TFT according to the present invention as it is.

This embodiment can be carried out in free combination with the first to fifth embodiments.

Embodiment 8

In the eighth embodiment, the configuration of the semiconductor device according to the present invention will be described.

Figure 21:
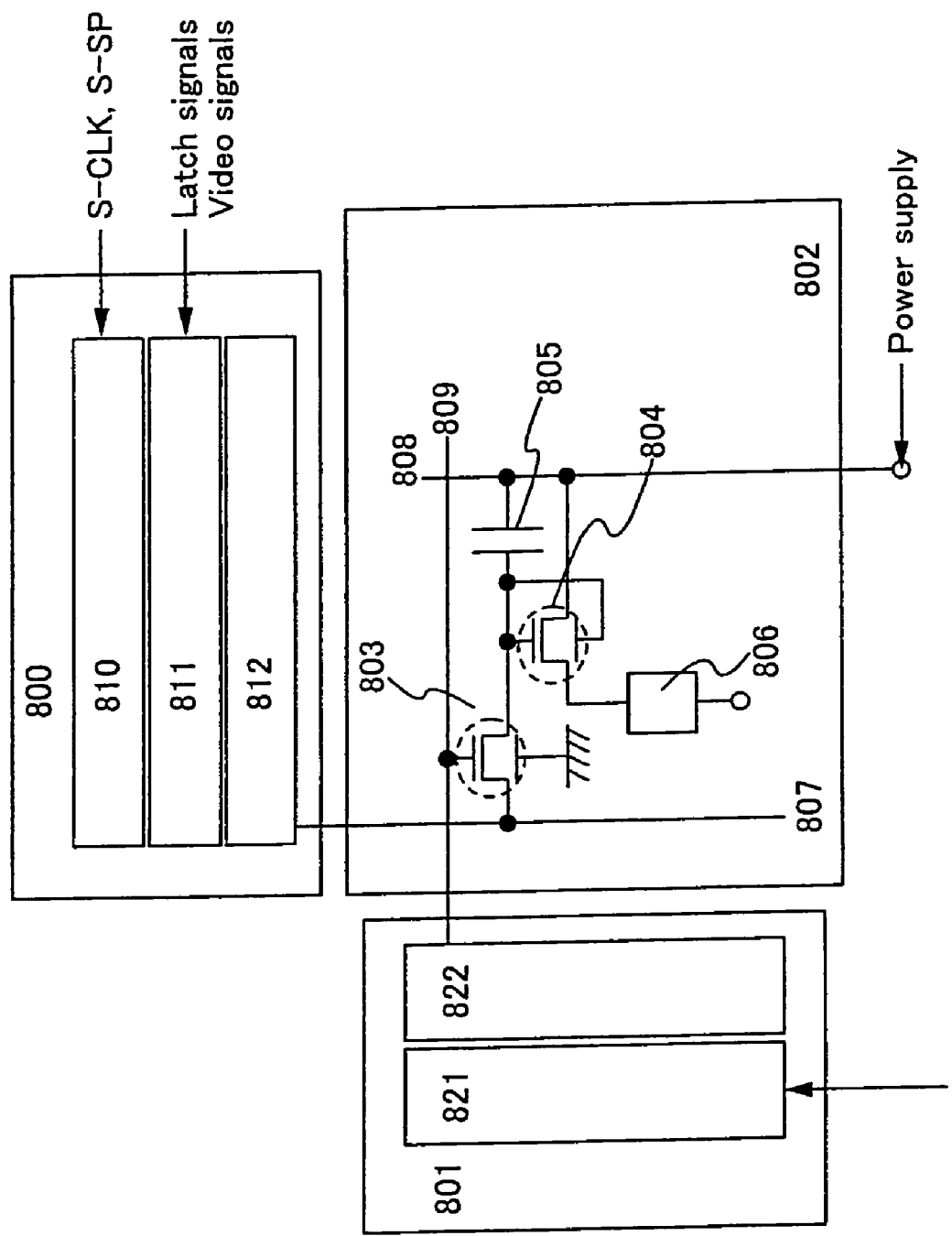
FIG. 21 is a block diagram showing the construction of the light emitting device.

FIG. 21 shows a block diagram of a light emitting device according to the present invention. The configuration of the light emitting device will be described with reference to FIG. 21 while taking the driver circuit of a light emitting device which displays images using digital video signals as an example. The light emitting device shown in FIG. 21 includes a data line driver circuit 800, a scanning line driver circuit 801 and a pixel section 802.

In the pixel section 802, a plurality of source wirings, a plurality of gate wirings and a plurality of power supply lines are formed. A region surrounded by the source wirings, the gate wirings and the power supply lines corresponds to pixels. In FIG. 21, only the pixel which has one source wiring 807, one gate wiring 809 and one power supply line 808 is typically shown among a plurality of pixels. Each pixel includes a switching TFT 803 which serves as a switching element, a driving TFT 804, a storage capacitor 805 and an light emitting element 806.

The gate electrode of the switching TFT 803 is connected to the gate wiring 809. The source and drain regions of the switching TFT 803 are connected to the source wiring 807 and the gate electrode of the driving TFT 804, respectively.

The source and drain regions of the driving TFT 804 are connected to the power supply line 808 and the light emitting element 806, respectively. The gate electrode of the driving TFT 804 and the power supply line 808 form the storage capacitor 805. It is not always necessary to form the storage capacitor 805.

The data line driver circuit 800 includes a shift register 810, a first latch 811 and a second latch 812. A clock signal (S-CLK) and a start pulse signal (S-SP) for the data line driver circuit are applied to the shift register 810. Latch signals and video signals for determining latch timing are applied to the first latch 811.

When the clock signal (S-CLK) and the start pulse signal (S-SP) are inputted into the shift register 810, a sampling signal which determines video signal sampling timing is generated and inputted into the first latch 811.

Alternatively, the sampling signal from the shift register 810 may be buffered and amplified by a buffer or the like and then inputted into the first latch 811. Since many circuits or circuit elements are connected to the wiring into which the sampling signal is inputted, the wiring has a high load capacitance (parasitic capacitance). This buffer is effective to prevent the "delay" of the rise or fall of the timing signal caused by the high load capacitance.

The first latch 811 includes a plurality of stages of latches. The first latch 811 samples the inputted video signal simultaneously with the sampling signal inputted thereinto and the sampled video signal is sequentially stored in the respective stages of latches.

A period required until the video signal is written to all the stages of latches in the first latch 811 is referred to as line period. Actually, however, this line period to which a horizontal retrace line period is added, is often referred to as line period.

When one line period is finished, a latch signal is inputted into the second latch 812. During this time, the video signals written and held in the first latch 811 are all outputted to the second latch 812, and written to and held in all stages of latches in the second latch 812.

The first latch 811 which is completed with outputting the video signals to the second latch 812 sequentially writes another video signal based on the sampling signal from the shift register 810.

In the second line period, the video signals written to and held in the second latch 812 are inputted into the source wiring.

Meanwhile, the scanning line driver circuit 801 includes a shift register 821 and a buffer 822. A clock signal (G-CLK) and a start pulse signal (G-SP) for the scanning line driver circuit are applied to the shift register 821.

When the clock signal (G-CLK) and the start pulse signal (G-SP) are inputted into the shift register 821, a select signal which determines gate wiring select timing is generated in the shift register 821 and inputted into the buffer 822. The select signal inputted into the buffer 822 is buffered and amplified and then inputted into the gate wiring 809.

When the gate wiring 809 is selected, the switching TFT 803 having a gate electrode connected to the selected gate wiring 809 is turned on. The video signals inputted into the source wiring are inputted into the gate electrode of the driving TFT 804 through the switching TFT 803 which is turned on.

The switching of the driving TFT 804 is controlled based on information of 1 or 0 held by the video signals inputted into the gate electrode thereof. When the driving TFT 804 is turned on, the potential of the power supply line 808 is applied to the pixel electrode of the light emitting element 806 thereby the light emitting element 806 emits light. When the driving TFT 804 is turned off, the potential of the power supply line 808 is not applied to the pixel electrode of the light emitting element 806 and the light emitting element 806 does not emit light.

In the circuits of the data line driver circuit 800 and those of the scanning line driver circuit 801 provided in the light emitting device shown in FIG. 21, the first and second electrodes of each TFTs are electrically connected to each other. By applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Furthermore, compared with a TFT which includes only one electrode, the TFT which includes two electrodes can suppress threshold irregularity. Accordingly, compared with a TFT which includes only one electrode, the TFT can increase ON current. It is thereby possible to decrease driving voltage. In addition, since ON current can be increased, the TFT can be made small in size (the channel width thereof can be particularly made small). It is thereby possible to improve the integration density of the TFT.

Furthermore, in the pixel section 802, a common voltage is applied to one of the first and second electrodes of the switching TFT 803 used as a switching element. By doing so, it is possible to suppress threshold irregularity and to suppress OFF current compared with the TFT which includes only one electrode.

On the driving TFT 804 for supplying a current to the light emitting element 806, the first electrode is electrically connected to the second electrode. As a result, it is possible to increase ON current compared with the TFT which includes only one electrode. The configuration of the driving TFT is not limited to this configuration. It is also possible that a common voltage is applied to one of the first and second electrodes without electrically connecting the first electrode to the second electrode. Alternatively, a thin film transistor of an ordinary configuration in which only one electrode is provided, may be included in the driving TFT.

This embodiment can be carried out in free combination with the first to seventh embodiments.

Embodiment 9

In this embodiment, an appearance view of the light emitting device is described by using the present invention.

Figure 22A:
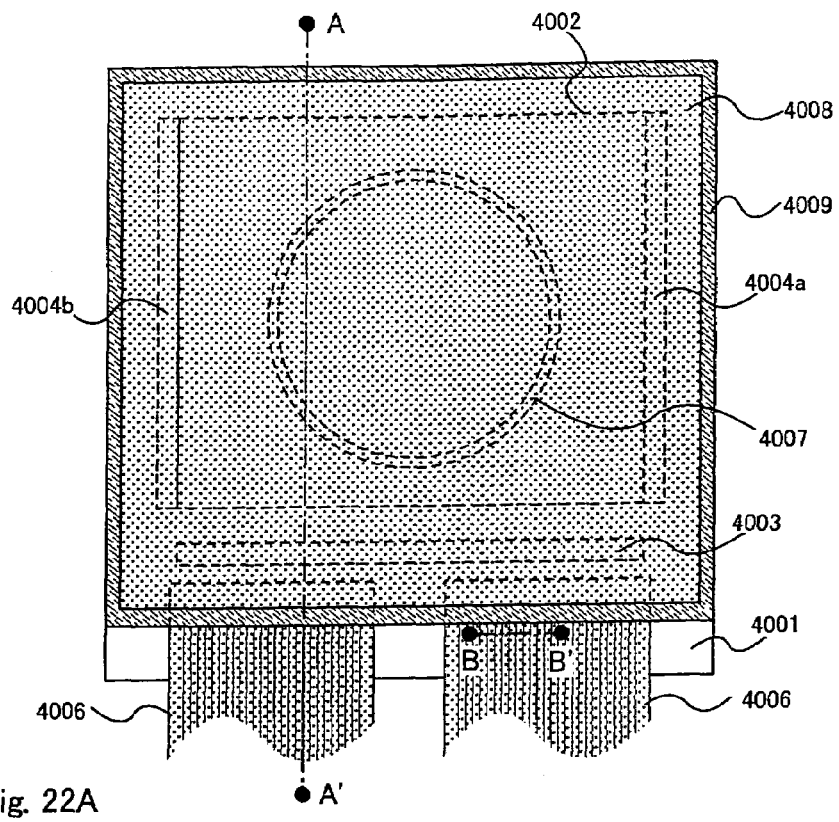
FIGS. 22A to 22C are views showing the external appearance and the section of the light emitting device.
Figure 22B:
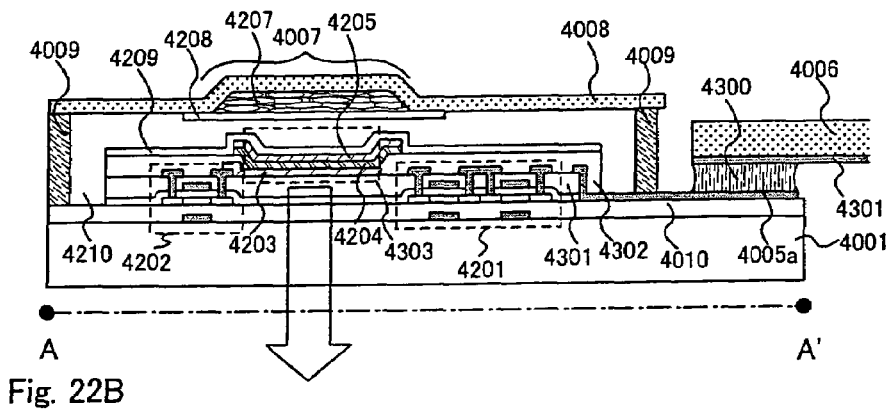
Figure 22C:
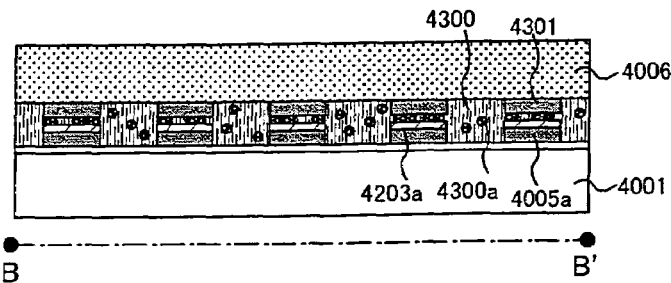

FIG. 22A is a top view of the light emitting device, FIG. 22B is a cross sectional view taken along with a line A-A' of FIG. 22A, and FIG. 22C is a cross sectional view taken along with a line B-B' of FIG. 22A.

A seal member 4009 is provided so as to surround a pixel portion 4002, a data line driver circuit 4003, and the first, second scanning line driver circuits 4004a, 4004b, which are provided on a substrate 4001. Further, a sealing material 4008 is provided on the pixel section 4002, the data line driver circuit 4003, and the first, the second scanning line driver circuits 4004a, 4004b. Thus, the pixel section 4002, the data line driver circuit 4003, and the first, the second scanning line driver circuits 4004a, 4004b are sealed by the substrate 4001, the seal member 4009 and the sealing material 4008 together with a filler 4210.

Further, the pixel section 4002, the data line driver circuit 4003, and the first, the second scanning line driver circuits 4004a, 4004b, which are provided on the substrate 4001, have a plurality of TFTs. In FIG. 22B, CMOS 4201 included in the data line driver circuit 4003 and a driving TFT (TFT controlling current which flows to the light emitting element) 4202 included in the pixel section 4002, which are formed on a base film 4010, are typically shown.

In this embodiment, the p-channel TFT or the n-channel TFT which includes a first electrode and a second electrode connected electrically each other of the present invention is used as CMOS 4201, the p-channel TFT which includes the first electrode and the second electrode connected electrically each other of the present invention is used as a driving TFT 4202. Further, the pixel section 4002 is provided with a storage capacitor (not shown) connected to a gate electrode of the driving TFT 4202.

The third insulating film 4301 is formed on the CMOS 4201 and the driving TFT 4202, and a pixel electrode (anode) 4203 electrically connected to a drain of the driving TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, the fourth insulating film 4302 is formed on the pixel electrode 4203, and the fourth insulating film 4302 is formed with an opening portion on the pixel electrode 4203. In this opening portion, an organic light emitting layer 4204 is formed on the pixel electrode 4203. A known organic light emitting material or inorganic light emitting material may be used for the organic light emitting layer 4204. Further, there exist a low molecular weight (monomer) material and a high molecular weight (polymer) material as the organic light emitting materials, and both the materials may be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the above-described film deposition is enabled by using a multi-chamber type (cluster tool type) film forming device. In addition, a predetermined voltage is given to the cathode 4205.

As described above, an light emitting element 4303 constituted of the pixel electrode (anode) 4203, the organic light emitting layer 4204 and the cathode 4205 is formed. Further, a protective film 4209 is formed on the insulating film 4302 so as to cover the light emitting element 4303. The protective film 4209 is effective in preventing oxygen, moisture and the like from permeating the light emitting element 4303.

Reference numeral 4005a denotes a wiring drawn to be connected to the power supply line, and the wiring 4005a is electrically connected to a source region of the driving TFT 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the light emitting element is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the light emitting element 4303 can be suppressed by providing the hygroscopic substance or the substance that can absorb oxygen 4207.

As shown in FIG. 22C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that this embodiment can be implemented by being freely combined with the first to eighth embodiments.

Embodiment 10

The semiconductor device of the present invention can be used to various electronic devices.

Such electronic devices include a video camera, a digital camera, a goggles-type display (head mount display), a car navigation system, a sound reproduction device (a car audio equipment, an audio equipment, or the like), a lap-top computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital versatile disc (DVD), and includes a display for displaying the reproduced image), or the like. FIGS. 23A to 23H respectively show various specific examples of such electronic devices.

Figure 23A:
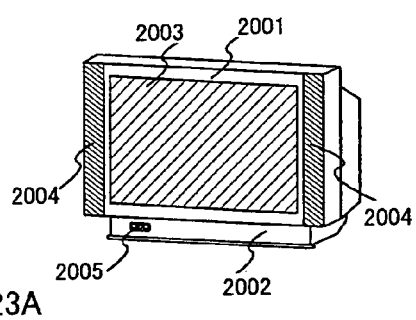
FIGS. 23A to 23H are views of an electronic apparatus using a semiconductor device of the present invention.

FIG. 23A illustrates a display device which includes a frame 2001, a support table 2002, a display portion 2003, a speaker portion 2004, a video input terminal 2005, or the like. The display device of the present invention is completed by using the present invention to the display portion 2003 and other circuits. The display device includes all information display devices such as devices for a personal computer, a TV broadcast reception, an advertising display, or the like.

Figure 23B:
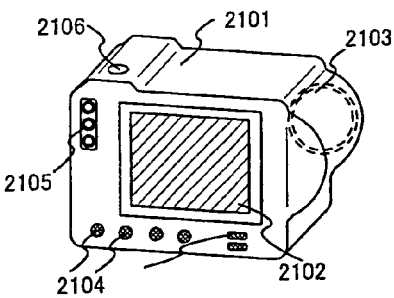

FIG. 23B illustrates a digital still camera which includes a main body 2101, a display portion 2102, an image receiving portion 2103, operation switches 2104, an external connecting portion 2105, a shutter 2106, or the like. The digital camera of the present invention can be obtained by utilizing the present invention to the display portion 2102 and other circuits.

Figure 23C:
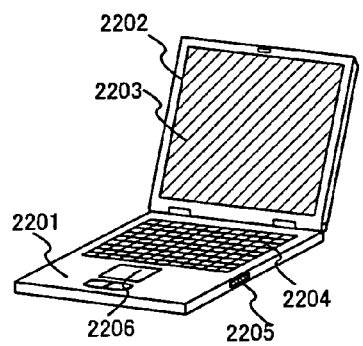

FIG. 23C illustrates a lap-top computer which includes a main body 2201, a casing 2202, a display portion 2203, a key board 2204, an external connecting port 2205, a pointing mouse 2206, or the like. The lap-top computer of the present invention can be obtained by utilizing the present invention to the display portion 2203 and other circuits.

Figure 23D:
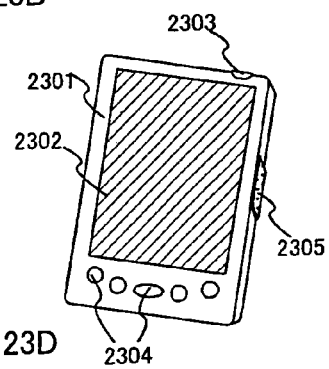

FIG. 23D illustrates a mobile computer which includes a main body 2301, a display portion 2302, switches 2303, an operation key 2304, an infrared port 2305, or the like. The mobile computer of the present invention can be obtained by utilizing the present invention to the display portion 2302 and other circuits.

Figure 23E:
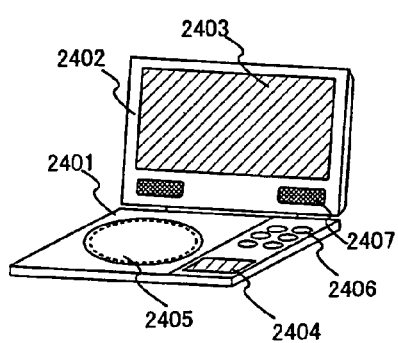

FIG. 23E illustrates a portable type image reproduction apparatus including a recording medium (more specifically, a DVD reproduction apparatus), which includes a main body 2401, a casing 2402, a display portion A 2403, a display portion B 2404, a reading portion of a recording medium (a DVD or the like) 2405, operation switches 2406, a speaker portion 2407, or the like. The display portion A 2403 is used mainly for displaying image information, while the display portion B 2404 is used mainly for displaying character information. The image reproduction apparatus can be obtained by utilizing the present invention to the display portion A 2403, the display portion B 2404 and other circuits. The image reproduction apparatus including a recording medium further includes a game machine or the like.

Figure 23F:
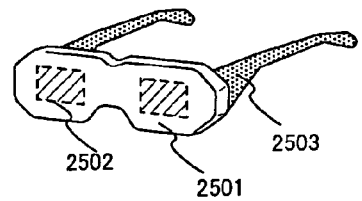

FIG. 23F illustrates a goggle type display (head mounted display) which includes a main body 2501, a display portion 2502 and an arm portion 2503. The goggle type display of the present invention can be obtained by utilizing the present invention to the display portion 2502 and other circuits.

Figure 23G:
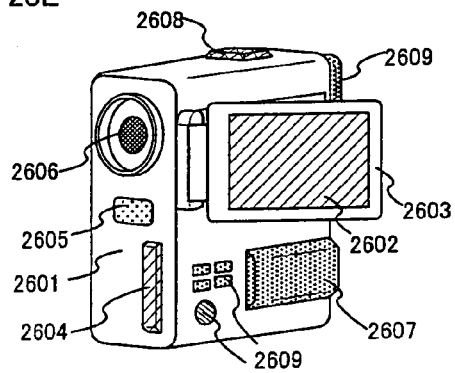

FIG. 23G illustrates a video camera which includes a main body 2601, a display portion 2602, a casing 2603, an external connecting port 2604, a remote control receiving portion 2605, an image receiving portion 2606, a battery 2607, an audio input portion 2608, an operation key 2609, or the like. The video camera of the present invention can be obtained by utilizing the present invention to the display portion 2602 and other circuits.

Figure 23H:
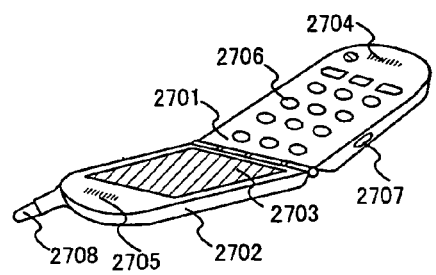

With now reference to FIG. 23H, a portable telephone is illustrated, which includes a main body 2701, a casing 2702, a display portion 2703, an audio input portion 2704, an audio output portion 2705, operation keys 2706, an external connecting port 2707, an antenna 2708, or the like. The portable telephone of the present invention can be obtained by utilizing the present invention to the display portion 2703 and other circuits.

In addition, when the brighter luminance of light emitted from the organic luminescent material becomes available in the future, the present invention will be applicable to a front-type or rear-type projector in which light including output image information is enlarged by means of lenses or the like to be projected.

As set forth above, the present invention can be applied variously to a wide range of electronic devices in all fields. The present invention can be implemented by freely combining with first to ninth embodiments.

Embodiment 11

In the eleventh embodiment, the characteristics of the TFT according to the present invention if the first electrode and the second electrode of the TFT are electrically connected to each other, will be described.

Figure 24A:
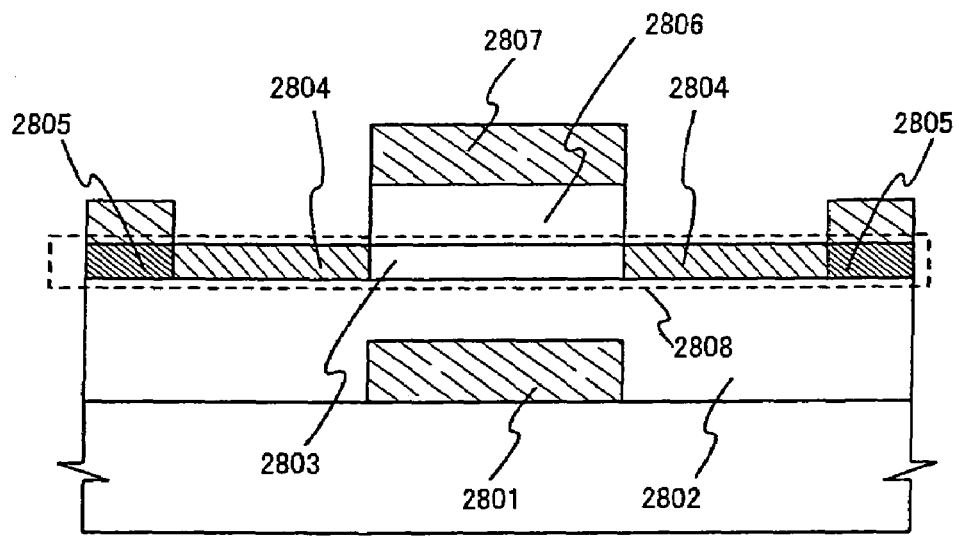
FIGS. 24A and 24B are views showing the structure of the TFT used in simulation.
Figure 24B:
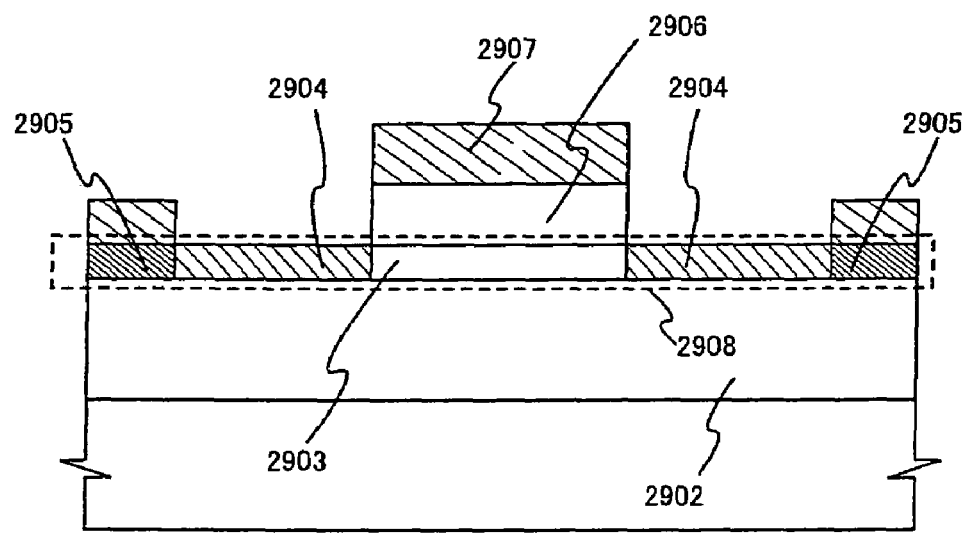
Figure 25:
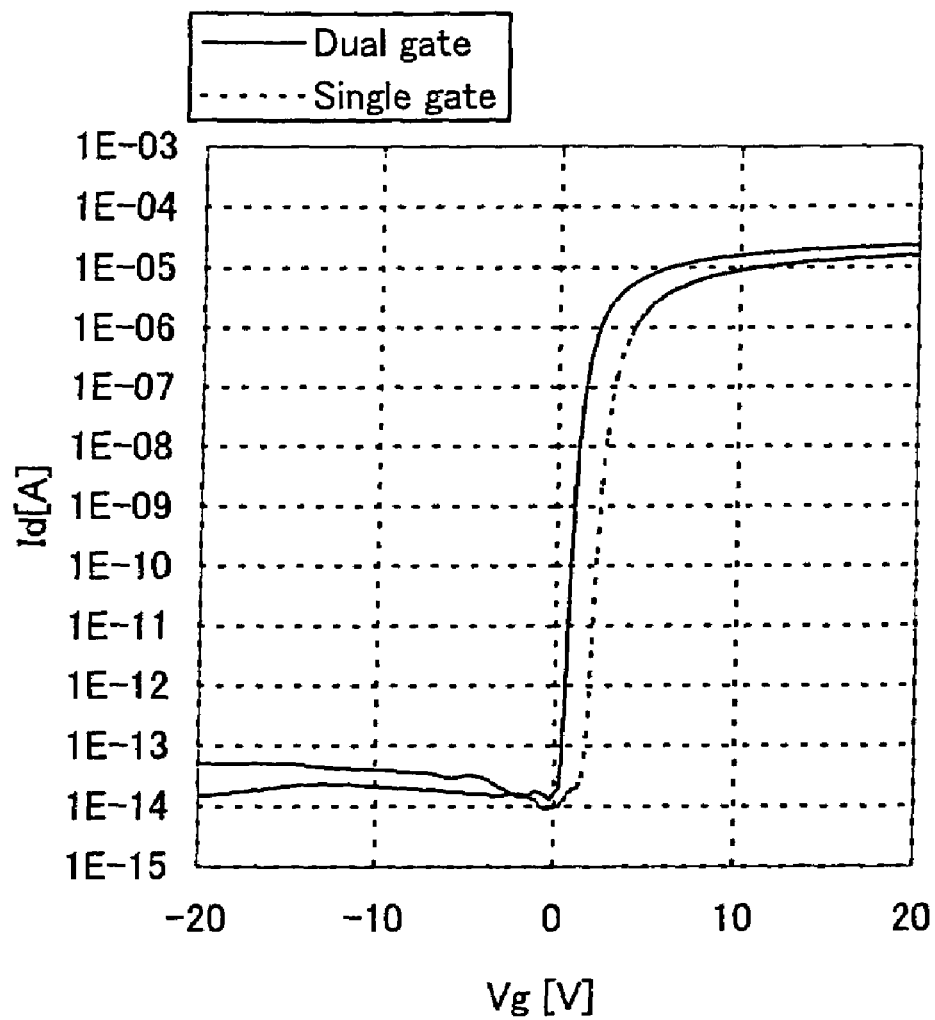
FIG. 25 is a view showing characteristics of the TFT obtained by the simulation.

FIG. 24A shows the cross section of the TFT according to the present invention wherein the first and second electrodes electrically connected to each other. FIG. 24B shows the cross section of a TFT which includes only one electrodes for comparison purposes. FIG. 25 shows the relationships between gate voltage and drain current obtained by simulations with respect to the TFT's shown in FIGS. 24A and 24B, respectively.

The TFT shown in FIG. 24A includes a first electrode 2801, a first insulating film 2802 which contacts with the first electrode 2801, a semiconductor film 2808 which contacts with the first insulating film 2802, a second insulating film 2806 which contacts with the semiconductor film 2808, and a second electrode 2807 which contacts with the second insulating film 2806. The semiconductor film 2808 includes a channel formation region 2803, a first impurity region 2804 which contacts with the channel formation region 2803, and a second impurity region 2805 which contacts with the first impurity region 2804.

The first electrode 2801 is overlapped with the second electrode 2807 with the channel formation region 2803 put therebetween. The same voltage is applied to the first electrode 2801 and the second electrode 2807.

The first insulating film 2802 and the second insulating film 2806 are made of silicon oxide. The first electrode 2801 and the second electrode 2807 are made of aluminum (Al). A channel length is 7 μm, a channel width is 4 μm, the thickness of the first insulating film 2802 in the section in which the first gate electrode is overlapped with the channel formation region 2803 is 110 μm, and the thickness of the second insulating film 2806 in the section in which the second gate electrode is overlapped with the channel formation region 2803 is 110 μm. In addition, the thickness of the channel formation region 2803 is 50 nm and the length of the first impurity region 2804 in a channel length direction is 1.5 μm.

The channel formation region 2803 is doped with p-type allocation impurities of $1 \times 10^{17}/cm^3$, the first impurity region 2804 is doped with n-type allocation impurities of $3 \times 10^{17}/cm^3$ and the second impurity region 2805 is doped with n-type allocation impurities of $5 \times 10^{19}/cm^3$.

The TFT shown in FIG. 24B includes a first insulating film 2902, a second insulating film 2906 which contacts with the first insulating film 2902, and a second electrode 2907 which contacts with the second insulating film 2906. A semiconductor film 2908 includes a channel formation region 2903, a first impurity region 2904 which contacts with the channel formation region 2903, and a second impurity region 2905 which contacts with the first impurity region 2904.

The second electrode 2907 is overlapped with the channel formation region 2903.

The first insulating film 2902 and the second insulating film 2906 are made of silicon oxide. The second electrode 2907 is made of aluminum (Al). A channel length is 7 μm, a channel width is 4 μm, the thickness of the second insulating film 2906 in the section in which the second gate electrode is overlapped with the channel formation region 2903 is 110 μm. In addition, the thickness of the channel formation region 2903 is 50 nm and the length of the first impurity region 2904 in a channel length direction is 1.5 μm.

The channel formation region 2903 is doped with p-type allocation impurities of $1 \times 10^{17}/cm^3$, the first impurity region 2904 is doped with n-type allocation impurities of $3 \times 10^{17}/cm^3$ and the second impurity region 2905 is doped with n-type allocation impurities of $5 \times 10^{19}/cm^3$.

In FIG. 25, the horizontal axis indicates gate voltage and the vertical axis indicates drain current. The value of drain current relative to gate voltage with respect to the TFT shown in FIG. 24A is denoted by a solid line and the value of drain current relative to gate voltage with respect to the TFT shown in FIG. 24B is denoted by a broken line.

From FIG. 25, the mobility of the TFT shown in FIG. 24A of 139 $cm^2/V \cdot s$ and the S value of 0.118 V/dec are obtained. In addition, the mobility of the TFT shown in FIG. 24B of 86.3 $cm^2/V \cdot s$ and the S value of 0.160 V/dec are obtained. Judging from these, if the first and second electrodes are provided in a TFT and the two electrodes are electrically connected to each other, the mobility of the TFT is higher and the S value thereof is lower than those of a TFT which includes only one electrode.

Embodiment 12

In the twelfth embodiment, one example of a thin film transistor included in the semiconductor device according to the present invention will be described with reference to FIG. 26.

Figure 26:
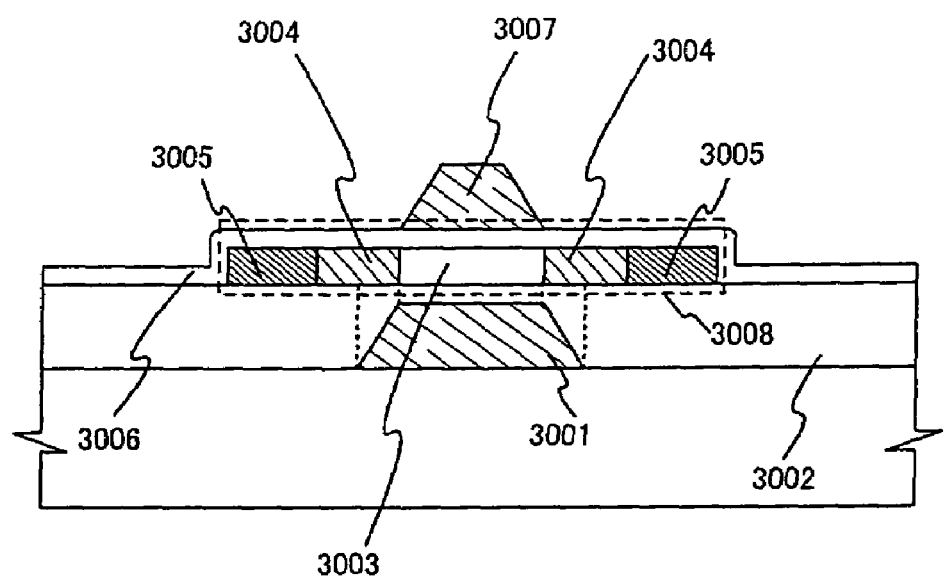
FIG. 26 is a sectional view of a thin film transistor of the present invention.

FIG. 26 is a cross-sectional view of a thin film transistor in this embodiment. The thin film transistor shown in FIG. 26 includes a first electrode 3001, a first insulating film 3002 which contacts with the first electrode 3001, a semiconductor film 3008 which contacts with the first insulating film 3002, a second insulating film 3006 which contacts with the semiconductor film 3008, and a second electrode 3007 which contacts with the second insulating film 3006. The semiconductor film 3008 includes a channel formation region 3003, a first impurity region 3004 which contacts with the channel formation region 3003, and a second impurity region 3005 which contacts with the first impurity region 3004.

One conductive type impurities doped into the first impurity region 3004 are lower in concentration than one conductive type impurities doped into the second impurity region 3005.

The first electrode 3001 is overlapped with the second electrode 3007 with the channel formation region 3003 put therebetween. In addition, the same voltage is applied to the first electrode 3001 and the second electrode 3007.

On the thin film transistor in this embodiment, the tapered sections of the first electrode 3001 are overlapped with the first impurity region 3004. The first electrode 3001 is almost flat in the section in which the first electrode 3001 is overlapped with the channel formation region 3003. According to the above-stated configuration, the first electrode 3001 and the channel formation region 3003 are overlapped with each other with almost a certain distance kept therebetween. In this state, if the thickness of the first insulating film in the section in which the first electrode 3001 is overlapped with the channel formation region 3003 is made almost equal to that of the second insulating film in the section in which the second electrode 3007 is overlapped with the channel formation region 3003, it is possible to further lower the S value.

This embodiment can be carried out in free combination with the first to eleventh embodiments.

Embodiment 13

Figure 27:
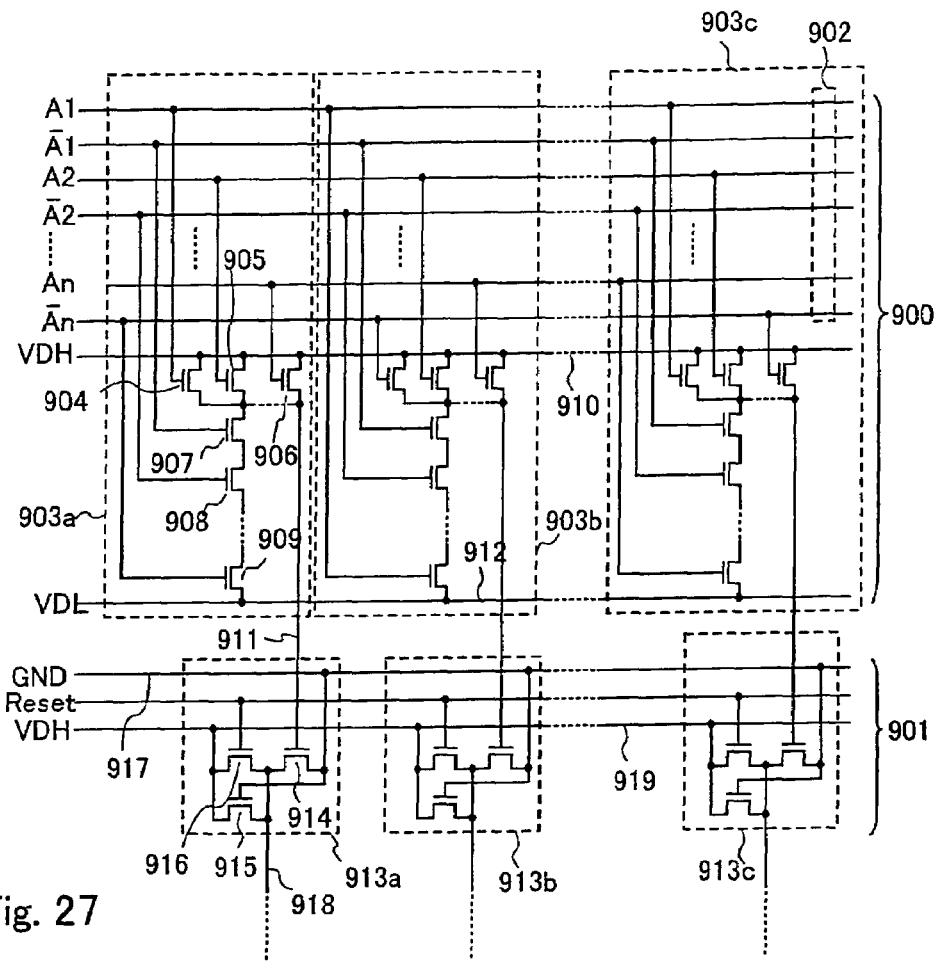
FIG. 27 is a diagram of a scanning line driving circuit of the light emitting device of the present invention.

A driver circuit for the light emitting device of the present invention will be described in this embodiment. This embodiment uses, instead of the general shift register, a decoder that is comprised of only p-channel TFTs as shown in FIG. 27. Note that, FIG. 27 shows an example of a scanning line driver circuit.

In FIG. 27, reference numeral 900 denotes a decoder of the scanning line driver circuit and 901 denotes a buffer unit of the scanning line driver circuit. Incidentally, the buffer unit refers to a part where a plurality of buffers (buffer amplifiers) are integrated.

First, the decoder 900 for the scanning line driver circuit will be described. Denoted by 902 are input signal lines (hereinafter referred to as selection lines) of the decoder 900. Of the lines 902, lines A1, A1 bar (for a signal obtained by inverting the polarity of A1), A2, A2 bar (for a signal obtained by inverting the polarity of A2), . . . An, An bar (for a signal obtained by inverting the polarity of An) are shown here. In short, 2n selection lines are arranged.

Figure 28:
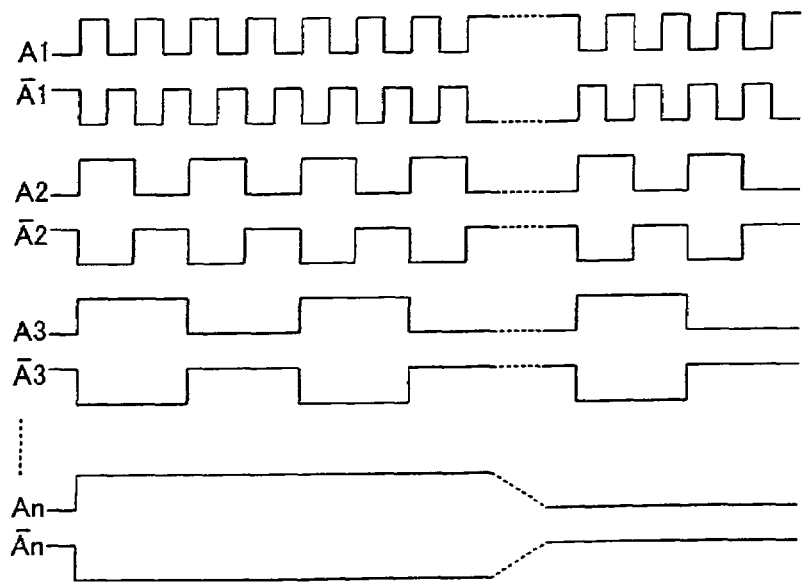
FIG. 28 is a timing chart of the scanning line driving circuit of the light emitting device of the present invention.

The number of selection lines is determined by the number of rows of gate wirings outputted from the scanning line driver circuit. For instance, if the display device has a pixel portion capable of VGA level display, the number of gate wiring is 480 and hence selection lines corresponding to 9 bits (n=9), namely, 18 selection lines in total are required. The selection lines 902 send signals shown in a timing chart of FIG. 28. As shown in FIG. 28, when the frequency of A1 is given as 1, the frequency of A2 is $2^{-1}$ times thereof, the frequency of A3 is $2^{-2}$ times thereof, and the frequency of An is $2^{-(n-1)}$ times thereof.

Reference symbol 903a denotes a first stage NAND circuit (also called a NAND cell), 903b denotes a second stage NAND circuit, and 903c denotes an n-th stage NAND circuit. The number of required NAND circuits corresponds to the number of gate wirings and n NAND circuits are needed here.

In short, the decoder 900 of the present invention is comprised of a plurality of NAND circuits.

Each of the NAND circuits 903a to 903c has a combination of p-channel TFTs 904 to 909. Actually, 2n TFTs are used in each of the NAND circuits 903. The p-channel TFTs 904 to 909 each have a gate that is connected to one of the selection lines 902 (A1, A1 bar, A2, A2 bar, . . . An, An bar).

In the NAND circuit 903a, the p-channel TFTs 904 to 906 each having a gate connected to one of the lines A1, A2, . . . An (these lines will be referred to as positive selection lines) are connected to one another in parallel, and connected to a positive power supply line ($V_{DH}$) 910 as the common source and to an output line 911 as the common drain. The p-channel TFTs 907 to 909 each having a gate connected to one of the lines A1 bar, A2 bar, . . . An bar (these lines will be referred to as negative selection lines) are connected to one another in series, and the p-channel TFT 909 positioned at an end of the circuit has its source connected to a negative power supply line ($V_{DL}$) 912 whereas the p-channel TFT 907 positioned at the other end of the circuit has its drain connected to the output line 911.

As described above, each NAND circuit of the present invention includes n one conductivity type TFTs (corresponding to the p-channel TFTs in this embodiment) that are connected in series and n one conductivity type TFTs (corresponding to the p-channel TFTs in this embodiment) that are connected in parallel. However, the combination of the p-channel TFTs and the selection lines is different from one circuit to the other circuit out of the n NAND circuits 903a to 903c. In other words, only one output line 911 is selected at a time and the selection lines 902 receive signals that select the output lines 911 one by one starting from an end.

The buffer unit 901 is composed of a plurality of buffers 913a to 913c in accordance with the NAND circuits 903a to 903c, respectively. The buffers 913a to 913c may all be structured in the same way.

Each of the buffers 913a to 913c is composed of p-channel TFTs 914 to 916 as one conductivity type TFTs. The output line 911 from the decoder 900 is inputted as a gate of the p-channel TFT 914 (a first one conductivity type TFT). The p-channel TFT 914 uses a ground power supply line (GND) 917 as its source and uses as its drain a gate wiring 918. The p-channel TFT 915 (a second one conductivity type TFT) uses the ground power supply line 917 as its gate, a positive power supply line ($V_{DH}$) 919 as its source, and the gate wiring 918 as its drain. The p-channel TFT 915 is always kept turned ON.

In other words, each of the buffers 913a to 913c of the present invention has the first one conductivity type TFT (the p-channel TFT 914) and the second one conductivity type TFT (the p-channel TFT 915) that is connected in series to the first one conductivity type TFT and uses as its gate the drain of the first one conductivity type TFT.

The p-channel TFT 916 (a third one conductivity type TFT) uses a reset signal line (Reset) as its gate, the positive power supply line 919 as its source, and the gate wiring 918 as its drain. Incidentally, the ground power supply line 917 may be the negative power line (a voltage that turns the p-channel TFT used as a switching element of a pixel ON state).

The channel width of the p-channel TFT 915 (W1) and the channel width of the p-channel TFT 914 (W2) satisfy the relation W1<W2. The channel width refers to the length of a channel formation region in the direction perpendicular to the channel length.

The buffer 913a operates as follows. First, during a positive voltage is applied to the output line 911, the p-channel TFT 914 is in an OFF state (a state in which a channel is not established). On the other hand, the p-channel TFT 915 is always in an ON state (a state in which a channel is established) and hence the voltage of the positive power supply line 919 is applied to the gate wiring 918.

When a negative voltage is applied to the output line 911, the p-channel TFT 914 is turned ON. At this point, the electric potential of the gate wiring 918 is influenced by the output on the p-channel TFT 914 side because the channel width of the p-channel TFT 914 is greater than the channel width of the p-channel TFT 915. As a result, the voltage of the ground power supply line 917 is applied to the gate wiring 918.

The gate wiring 918 thus outputs a negative voltage (a voltage that turns the p-channel TFT used as a switching element of a pixel ON) when a negative voltage is applied to the output line 911. On the other hand, when a positive voltage is applied to the output line 911, the gate wiring 918 always outputs a positive voltage (a voltage that turns the p-channel TFT used as a switching element of a pixel OFF).

The p-channel TFT 916 is used as a reset switch for forcedly increasing the negative voltage applied to the gate wiring 918 to the positive voltage. Specifically, the p-channel TFT 916 inputs a reset signal when the selection period for the gate wiring 918 is ended so that the positive voltage is applied to the gate wiring 918. However, the p-channel TFT 916 may be omitted.

The scanning line driver circuit operating as above selects the gate wirings one by one.

Figure 29:
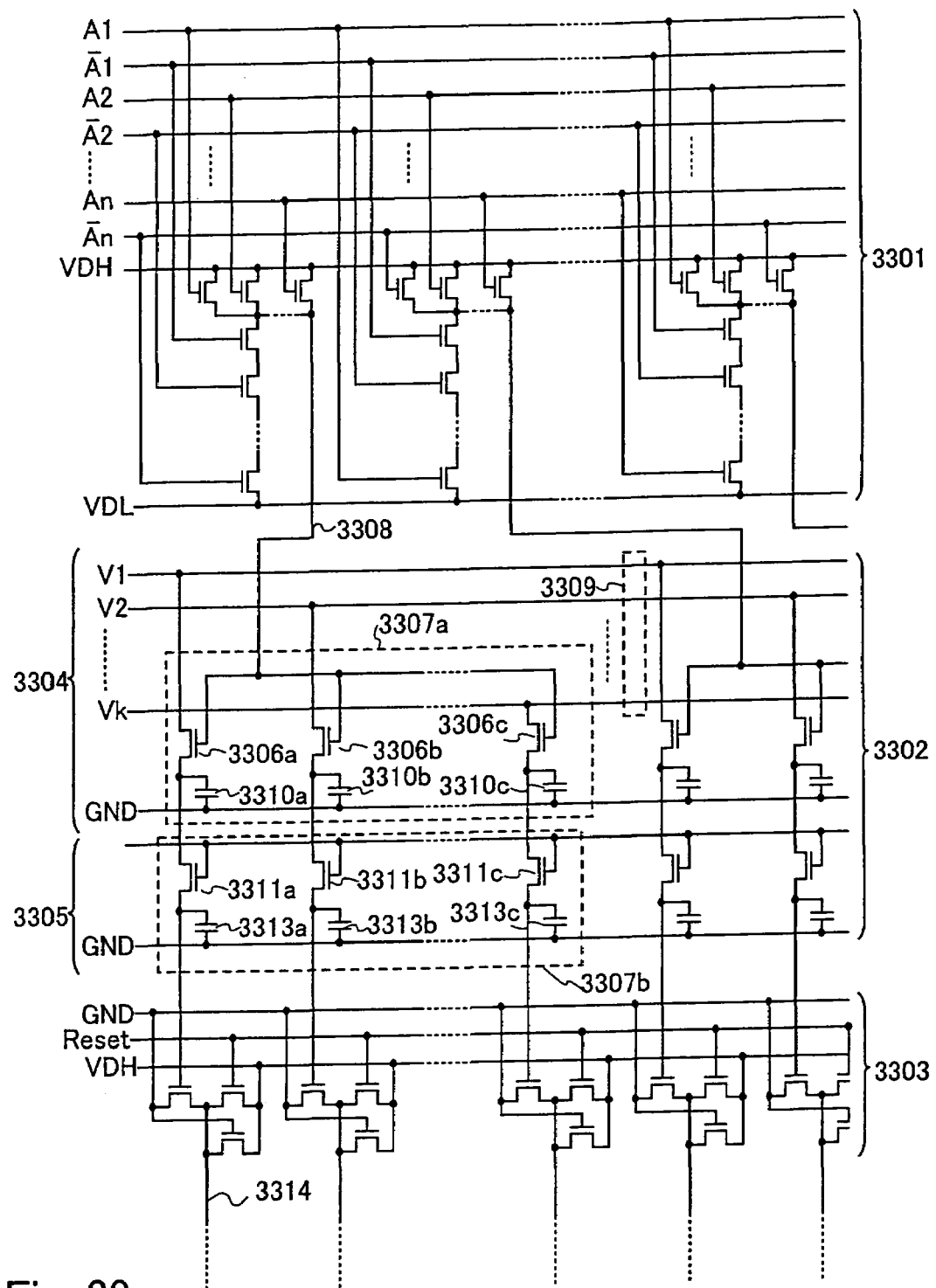
FIG. 29 is a diagram of a data line driving circuit of the light emitting device of the present invention.
Figure 30A:
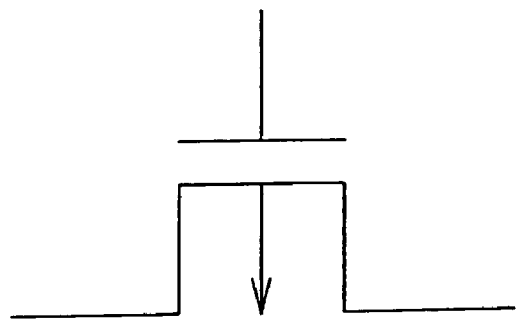
FIGS. 30A to 30C are diagrams showing a circuit of the general thin film transistor, and a circuit of the thin film transistor of the present invention.
Figure 30B:
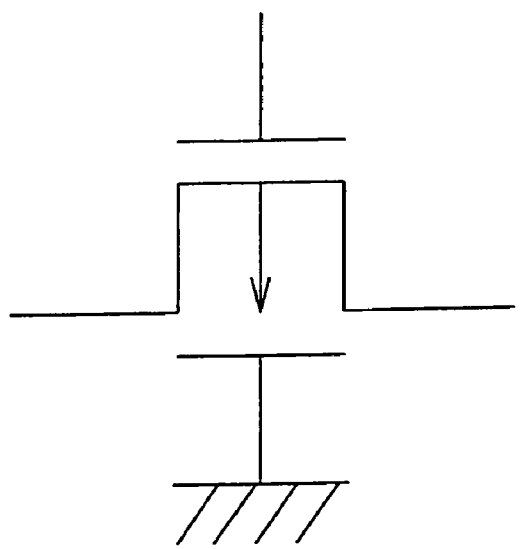
Figure 30C:
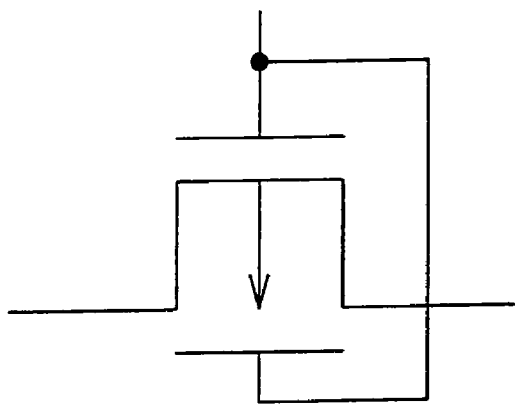

Next, the structure of the data line driver circuit is shown in FIG. 29. The data line driver circuit shown in FIG. 29 includes a decoder 3301, a latch 3302 and a buffer unit 3303. The structure of the decoder 3301 and the buffer unit 3303 are the same as the decoder and the buffer unit of the scanning line driver circuit, and explanations thereof are omitted here.

In the case of the data line driver circuit of FIG. 29, the latch 3302 is composed of a first stage latch 3304 and a second stage latch 3305. The first stage latch 3304 and the second stage latch 3305 each have a plurality of basic units 3307a each of which is composed of m p-channel TFTs 3306a to 3306c. An output line 3308 from the decoder 3301 is inputted to gates of the m p-channel TFTs 3306a to 3306c that constitute each of the basic units 3307a. The symbol m represents an arbitrary integer.

If the display device is capable of VGA level display, for instance, there are 640 source wirings. When m=1, the number of required NAND circuits is also 640 and 20 selection lines (corresponding to 10 bits) are needed. When m=8, required NAND circuits are 80 and 14 selection lines (corresponding to 7 bits) are needed. In short, the number of required NAND circuits is M/m given the number of source wirings is M.

Sources of the n-channel TFTs 3306a to 3306c are respectively connected to video signal lines (V1, V2, . . . Vk) 3309. Therefore, when a negative voltage is applied to the output line 3308, the p-channel TFTs 3306a to 3306c are turned ON at once and video signals associated with the respective TFTs are inputted. The video signals thus inputted are held in capacitors 3310a to 3310c that are connected to the p-channel TFTs 3306a to 3306c, respectively.

The second stage latch 3305 has a plurality of basic units 3307b. Each of the basic units 3307b is composed of m p-channel TFTs 3311a to 3311c. Gates of the p-channel TFTs 3311a to 3311c are all connected to a latch signal line 3312, so that the p-channel TFTs 3311a to 3311c are turned ON at once when a negative voltage is applied to the latch signal line 3312.

As a result, signals that have been held in the capacitors 3310a to 3310c are now held by capacitors 3313a to 3313c that are connected to the p-channel TFTs 3311a to 3311c, respectively. At the same time, the signals that have been held in the capacitors 3310a to 3310c are outputted to the buffer unit 3303. Then the signals are outputted through the buffers to a source wiring 3314 as illustrated in FIG. 27. The data line driver circuit operating as above selects the source wirings one by one.

As described above, by composing the scanning line driver circuit and the data line driver circuit only of the p-channel TFTs, all of the pixel sections and the driver circuits can be entirely formed of the p-channel TFTs. Accordingly, upon fabrication of an active matrix type light emitting device, a fabrication yield and a throughput of the TFT steps can be significantly improved, thereby resulting in a reduced fabrication cost.

Note that, the present invention can also be applied to a light emitting device in which one of the data line driver circuit and the scanning line driver circuit is provided as an IC chip externally mounted.

This embodiment can be carried out in free combination with the first to twelfth embodiments.

Embodiment 14

The really measured value of a drain electric current Id with respect to the voltage difference (gate voltage Vgs) between a second electrode and a source area in the TFT having two electrodes of the present invention will be explained in this embodiment. The really measured value is calculated when a first electrode is connected to the ground, and is also calculated when the first and second electrodes are electrically connected to each other. Further, for comparison, the really measured value of the drain electric current Id with respect to the gate voltage of the TFT having no first electrode is also calculated.

FIG. 34 shows the concrete construction of the TFT used in this embodiment. FIG. 34A shows a top view of the TFT having two electrodes of the present invention. FIG. 34B shows a sectional view in A-A' of FIG. 34A. FIG. 34C shows a top view of the TFT having only the second electrode for comparison. FIG. 34D shows a sectional view in B-B' of FIG. 34C.

In the TFT shown in FIGS. 34A and 34B, a foundation film 901 using an SiNO film is formed on a glass substrate 900 such that this foundation film 901 has 50 nm in thickness. W of 100 nm in thickness is formed as a first electrode 902 on the foundation film 901. A first insulating film 903 functioning as a gate insulating film is formed on the foundation film 901 so as to cover the first electrode 902. The first insulating film 903 is formed by an SiNO film of 110 nm in thickness.

A semiconductor film 904 having 54 nm in thickness is formed on the first insulating film 903. Next, a second insulating film 905 of 115 nm in thickness using the SiNO film is formed. Then, a second electrode 906 constructed by two layers of electrically conductive films 906a, 906b is formed on the second insulating film 905. In this embodiment, the second electrode 906 is formed by laminating TaN of 50 nm in thickness and W of 370 nm in thickness. Further, impurities are added to the semiconductor film 904. The semiconductor film 904 has a channel forming area 907 and an impurity area 908 nipping this channel forming area.

The TFT shown in FIGS. 34C and 34D differs from the TFT shown in FIGS. 34A and 34B only in that no TFT shown in FIGS. 34C and 34D has the first electrode 902.

Figure 31:
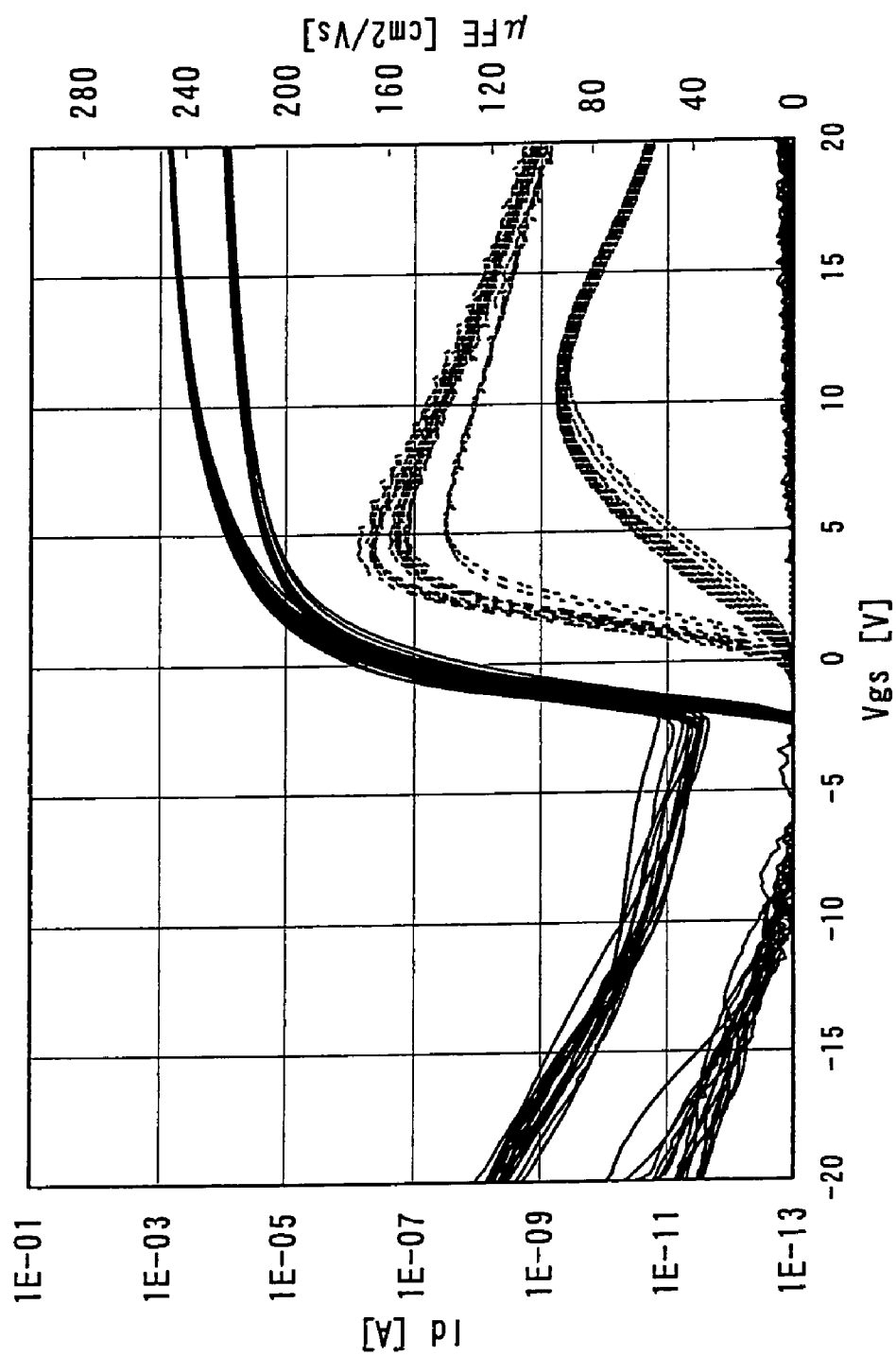
FIG. 31 is a graph showing the really measured values of Id-Vgs characteristics of the general TFT.
Figure 32:
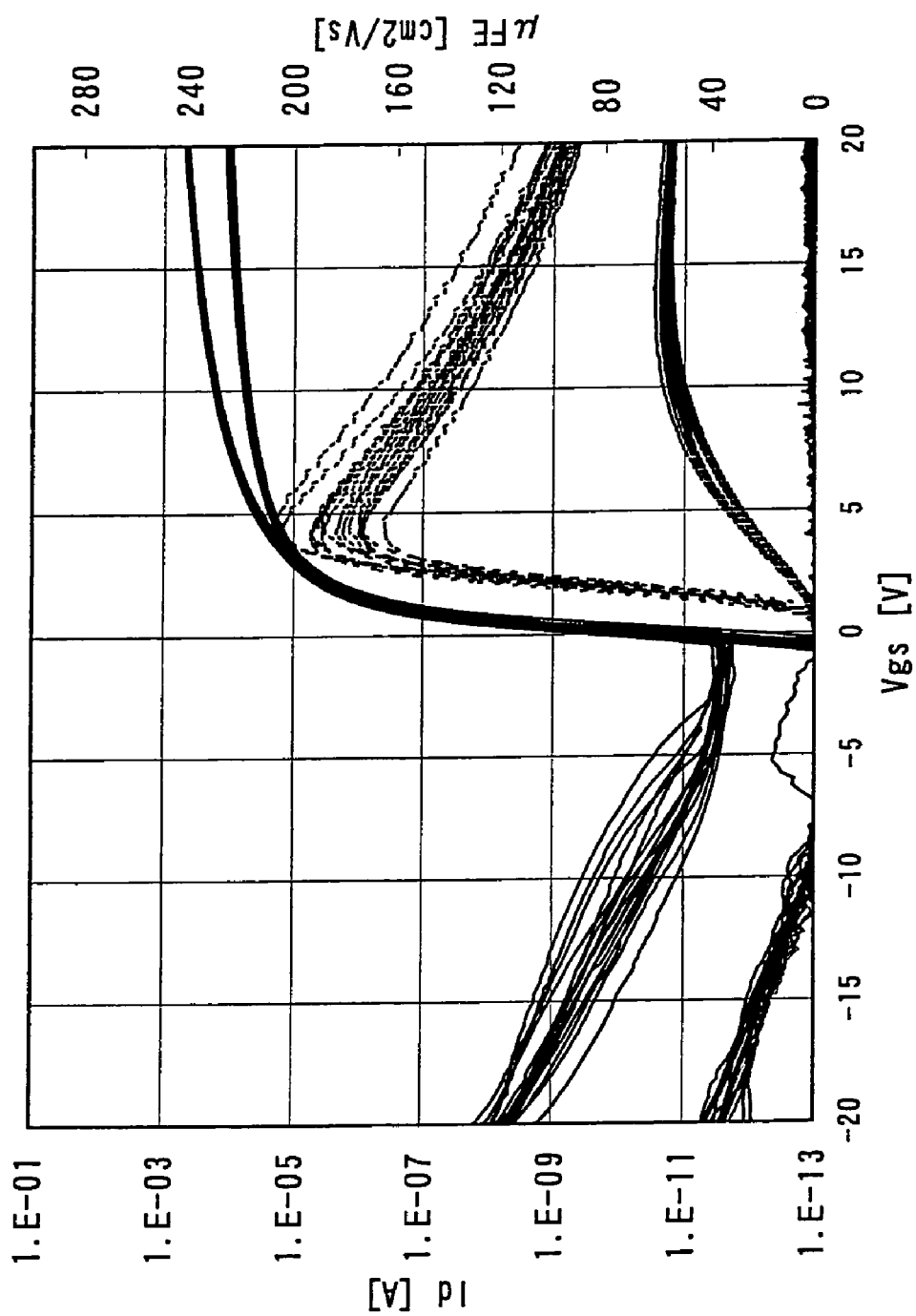
FIG. 32 is a graph showing the really measured values of the Id-Vgs characteristics of the TFT of the present invention.
Figure 33:
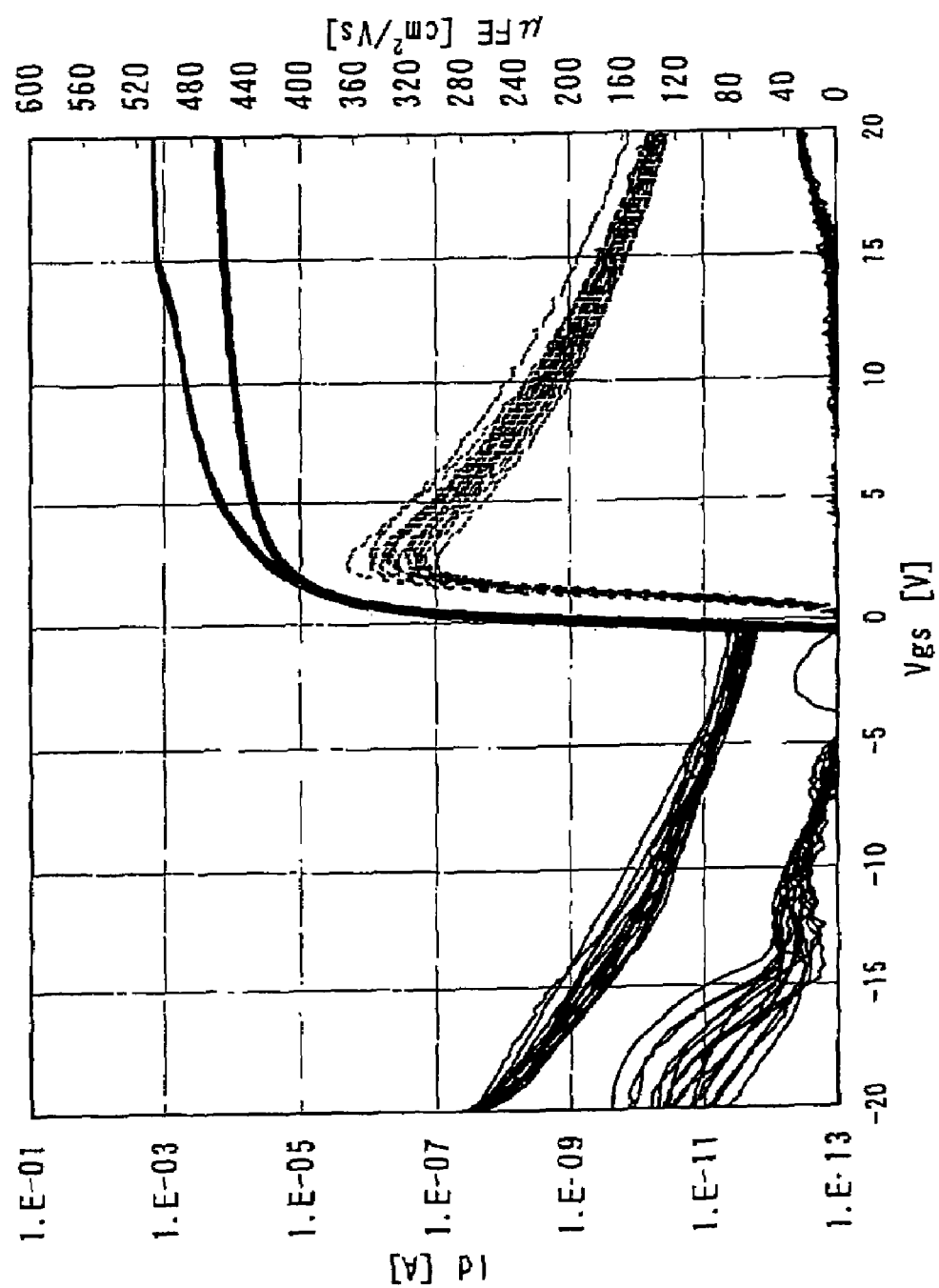
FIG. 33 is a graph showing the really measured values of the Id-Vgs characteristics of the TFT of the present invention.

FIG. 31 shows the really measured value of the drain electric current Id with respect to the voltage difference (gate voltage Vgs) between the second electrode and the source area in the TFT shown in FIGS. 34C and 34D. FIG. 32 shows the really measured value of the drain electric current Id with respect to the voltage difference (gate voltage Vgs) between the second electrode and the source area when the first electrode 902 is connected to the ground in the TFT shown in FIGS. 34A and 34B. FIG. 33 shows the really measured value of the drain electric current Id with respect to the voltage difference (gate voltage Vgs) between the second electrode and the source area when the first electrode 902 and the second electrode 906 are electrically connected to each other in the TFT shown in FIGS. 34A and 34B. In each graph, a solid line shows the drain electric current Id and a broken line shows mobility.

It is known from comparison of FIGS. 31, 32 and 33 that the threshold value is close to zero and the S-value is improved when the first electrode is arranged in comparison with a case in which no first electrode is arranged. Further, it is also known from comparison of FIGS. 32 and 33 that the on-electric current is raised when the first and second electrodes are electrically connected to each other in comparison with a case in which the first electrode is connected to the ground.

In the present invention, the dispersion of the threshold value and the off-electric current can be restrained by applying the common voltage to the first electrode in comparison with the case of one electrode.

Further, since the depletion layer is rapidly spread by applying the same voltage to the first and second electrodes as in a case in which the thickness of the semiconductor film is substantially thinned, the sub-threshold coefficient can be reduced and electric field effect mobility can be further improved. Further, the dispersion of the threshold value can be restrained in comparison with the case of one electrode. Accordingly, the on-electric current can be increased in comparison with the case of one electrode. Therefore, the driving voltage can be reduced by using the TFT of this structure in a driving circuit. Further, since the on-electric current can be increased, the size (particularly channel width) of the TFT can be reduced. Therefore, integration density can be improved.

What is claimed is:

1. A light emitting device comprising:
   a first wiring;
   a second wiring;
   a third wiring;
   a fourth wiring;
   a first thin film transistor comprising at least two impurity regions; and
   a second thin film transistor comprising at least two impurity regions,
   wherein said first thin film transistor comprises a first electrode, a first insulating film over said first electrode, a semiconductor film over said first insulating film, a second insulating film over said semiconductor film, and a second electrode over said second insulating film,
   wherein said first insulating film is formed so as to cover said first wiring, said third wiring is formed over said second insulating film, a third insulating film is formed so as to cover said third wiring, and said second wiring is formed over said third insulating film,
   wherein said first wiring is connected to said first electrode of said first thin film transistor, and said second wiring is connected to said second electrode of said first thin film transistor,
   wherein one of two impurity regions of said first thin film transistor is connected to said third wiring, and the other is connected to a gate electrode of said second thin film transistor, and
   wherein one of two impurity regions of said second thin film transistor is connected to said fourth wiring, and the other is connected to a pixel electrode.

2. A light emitting device according to claim 1, said device further comprising:
   a fifth wiring formed over said third insulating film;
   a sixth wiring formed over said third insulating film;
   a first contact hole formed in said second and third insulating films;
   a second contact hole formed in said third insulating film; and
   a third contact hole formed in said third insulating film,
   wherein one of said two impurity regions of said first thin film transistor is connected to said fifth wiring, and the other is connected to said sixth wiring through said first contact hole,
   wherein said fifth wiring is connected to said third wiring through said second contact hole, and
   wherein said sixth wiring is connected to said gate electrode of said second thin film transistor through said third contact hole.

3. A light emitting device according to claim 1, wherein said semiconductor film comprises a channel forming region between said two impurity regions, and said first and second electrodes are overlapped with each other through said channel forming region.

4. A light emitting device according to claim 1, wherein dielectric constants of said first and second insulating films are approximately the same, and a film thickness in a portion overlapped with said first electrode of said first insulating film and a film thickness in a portion overlapped with said second electrode of said second insulating film are approximately the same.

5. A light emitting device according to claim 1, wherein said first insulating film has a flat surface.

6. An electronic device comprising said light emitting device according to claim 1, wherein said electronic device is selected from the group consisting of a display device, a digital still camera, a lap-top computer, a mobile computer, a portable type image reproduction apparatus, a goggle type display, a video camera, and a portable telephone.

7. A light emitting device comprising:
   a first wiring;
   a second wiring;
   a third wiring;
   a fourth wiring;
   a first thin film transistor comprising at least two impurity regions; and
   a second thin film transistor comprising at least two impurity regions,
   wherein said first thin film transistor comprises a first electrode, a first insulating film over said first electrode, a semiconductor film over said first insulating film, a second insulating film over said semiconductor film, and a second electrode over said second insulating film,
   wherein said first insulating film is formed so as to cover said first wiring, said third and fourth wirings are formed over said second insulating film, a third insulating film is formed so as to cover said third and fourth wirings, and said second wiring is formed over said third insulating film, wherein said first wiring is connected to said first electrode of said first thin film transistor, and said second wiring is connected to said second electrode of said first thin film transistor, wherein one of two impurity regions of said first thin film transistor is connected to said third wiring, and the other is connected to a gate electrode of said second thin film transistor, and wherein one of two impurity regions of said second thin film transistor is connected to said fourth wiring, and the other is connected to a pixel electrode.

8. A light emitting device according to claim 7, said device further comprising:

a fifth wiring formed over said third insulating film;
a sixth wiring formed over said third insulating film;
a first contact hole formed in said second and third insulating films;
a second contact hole formed in said third insulating film; and
a third contact hole formed in said third insulating film,
wherein one of said two impurity regions of said first thin film transistor is connected to said fifth wiring, and the other is connected to said sixth wiring through said first contact hole,
wherein said fifth wiring is connected to said third wiring through said second contact hole, and
wherein said sixth wiring is connected to said gate electrode of said second thin film transistor through said third contact hole.

9. A light emitting device according to claim 7, wherein said semiconductor film comprises a channel forming region between said two impurity regions, and said first and second electrodes are overlapped with each other through said channel forming region.

10. A light emitting device according to claim 7, wherein dielectric constants of said first and second insulating films are approximately the same, and a film thickness in a portion overlapped with said first electrode of said first insulating film and a film thickness in a portion overlapped with said second electrode of said second insulating film are approximately the same.

11. A light emitting device according to claim 7, wherein said first insulating film has a flat surface.

12. An electronic device comprising said light emitting device according to claim 7, wherein said electronic device is selected from the group consisting of a display device, a digital still camera, a lap-top computer, a mobile computer, a portable type image reproduction apparatus, a goggle type display, a video camera, and a portable telephone.

13. A light emitting device comprising:
a first wiring;
a second wiring;
a third wiring;
a fourth wiring;
a first thin film transistor comprising at least two impurity regions; and
a second thin film transistor comprising at least two impurity regions,
wherein said first thin film transistor comprises a first electrode, a first insulating film over said first electrode, a semiconductor film over said first insulating film, a second insulating film over said semiconductor film, and a second electrode over said second insulating film,
wherein said first insulating film is formed so as to cover said first wiring, said third wiring is formed over said second insulating film, a third insulating film is formed so as to cover said third wiring, and said second and fourth wirings are formed over said third insulating film, wherein said first wiring is connected to said first electrode of said first thin film transistor, and said second wiring is connected to said second electrode of said first thin film transistor, wherein one of two impurity regions of said first thin film transistor is connected to said third wiring, and the other is connected to a gate electrode of said second thin film transistor, and wherein one of two impurity regions of said second thin film transistor is connected to said fourth wiring, and the other is connected to a pixel electrode.

14. A light emitting device according to claim 13, wherein said adjacent second wirings are connected to a fifth wiring formed over said second insulating film through a contact hole formed in said third insulating film.

15. A light emitting device according to claim 13, said device further comprising:

a sixth wiring formed over said third insulating film;
a seventh wiring formed over said third insulating film;
a first contact hole formed in said second and third insulating films;
a second contact hole formed in said third insulating film; and
a third contact hole formed in said third insulating film,
wherein one of said two impurity regions of said first thin film transistor is connected to said sixth wiring, and the other is connected to said seventh wiring through said first contact hole,
wherein said sixth wiring is connected to said third wiring through said second contact hole, and
wherein said seventh wiring is connected to said gate electrode of said second thin film transistor through said third contact hole.

16. A light emitting device according to claim 13, wherein said semiconductor film comprises a channel forming region between said two impurity regions, and said first and second electrodes are overlapped with each other through said channel forming region.

17. A light emitting device according to claim 13, wherein dielectric constants of said first and second insulating films are approximately the same, and a film thickness in a portion overlapped with said first electrode of said first insulating film and a film thickness in a portion overlapped with said second electrode of said second insulating film are approximately the same.

18. A light emitting device according to claim 13, wherein said first insulating film has a flat surface.

19. An electronic device comprising said light emitting device according to claim 13, wherein said electronic device is selected from the group consisting of a display device, a digital still camera, a lap-top computer, a mobile computer, a portable type image reproduction apparatus, a goggle type display, a video camera, and a portable telephone.

20. A light emitting device comprising:
a first wiring;
a second wiring;
a third wiring;
a fourth wiring;
a first thin film transistor comprising at least two impurity regions; and
a second thin film transistor comprising at least two impurity regions,
wherein said first thin film transistor comprises a first electrode, a first insulating film over said first electrode, a semiconductor film over said first insulating film, a second insulating film over said semiconductor film, and a second electrode over said second insulating film, wherein said first insulating film is formed so as to cover said first and fourth wirings, said third wiring is formed over said second insulating film, a third insulating film is formed so as to cover said third wiring, and said second wiring is formed over said third insulating film, wherein said first wiring is connected to said first electrode of said first thin film transistor, and said second wiring is connected to said second electrode of said first thin film transistor, wherein one of two impurity regions of said first thin film transistor is connected to said third wiring, and the other is connected to a gate electrode of said second thin film transistor, and wherein one of two impurity regions of said second thin film transistor is connected to said fourth wiring, and the other is connected to a pixel electrode.

21. A light emitting device according to claim 20, wherein said adjacent fourth wirings are connected to a fifth wiring formed on said second insulating film through a contact hole formed in said first and second insulating films.

22. A light emitting device according to claim 20, said device further comprising:
- a sixth wiring formed over said third insulating film;
- a seventh wiring formed over said third insulating film;
- a first contact hole formed in said second and third insulating films;
- a second contact hole formed in said third insulating film; and
- a third contact hole formed in said third insulating film, wherein one of said two impurity regions of said first thin film transistor is connected to said sixth wiring, and the other is connected to said seventh wiring through said first contact hole, wherein said sixth wiring is connected to said third wiring through said second contact hole, and wherein said seventh wiring is connected to said gate electrode of said second thin film transistor through said third contact hole.

23. A light emitting device according to claim 20, wherein said semiconductor film comprises a channel forming region between said two impurity regions, and said first and second electrodes are overlapped with each other through said channel forming region.

24. A light emitting device according to claim 20, wherein dielectric constants of said first and second insulating films are approximately the same, and a film thickness in a portion overlapped with said first electrode of said first insulating film and a film thickness in a portion overlapped with said second electrode of said second insulating film are approximately the same.

25. A light emitting device according to claim 20, wherein said first insulating film has a flat surface.

26. An electronic device comprising said light emitting device according to claim 20, wherein said electronic device is selected from the group consisting of a display device, a digital still camera, a lap-top computer, a mobile computer, a portable type image reproduction apparatus, a goggle type display, a video camera, and a portable telephone.

* * * * *